United States Patent
Knoblock et al.

(10) Patent No.: US 6,169,987 B1
(45) Date of Patent: Jan. 2, 2001

(54) SYSTEM AND METHOD TO AUTOMATE EQUIPMENT PLACEMENT AT REMOTE SITES

(75) Inventors: Terry Knoblock, Wylie; Gregory G. Carlson, Plano; Paul Michael Golobay, Farmers Branch, all of TX (US)

(73) Assignee: MCI Communications Corporation, Washington, DC (US)

( * ) Notice: Under 35 U.S.C. 154(b), the term of this patent shall be extended for 0 days.

(21) Appl. No.: 08/823,561

(22) Filed: Mar. 25, 1997

(51) Int. Cl.[7] .................................................. G06F 17/30
(52) U.S. Cl. ......................... 707/10; 707/104; 709/201; 709/217; 709/220; 709/223
(58) Field of Search .................... 707/100, 102, 707/103, 10, 104, 223; 364/188, 282.1, 578, 478.01, 478.02, 488; 340/870.02; 395/200.49, 200.5; 52/125.6, 122.1, 79.1; 235/385; 345/339, 356, 961; 414/266, 267; 455/4.1; 709/223, 210, 217, 220

(56) References Cited

U.S. PATENT DOCUMENTS

| | | | |
|---|---|---|---|
| 5,006,996 | * 4/1991 | Nakamura et al. | 364/478 |
| 5,113,349 | * 5/1992 | Nakamura et al. | 364/478 |
| 5,142,128 | * 8/1992 | Perkin et al. | 235/375 |
| 5,360,967 | * 11/1994 | Perkin et al. | 235/375 |
| 5,444,836 | * 8/1995 | Hollingsworth et al. | 395/35 |
| 5,452,347 | * 9/1995 | Iglehart et al. | 379/199 |
| 5,459,831 | 10/1995 | Brewer et al. . | |
| 5,604,892 | * 2/1997 | Nuttall et al. | 395/500 |
| 5,630,025 | * 5/1997 | Perkin et al. | 395/51 |
| 5,634,016 | * 5/1997 | Steadham et al. | 395/329 |
| 5,706,455 | * 1/1998 | Benton et al. | 395/348 |
| 5,930,779 | * 7/1999 | Knoblock et al. | 705/412 |
| 5,991,759 | * 11/1999 | Knoblock et al. | 707/10 |
| 6,023,699 | * 2/2000 | Knoblock et al. | 707/10 |

OTHER PUBLICATIONS

Don Burgio, MCI Telecommunications Corporation, MCI SIteVu, Copyright 1996, made available to the public Apr. '96.

* cited by examiner

Primary Examiner—Hosain T. Alam
Assistant Examiner—Jean M. Corrielus

(57) ABSTRACT

A system and method for placing articles of manufacture or pieces of equipment at a remote site uses a central database and graphical representations. A site hierarchy, comprising a site, a building at the site, and a floor within the building, is created in the central database. The user can then create graphical objects on a floor at a building, which are also represented in the central database as sequences of points. Specifically, graphical objects are created for a floor within a structure, a zone within the floor, a planning unit within the zone, a row segment within the planning unit, and a footprint (where the article or piece of equipment is placed) within the row segment. The central database can also store tabular (non-graphical) data, regarding the physical characteristics of physical objects (such as the actual area of a row), as well as particular information for each footprint (such as an installation date, an activation date, etc.). Once the graphical objects are established in the hierarchy, a user can modify or view both the graphical data or the non-graphical data from the database.

34 Claims, 31 Drawing Sheets

| | | | |
|---|---|---|---|
| FIG. 10C | FIG. 10F | FIG. 10I | FIG. 10L |
| FIG. 10D | FIG. 10G | FIG. 10J | FIG. 10M |
| FIG. 10E | FIG. 10H | FIG. 10K | FIG. 10N |

FIG. 10B

Power Tables

Version Tables

SYSTEM AND METHOD TO AUTOMATE EQUIPMENT PLACEMENT AT REMOTE SITES

CROSS-REFERENCE TO OTHER APPLICATIONS

The following applications of common assignee contain some common disclosure and have the same filing date as the present application:

U.S. Patent Application entitled "System and Method for Recording, Maintaining and Viewing Configuration and Placement of Equipment Sites", filed concurrently herewith, Ser. No. 08/823,557, now U.S. Pat. No. 6,098,050.

U.S. Patent Application entitled "Method for Organizing a Relational Database Used for Storing Data Related to the Configuration and Placement of Equipment in Field Sites", filed concurrently herewith, Ser. No. 08/823,558, now U.S. Pat. No. 6,023,699.

U.S. Patent Application entitled "System and Method for Defining Equipment at Down to the Rackface Level", filed concurrently herewith, Ser. No. 08/823,556, now U.S. Pat. No. 5,991,759.

U.S. Patent Application entitled "Web Based System and Method to Automate Storage of Power Supply Data and Calculation of Battery Reserves", filed concurrently herewith, Ser. No. 08/823,555, now U.S. Pat. No. 5,930,779.

U.S. Patent Application entitled "Enhanced System and Method for Report Generation", filed concurrently herewith, Ser. No. 08/823,762, now abandon.

The above-listed applications are incorporated herein by reference in their entireties.

BACKGROUND OF THE INVENTION

1. Field of the Invention

The present invention relates generally to a system and method for the placement of articles of manufacture or pieces of equipment. More specifically, the invention allows a user to symbolically place an article or a piece of equipment on the floor space of a building at a remote site.

2. Related Art

It is a difficult task for a large corporation to keep an inventory of all the articles of manufacture or pieces of equipment placed at its sites. Typically, each site (e.g., the Dallas, Fort Worth site) has more than one building, and each building has floors that house the equipment.

As an example, a long distance telecommunications service provider (hereinafter "service provider") typically maintains billions of dollars worth of network assets. The majority of such network assets are typically installed in numerous field sites located throughout a vast geographical region that encompasses a long distance telephone network. For example, MCI maintains billions of dollars worth of transmission and power equipment located in hundreds of remote field sites throughout North America.

Typically, much of the network equipment is arranged and mounted in equipment bays. Such equipment bays are typically organized as a plurality of side-by-side racks, each having a plurality of top-to-bottom shelves, wherein each shelf contains a plurality of vertically positioned slots. Circuit cards are typically installed in the vertically positioned slots. In addition, other types of modules are installed on the shelves.

Conventionally, it has been difficult for service providers to maximize the use of space within remote sites. Typically, site planners design the layout of remote sites down to the rack level. These plans are then used by engineering groups to design the layout of each rack at the "rackface" level. That is, the engineering groups arrange the shelves within each rack, and the cards and other modules within each shelf. The result is a configured rack.

It is often the case, that changes made in the field are not recorded. Consequently, site planners and other groups do not necessarily have access to accurate and updated information pertaining to the layout and configuration of equipment placed within remote sites. This makes it very difficult for site planners and other groups to plan ahead for future changes and maximize the use of the available space within remote sites. It also makes it difficult for power engineers to accurately estimate the ongoing and changing power requirements for remote sites, which can cause unwanted delays and down times due to inadequate power reserves.

It has also been desired to plan, up to a desirable number of years in advance, what spaces on a floor (at a building within a site) are to be allocated to which types of equipment. This has made facilities planning for available floor space a difficult task.

Site planners also need to know when configured racks (including modules and shelves) that are placed on a floor space have been brought on-line. This information is required for power equipment in addition to transmission equipment. Further, it is would be very useful for site engineers to know exactly when installed equipment becomes activated and decommissioned. This would allow much greater flexibility for future planning of remote sites.

SUMMARY OF THE INVENTION

The present invention is directed to providing a system and method for allowing users to symbolically place an article or a piece of equipment on the floor space of a building at a remote site. The invention permits users to graphically represent objects (e.g., floor objects, zone objects, etc.) defining the available area and to store tabular information describing the configuration of the graphical objects and the articles or pieces of equipment represented by the graphical objects.

An article or a piece of equipment placed on the floor space is referred to as a "footprint." Hence, the present invention is primarily directed to creating footprints associated with an area of the floor space at a remote site.

In one embodiment, the piece of equipment occupying the floor space can be a configured rack. A rack can be conceptualized as a book case, comprising shelves aligned atop one another, with modules stored on the individual shelves. In a telecommunications application, modules such as circuit cards or multiplexers are stored on the shelves of a rack. Configured racks are stored in a configuration library, and are readily available for placement on the floor space, in order to create footprints.

In a preferred embodiment, a site hierarchy is created prior to creating footprints. Preferably, site hierarchies are created via an administrative tool provided by an implementation of the present invention. Data related to the site hierarchies are stored in a portion of a hierarchical database, preferably a relational database, that is conceptually referred to herein as the "site hierarchy repository." The user uses the administrative tool to establish (non-graphically) a site, a structure (building) within the site, and a floor within the structure.

The user can then create a hierarchy of graphical objects located on a desired floor. Specifically, the invention allows the user to graphically represent, via closed polygonal shapes, a floor, zones inside the floor, planning units inside the zones, row segments inside the planning units, and footprints inside the planning units. In this manner, all the available floor spaces at a site can be graphically represented. The graphical representations are stored in the hierarchical database as a sequence of points, so that the representations can be automatically regenerated for a future use. In addition, physical attributes of the physical objects represented by the graphical objects, such as the area of a floor space represented by a zone graphical object, are stored in the hierarchical database.

Architectural drawings, which detail the physical limitation of the floor space (i.e., the locations of structural support columns, power cables) can also be used as an underlay for the graphical representation of a floor at a site. That is, a user can trace out a graphical floor object over an architectural drawing, so that the user is cognizant of how to most efficiently allocate the floor space for footprints.

Once the graphical objects are defined for a particular floor within a particular site, footprints can be placed on the floor. For each footprint, the user can store a tremendous amount of information regarding the article or piece of equipment occupying the footprint. This information is loaded into a hierarchical database for the footprint. Because footprints are only representations of actual articles and pieces of equipment, they can represent the occupant of a floor space at any point in time. In a preferred embodiment, the footprints store information relating to how the equipment is placed on the floor (e.g., defining an "envelope" surrounding the footprint, the direction the equipment faces) and important dates pertaining to the equipment. Important dates include the planned and actual installation dates, activation dates (when the equipment is to be turned on), decommission dates (when the equipment is to be turned off) and removal dates for said article or said piece of equipment.

Finally, after the graphical objects have been created and tabular (non-graphical) information regarding the graphical objects and the footprints have been stored in the hierarchical database, the user can easily view and modify both the graphical objects and the non-graphical information. The user can also generate reports to view required information.

BRIEF DESCRIPTION OF THE FIGURES

The present invention will be described with reference to the accompanying figures, wherein.

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

The present invention is directed toward a system and method for allowing users to symbolically place an article or a piece of equipment on the floor space of a building at a remote site. The invention permits users to graphically represent objects (e.g., floor objects, zone objects, etc.) defining the available area and to store tabular information describing the configuration of the graphical objects and the articles or pieces of equipment that are represented by the graphical objects.

Section I explains the example environment for the invention.

Section II is the operation overview for the invention.

Section III presents the architecture for a suite of tools called the SiteVu tool, including an overview of the database and the components of SiteVu itself. The instant invention is particularly directed to subsections 4 (the administrative tool) and 5 (the placement tool).

Section IV defines an example equipment rack.

Section V provides a graphical view of a site hierarchy.

Section VI describes how to create a configured, rack, including creating a product catalog component (module, shelf or rail), creating a shelf configuration, and adding modules to the shelf Section VII illustrates the site hierarchy database.

Section VIII describes the substantive portion of the present invention.

Section IX is an example implementation of the invention.

Section X provides a detailed view of the site hierarchy.

Section XI is a brief conclusion.

I. An Example Environment

The present invention is described in terms of an example embodiment. Specifically, the present invention is described in terms of an application program comprising all of the features of the present invention, in combination with a system for recording, maintaining and viewing placement and configuration of equipment for field sites. An example of such a system is the above referenced U.S. patent application Ser. No. 08/823,557 which now U.S. Pat. No. 6,098,050 "System and Method for Recording, Maintaining and Viewing Configuration and Placement of Equipment it Remote Sites." In the preferred embodiment, a suite of tools named "SiteVu" is used to record, maintain and view the configuration and placement of equipment in field sites for a telecommunications service provider. The description in such terms is provided for convenience only. It is not intended that the invention be limited to this example embodiment. For example, the present invention can be used to support other types of equipment for industries other than the telecommunications industry. In fact, after reading the following description, it will become apparent to persons skilled in the relevant art(s) how to implement the present invention in alternative embodiments.

II. The Operational Environment

Figure 1A:
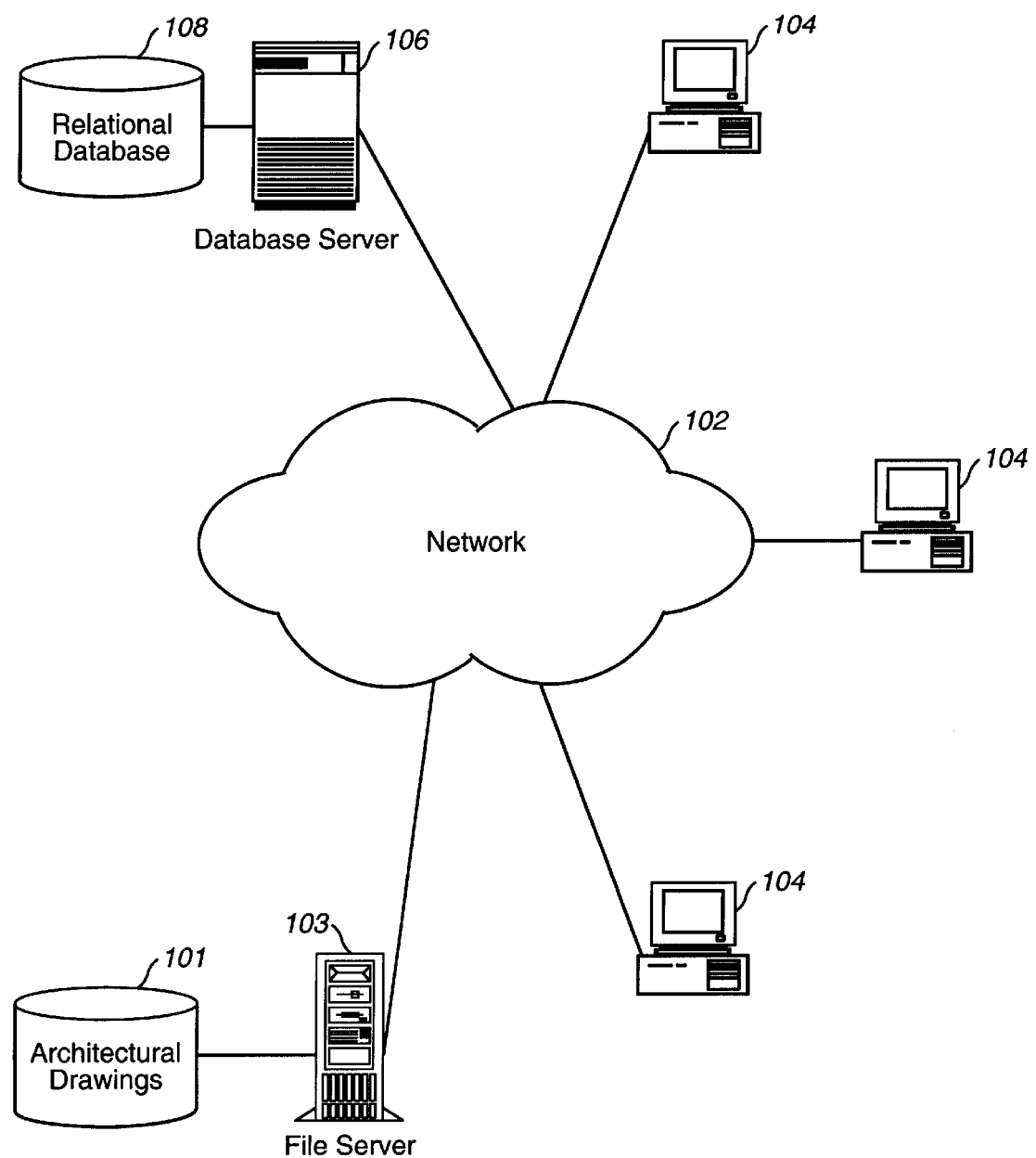
FIG. 1A is a block diagram depicting an operational environment.

FIG. 1A is a block diagram depicting a typical operational environment according to a preferred embodiment of the present invention. A network 102 is depicted in the center of the drawing in FIG. 1A. The network 102 represents any type of computer and/or telecommunications network or combination thereof, that can be used to couple a plurality of workstations 104 with a relational database 108. In this example, each workstation 104, is a general purpose computer system that executes software (referred to herein as "SiteVu"), that causes the computer system 104 to perform the functions as described herein.

In one embodiment of the present invention, the network 102 can be a company wide intranet. In other embodiments, local area networks (LANs), or wide area networks(WANs), (such as multiple LANs linked together with bridges, routers or the like), can be used as the network 102. In addition, the network 102 can include the use of switched networks, and other forms of common carrier transmission lines and equipment that can link remote computers, such as the remote workstations 104, to the relational database 108.

Also depicted in the example environment shown in FIG. 1A is file server 103 and a storage device comprising architectural drawings 101. In a preferred embodiment, each computer system 104 executes software that performs computer aided drafting and design (CADD) functions. As described below, the CADD software is controlled by the SiteVu program in a preferred embodiment of the present invention. In this example, architectural drawings may be stored on local storage devices in each of the workstations 104, or in a central file server, such as the file server 103. This aspect of the present invention will be subsequently described below.

In this example the relational database 108 is coupled with a database server 106. In a preferred embodiment, the relational database is implemented using an Oracle relational database, supplied by Oracle Corporation. In addition, the database server 106 is a DEC Alpha 2100, manufactured by Digital Equipment Corporation. Further, Microsoft Windows®, manufactured by Microsoft Corporation can be used as the operating system for the computer systems 104 used to execute the SiteVu suite of tools (including the SiteVu placement tool) and the CADD programs. Finally, in a preferred embodiment, the CADD program used is Microstation CADD, manufactured by Bentley Systems Inc.

III. An Architecture for the SiteVu Program

FIGS. 1B–1H depicts an example of an architecture of the SiteVu program, according to a preferred embodiment of the present invention. Specifically, FIGS. 1B–1G describe an example of SiteVu components and their associated inputs and outputs.

A. The Logical Components for the Database

Figure 1B:
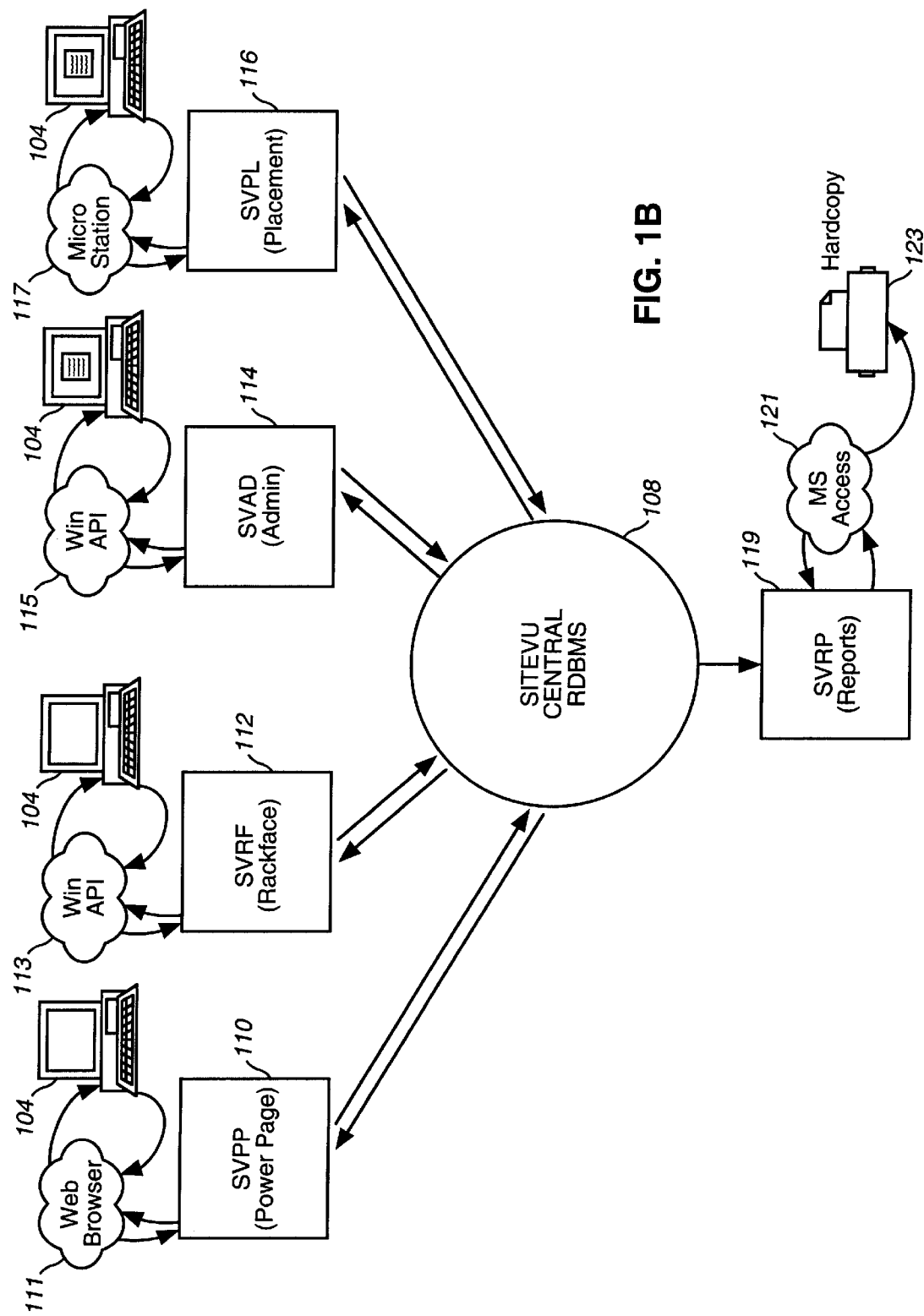
FIGS. 1B–1G are block diagrams depicting various functional components according to a preferred embodiment of the present invention.
Figure 1C:
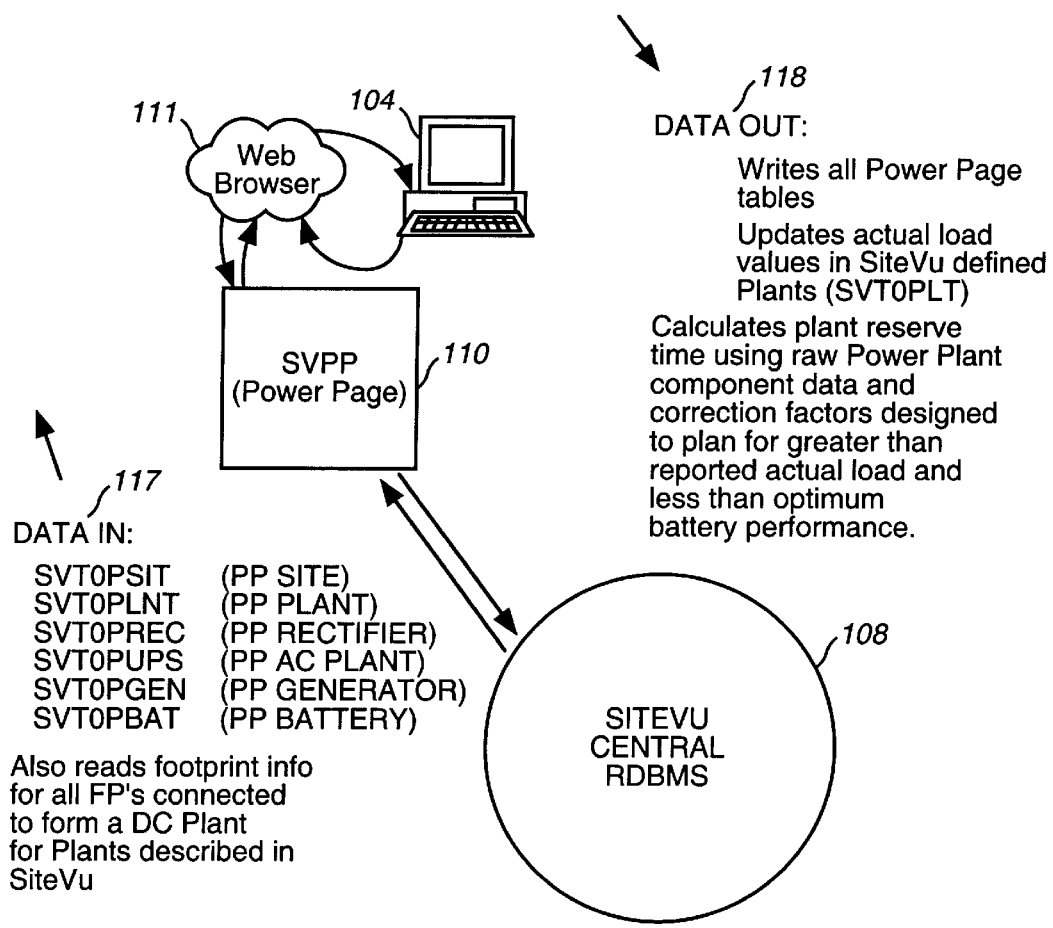
Figure 1D:
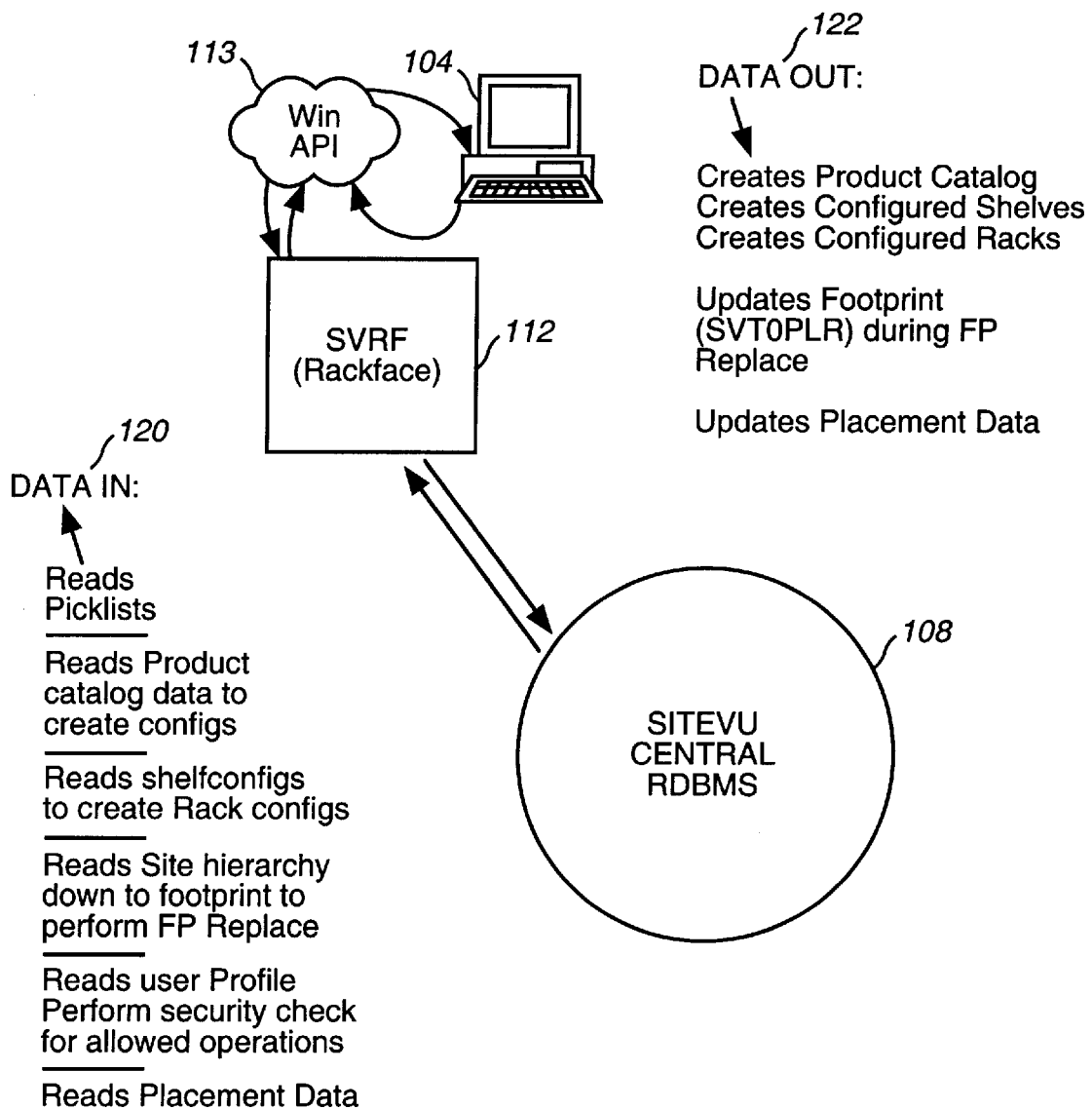
Figure 1E:
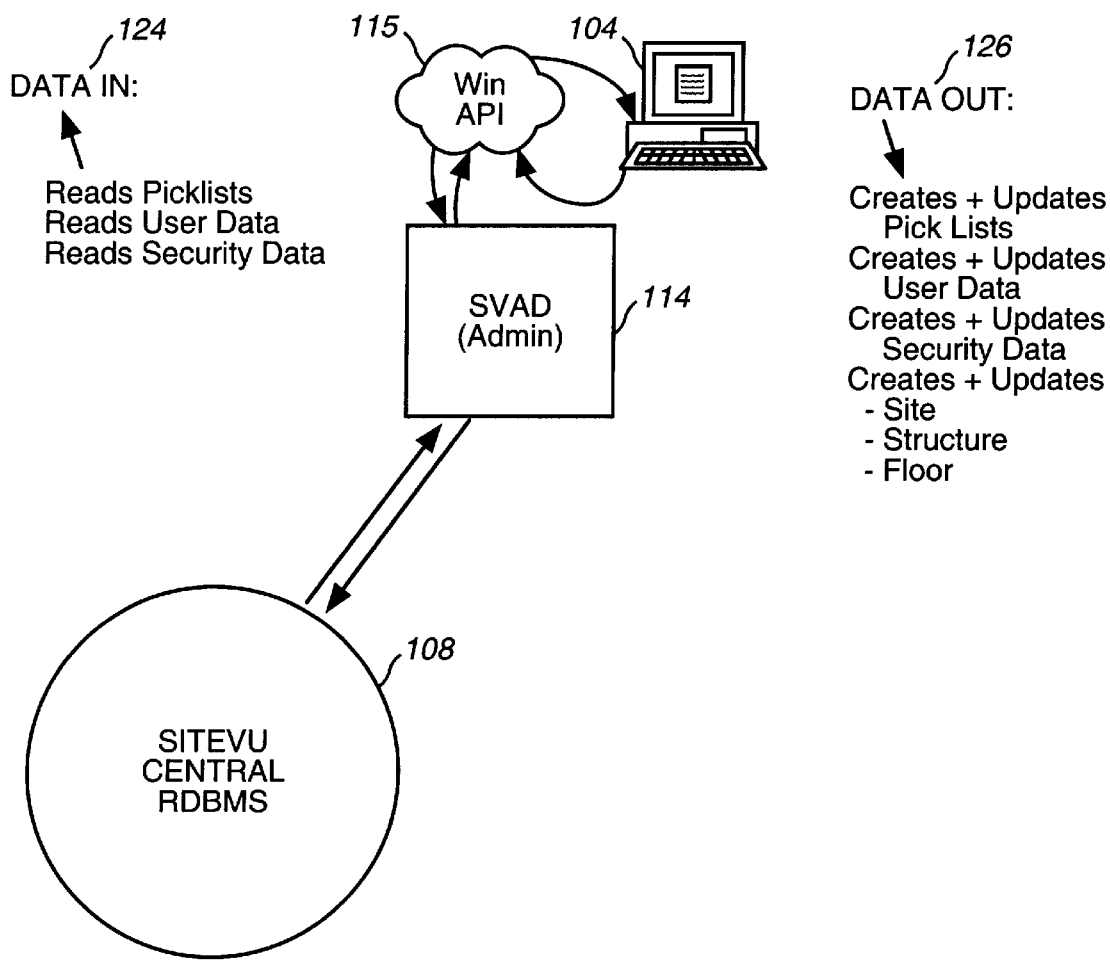
Figure 1F:
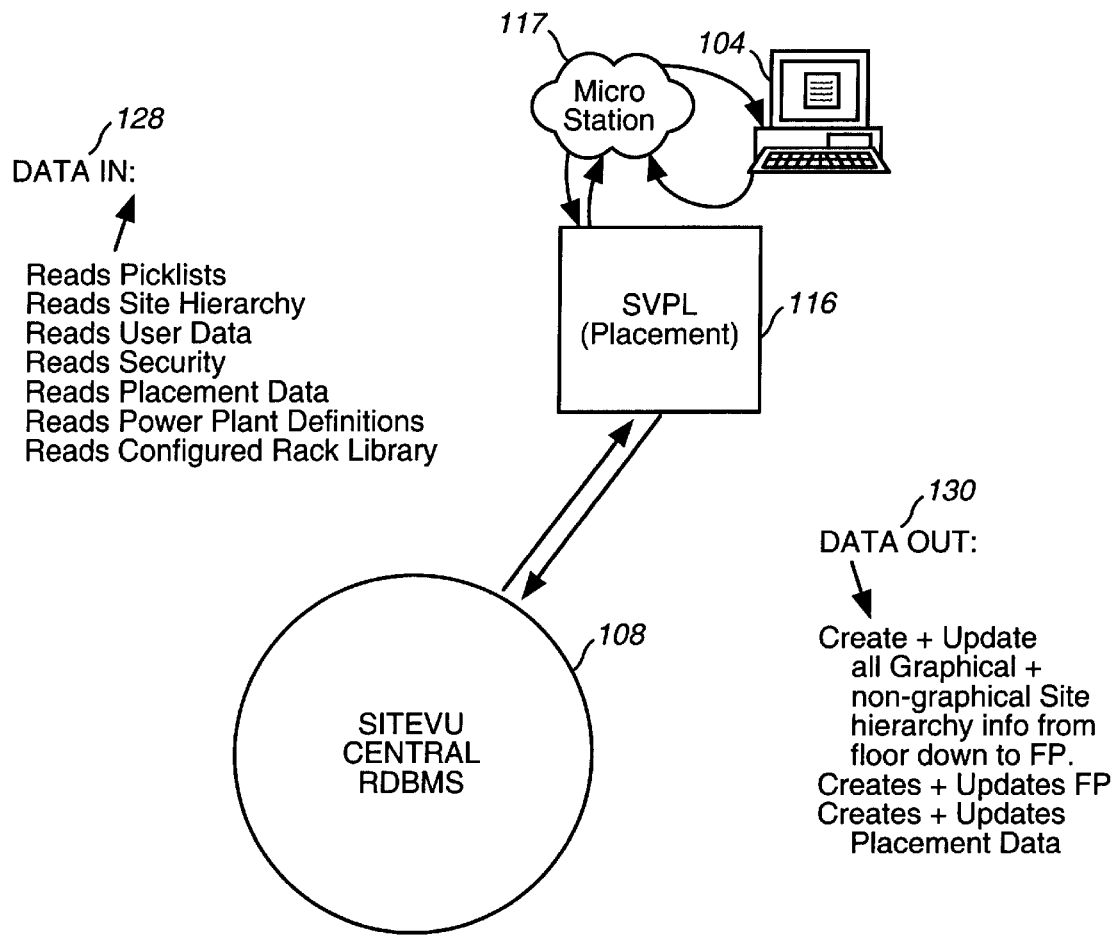
Figure 1G:
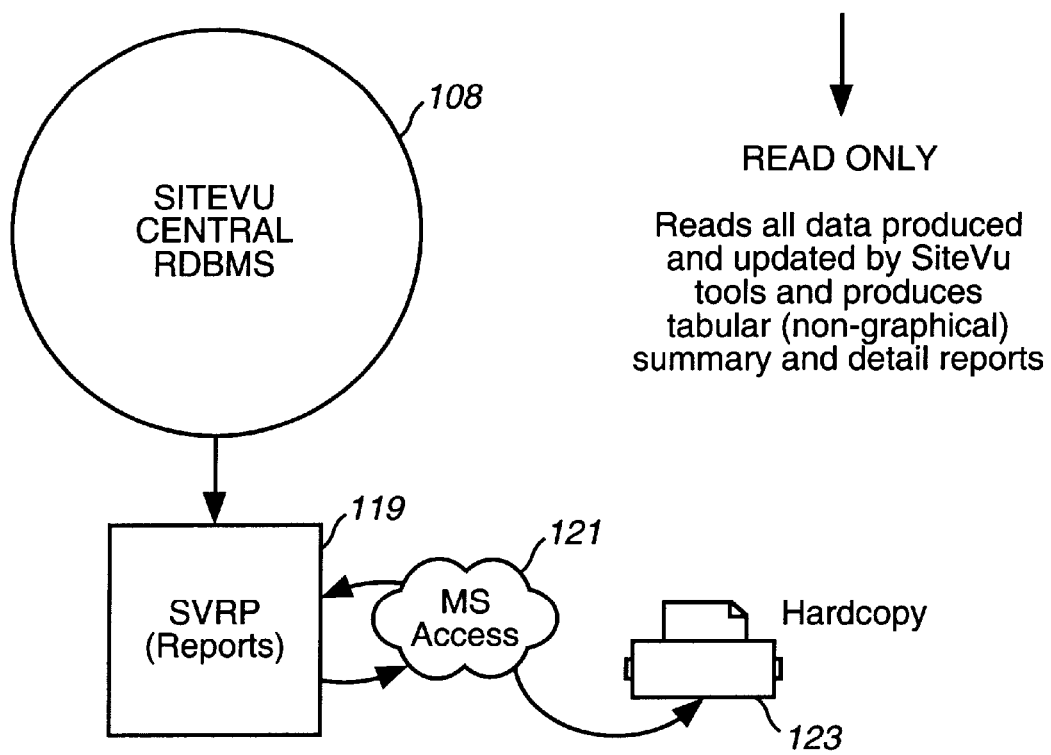
Figure 1H:
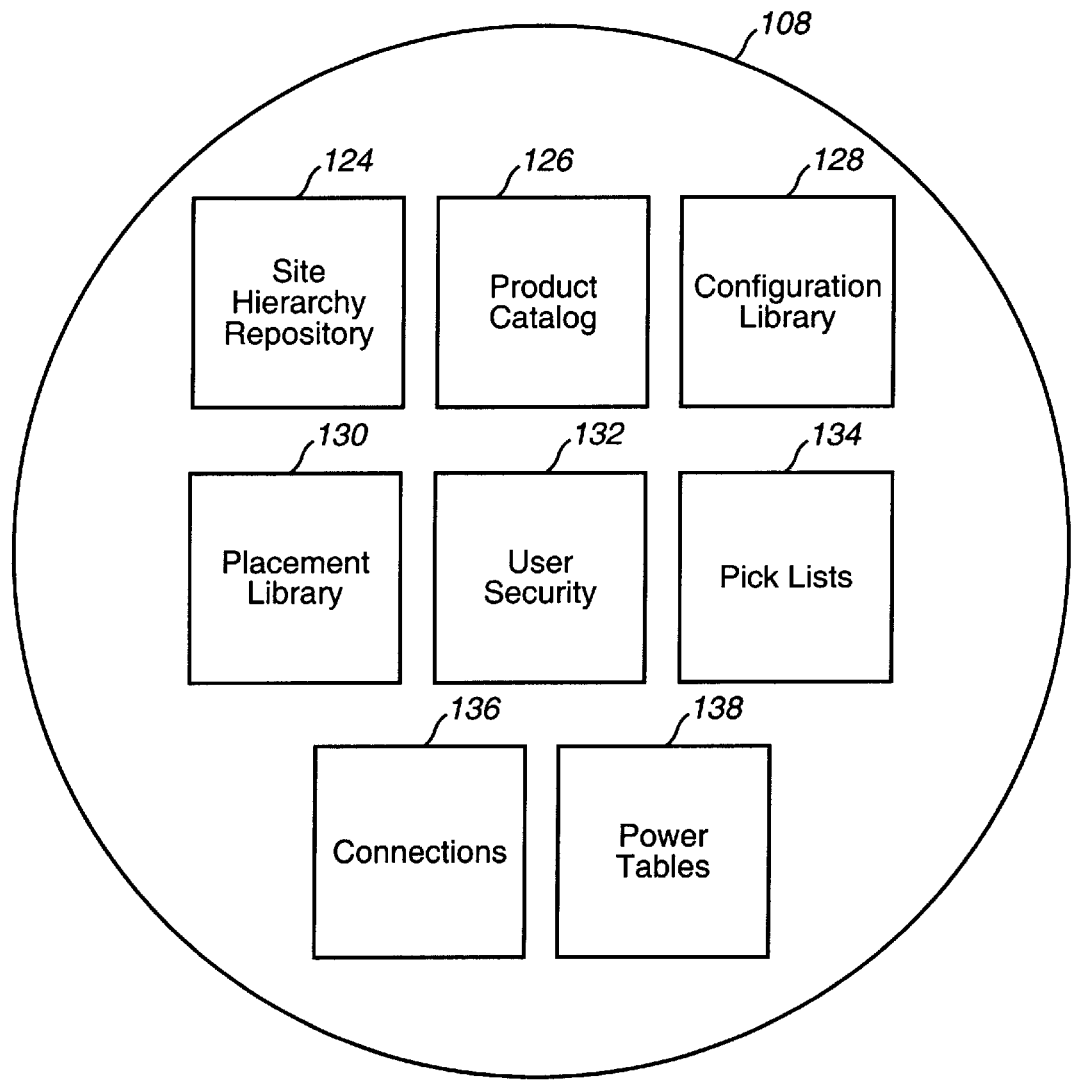
FIG. 1H is a block diagram depicting the components of a database according to a preferred embodiment of the present invention.

FIG. 1H depicts the logical components of the database 108, according to a preferred embodiment of the present invention. Specifically, in this example, the database 108 comprises: a site hierarchy repository 124; a product catalog 126; a configuration library 128; a placement library 130; user security 132; pick lists 134; connections 136; and power tables 138.

A more detailed description of the database 108, illustrating specific tables and relationships between tables, is subsequently described below in section VIII with reference to FIGS. 10A–10N.

B. The SiteVu Components

FIGS. 1B–1G describe an example of SiteVu components and their associated inputs and outputs.

1. An Overview of the Components

As indicated by FIG. 1B, the SiteVu central database 108 is preferably, a relational database management system. The SiteVu tool (FIG. 1B) comprises the following components: the SiteVu Power Pages (SVPP) 110; the SiteVu Rackface tool (SVRF) 112; the SiteVu Administrative tool (SVAD) 114; the SiteVu Placement tool (SVPL) 116, and the SiteVu Report Generator (SVRP) 119.

2. The Power Page Tool

As indicated by FIG. 1C, the power page 110 reads data from and stores data in the database 108. The power page 110 provides power estimates for remote sites. In a preferred embodiment, a web browser 111 is used to input data into the power page 110 from the workstation 104, and to output data from the power page 110 to the workstation 104.

3. The Rackface Tool

As depicted in FIG. ID, the rackface tool 112 reads data from and stores data in the database 108. The rackface tool 112 is used to define components for the product catalog 126. Further, the rackface tool 112 is used to define configured shelves using empty shelves and modules from the product catalog 126, and storing the configured shelves in the configuration library 128. In addition, the rackface tool 112 is used to define configured racks from rails and configured shelves from the product catalog 126 and the configuration library 128, respectively. Such configured racks (also referred to as racks), are stored in the configuration library.

In addition, the rackface tool 112 is used to operate on footprints. As stated footprints are racks that have been placed in remote sites, via the placement tool 116 (described below). Specifically, in a preferred embodiment, the rackface tool 112 is used to display information about footprints and to replace one footprint with another footprint, as described below.

In a preferred embodiment, the rackface tool 112 is implemented using Windows® operating system, provided by Microsoft, Inc. Thus, Window's® Application Programming Interface 113 is used to implement the functions provided by the rackface tool 112 on the workstation 104.

FIG. 1D depicts various types of data used by rackface tool 112, according to a preferred embodiment of the present invention. As indicated by the data-in list 120, the rackface tool 112 reads pick lists 134 from the database 108. As described in further detail below, a pick list is a database table that comprises a list of valid values for particular data fields within the database 108. Preferably, pick list tables are used during a data entry process to provide users with a drop-down list box, or the like, comprising textual representations of pre-defined values that can be specified for particular data fields. Note that the term "pick list" is used herein to describe a pick list table in the database 108.

However, the term is also used herein to describe the drop-down list box that is associated with a pick list table and used during a data entry process, as described above.

In addition, the rackface tool 112 reads data from the product catalog 126 to create shelf configurations that are stored in the configuration library 128. Further, configured shelf data from the configuration library 128 is used to create rack configurations that are also stored in the configuration library 128. Site hierarchy data is read from the site hierarchy repository 124, and is used to replace generic footprints with manufacturer specific footprints. Further, placement data is read from the placement library and used to display footprint information, and replace generic and manufacturer specific footprints, as described below.

User and security data 132 is read by the rack face tool to determine access rights and the like for particular users. In addition, placement data is read from the placement library 130 when the rackface tool 112 replaces generic footprints, as described below.

Examples of data output from the rackface tool 112, as indicated by the data-out list 122, includes product catalog data, configured shelves data and configured rack data. For example, the rackface tool 112 is used to create components for the product catalog 126. An example of a process that can be used to create components in the product catalog 126 is subsequently described herein with reference to FIG. 6.

Similarly, the rackface tool 112 is used to create entries in the configuration library 128. An example of a process that can be used to create data entries for the configuration library 128 is subsequently described herein with reference to FIGS. 4A, 4B and 6.

Another example of data output from the rackface tool 112, includes data used to update the placement library 130. For example, the placement library 130 is updated when a generic footprint is replaced with a manufacturer specific footprint, as described below.

4. The Administrative Tool

As indicated by FIG. 1E, the Administration tool 114 reads data from and stores data in the database 108. The Administration tool 114 is used to create and update the pick lists 134, user security data 132, and the site hierarchy repository 124. In a preferred embodiment, the Administration tool 114 is implemented using the Windows® operating system, provided by Microsoft, Inc. Thus, Window's® Application Programming Interface 115 is used to implement the functions provided by the administration tool 114 on the workstation 104.

FIG. 1E depicts various types of data used by administrative tool 114, according to a preferred embodiment of the present invention. As indicated by the data-in list 120, the administrative tool 114 reads pick lists 114 and user security data 132 from the database 108.

As indicated by the data-out list 126, the administrative tool 114 creates and updates pick lists 134 and user security data 132. In addition, this tool is used to create part of the site hierarchy that is stored in the site hierarchy repository 124, as described below. Specifically, the sites, buildings (or structures) and the non-graphical portion of the floor level hierarchies are created by the administrative tool 114.

5. The Placement Tool

As indicated by FIG. 1F, the placement tool 116 reads data from and stores data to the database 108. The placement tool 116 represents an example of a specific embodiment of the present invention. Specifically, the Placement tool 116 is used to create footprints (i.e., an equipment placed on the floor space) by placing racks in remote sites. Such data is stored in the placement library 130. In a preferred embodiment, the placement tool 116 is also implemented using the Windows® operating system, provided by Microsoft, Inc. In addition, graphics are provided by a CADD program, such as Micro station CADD 117, as previously described.

FIG. 1F depicts the various types of data used by placement tool 116, according to a preferred embodiment of the present invention. As indicated by the data-in list 128, the placement tool reads pick lists 134, user and security data 132, site hierarchy data 124, placement data 130, configured rack data 128, and power plant definition data 138 from the database 108.

As indicated by the data-out list 130, the placement tool 116 uses a site hierarchy (i.e., from a site down to a floor) established by the administrative tool 114 to create graphical and database representations of remote sites, buildings, floors, zones, rows (specifically row segments), and footprints. The tool can also be used to update these objects, both graphically and the data associated therewith. Therefore, the tool can be used to update site hierarchy data 124, configuration data 128, pick list data 134, and placement data 130.

6. The Report Generator

As indicated by FIG. 1G, the report generator 119 reads data from the database 108 to generate reports. In a preferred embodiment the report generator is implemented using Access 121, provided by Microsoft, Inc. Reports are printed on the printer 123.

IV. An Equipment Rack

Figure 2:
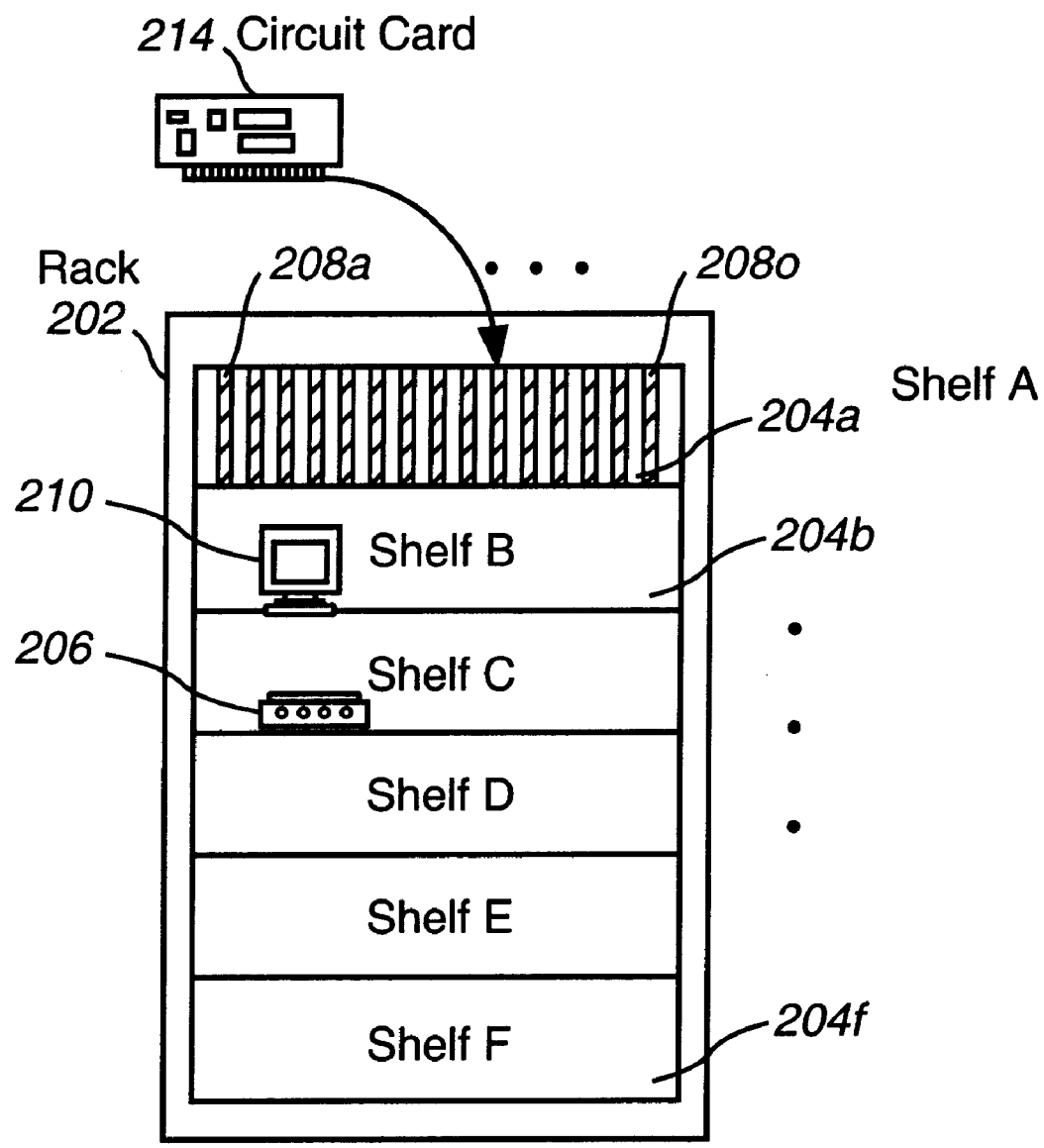
FIG. 2 is a block diagram depicting a rack, shelves and modules according to a preferred embodiment of the present invention.

As stated, equipment within remote sites are typically arranged and mounted in equipment racks. FIG. 2 is an illustration depicting a typical equipment rack 202. Accordingly, the equipment rack 202 comprises a plurality of shelves 204a–204f (generally 204). In this example, the shelf 204a comprises a plurality of vertically positioned slots 208a–208o (generally 208). Typically circuit cards, such as the circuit card 214, are installed in the slots 208.

As described below with reference to FIGS. 4A and 4B, data related to particular modules that can be used to configure the shelves 208, according to a preferred embodiment of the present invention, are stored in the product catalog 126. Accordingly, the circuit card 214 is an example of a type of module that is preferably represented in the product catalog 126. Other examples of types of modules can be represented in the product catalog 126 are the workstation 210 and the modem 206. As shown in FIG. 2, such modules 206, 210 and 214 are used to configure shelves 208, according to a preferred embodiment of the present invention.

V. A Graphical View of the Site Hierarchy

Figure 3:
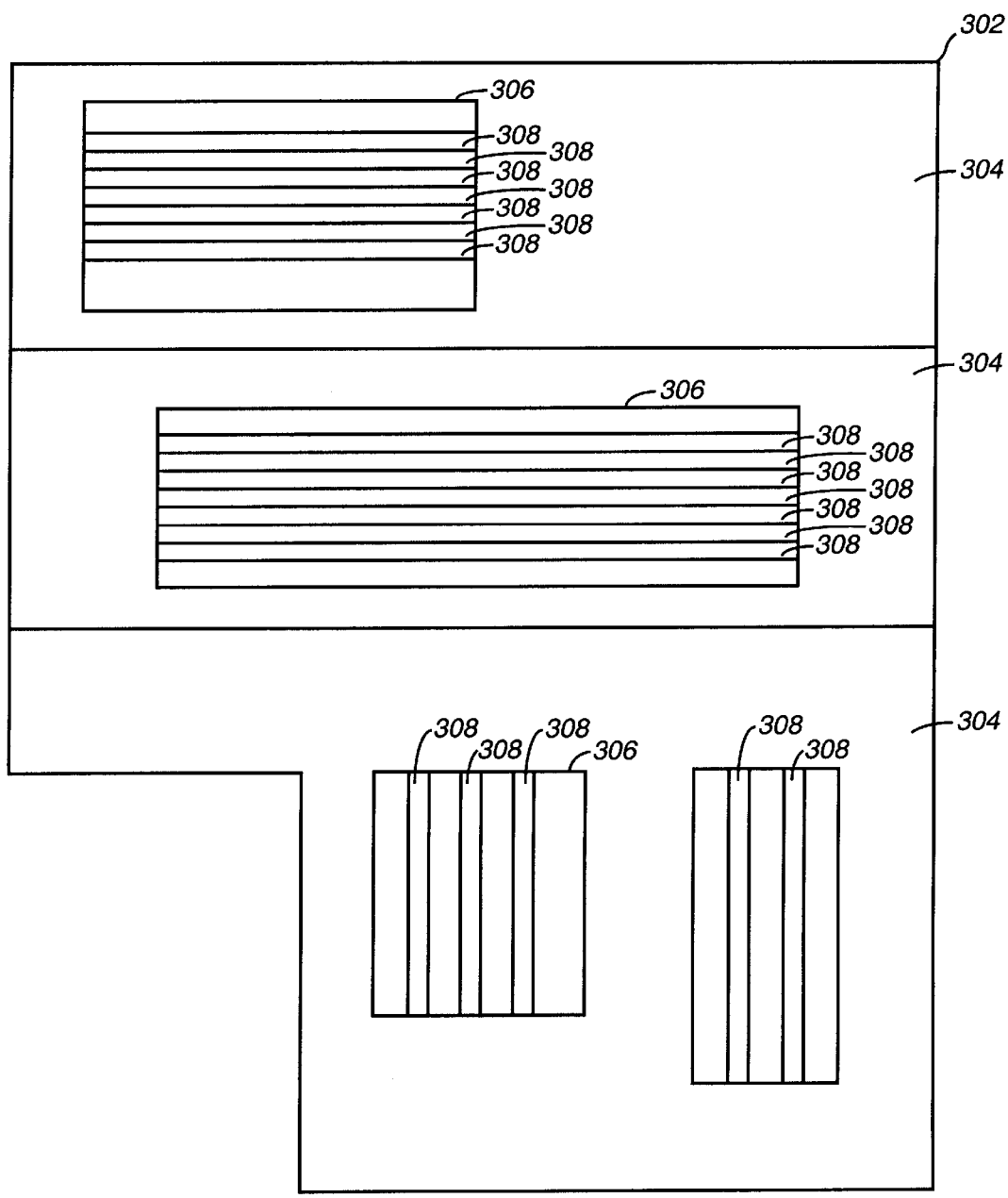
FIG. 3 is a block diagram depicting a graphical representation of the site hierarchy, according to a preferred embodiment of the present invention.

FIG. 3 is a block diagram that graphically illustrates an example of a site hierarchy, as previously described. Specifically, the site hierarchy shown in FIG. 3 comprises a floor 302, 3 zones 304, 4 planning units 306 and a plurality of row segments 308 within each planning unit 306. As previously described, each site hierarchy level shown in FIG. 3 is represented by a polygonal shape that completely encloses the lower site hierarchy level that are contained therein.

In this example of a preferred embodiment, zones typically represent physical locations in which equipment of a particular class are placed. In a preferred embodiment, racks cannot be placed unless the equipment class of the rack matches the equipment class of the zone in which the rack is being placed. This restriction can be overridden, however, by a user with special access who uses a "superuser" function.

In this example, planning units 306 are specified so that multiple users can define row segments 308, in the same zone 304, at the same time. In a preferred embodiment, the database 108 is shared by multiple users. However, in order to maintain data integrity, certain precautions must be taken. In this example, when a user is in the process of defining rows and placing row segments 308, via the placement tool, as described below, other users are prevented from accessing certain portions of site hierarchy repository 124. In particular, the site hierarchy level just above the row level being defined must be locked. Thus, a site hierarchy level of planning unit 306 is used between the row level 308 and zone level 304. Accordingly, planning unit 306 is locked from other users instead of the zone level 304. In this manner, several users can work simultaneously to define row segments 308 within the same zone 304.

Further, in this example, footprints can only be created in row segments 308. As will be described below, a physical row in a site may comprise one or more row segments 308. In the simple example shown in FIG. 3, there is a one to one correspondence between physical rows and row segment 308. However, a site hierarchy level called a row segment 308, is used in a preferred embodiment of the present invention, to prevent users from placing racks in areas that have physical obstructions. For example, suppose a physical obstruction, such as a building support column, is present within a particular row in a field site. In this case, the physical row is represented by two row segments, that are placed to avoid the obstruction. In this fashion, since racks can only be placed within row segments 308, a user cannot inadvertently place a rack in the same position as the obstruction.

As noted above, an implementation of the present invention provides a means for defining components, including modules, shelves and rails, that are stored in the product catalog 126. Preferably, detailed information pertaining to each component within the product catalog 126 is defined during a data entry process.

VI. Creating Configured Racks From Product Catalog Components

A. Creating a Product Catalog Component

Figure 6:
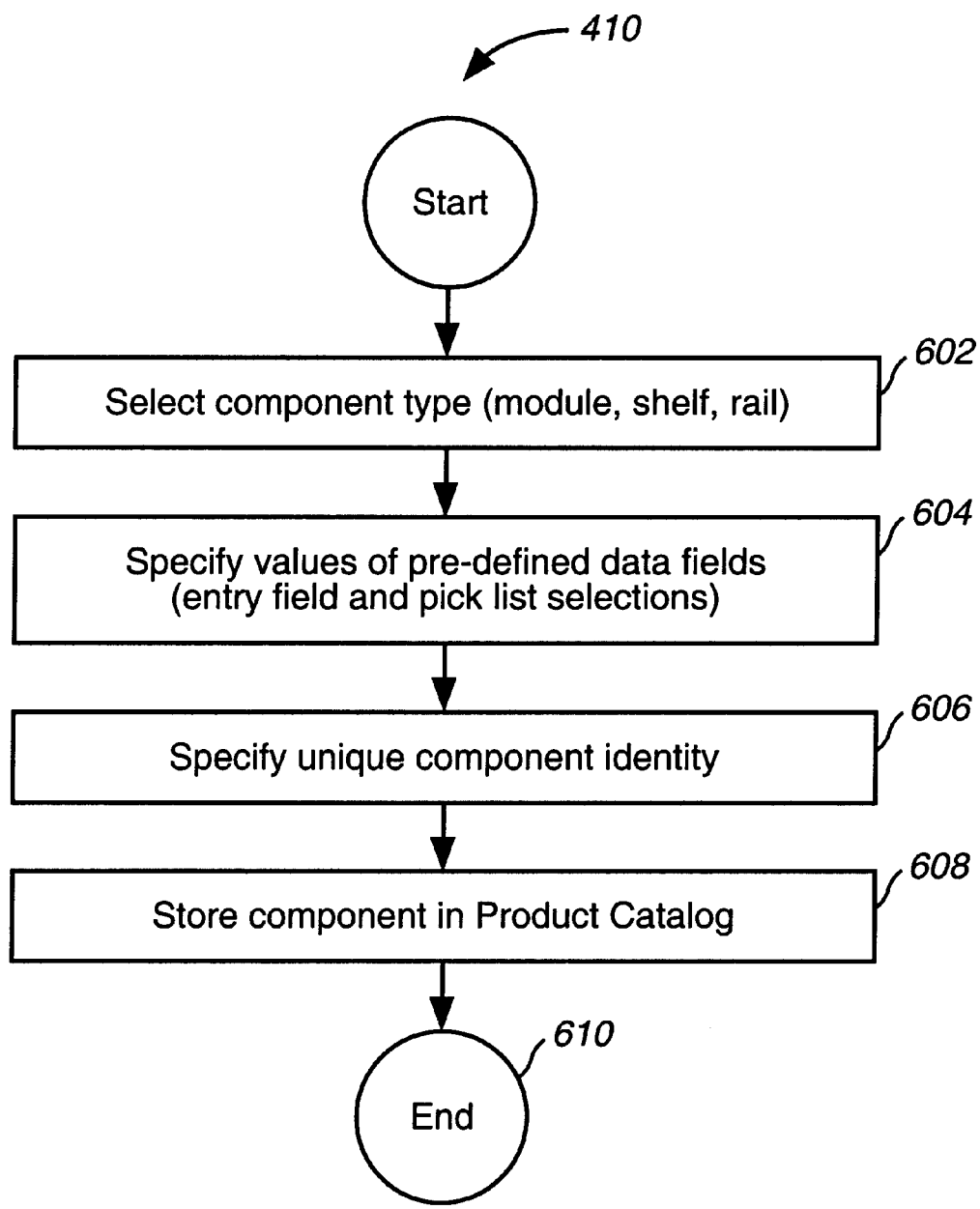
FIG. 6 is a flowchart depicting a process that can be used for creating a components in the product catalog, according to a preferred embodiment of the present invention.

FIG. 6 is a flowchart depicting a example of such an data entry process that can be used to create components for the product catalog 126, according to a preferred embodiment of the present invention. Specifically, in a preferred embodiment, this process is performed via the rackface tool 112 component of SiteVu. The process begins with step 602. In step 602, a user selects the component type. In this example, component types include modules, shelves and racks. Once a component type is selected, control passes to step 604. In step 604, the user specifies values for each attribute presented from a pre-defined list of attributes, that are applicable to the selected component type. Preferably, a different pre-defined list of attributes is presented for each component type. Thus, a particular list of attributes is presented to the user, depending on the type of component selected in step 602. Generally, values for attributes are specified by either typing data directly into data entry fields, or by selecting one or more pre-defined items from a pick list associated with the data attribute.

Examples of attributes that can be specified in step 604 include identifying attributes, physical attributes, electrical and connection attributes and status attributes. Identifying attributes include for example, manufacturer's name, manufacturer's model number, service provider's identifier, bar code identifier, manufacturer's part number, manufacturer's description, face label, equipment class code and equipment subclass code.

Physical attributes generally include height, width, depth, and weight. Typical electrical attributes include voltage type, a voltage quantity, current and current quantity. Further, in a preferred embodiment, additional data fields are included that indicate whether or not the attributes have been completely specified.

In step 606, the user specifies a unique identifier for the newly created component. Next, as step 608 indicates the component is stored in the product catalog 126. The process ends with step 610.

B. Creating a Shelf Configuration

Figure 4A:
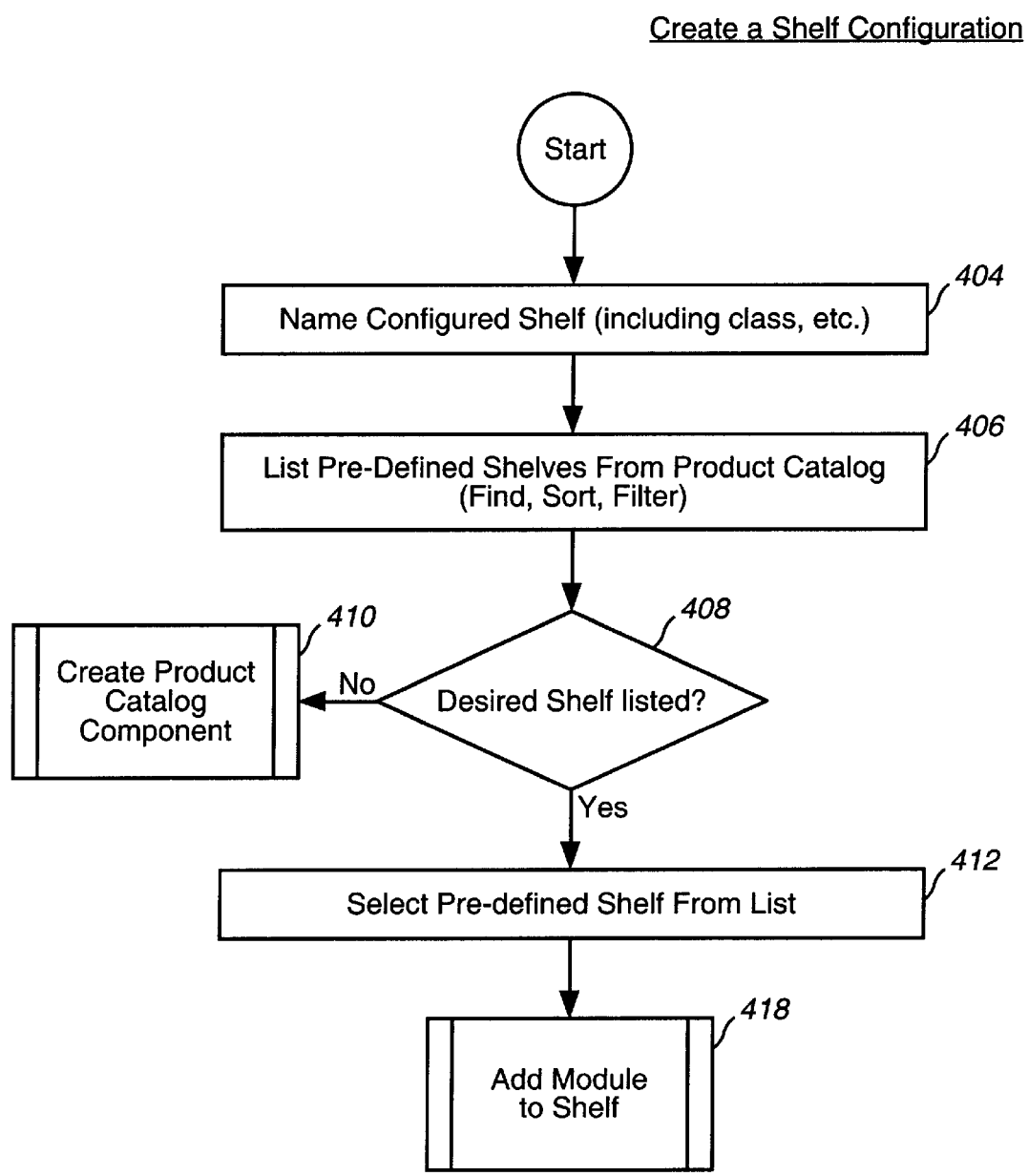
FIGS. 4A and 4B are flowcharts depicting a process that can be used for creating a configured shelf, according to a preferred embodiment of the present invention.

FIG. 4A is a flowchart depicting a process that can be used to create a shelf configuration, according to a preferred embodiment of the present invention. Specifically, this process is performed by the rackface tool 112, according to a preferred embodiment of the present invention. The process begins with step 404. In step 404, the user specifies a unique name for the new shelf configuration. Typically, this name must be unique in the database 108. In addition, values are specified for required fields. For example, in a preferred embodiment, required fields include a manufacturer, an equipment class and an equipment subclass. Note that in a preferred embodiment, a value for manufacturer or 'generic' is used for generic racks as previously described.

Next, in step 406, a pick list is displayed to the user comprising a list of pre-defined components from the product catalog 126. Thus, components that have been created according to the process depicted in FIG. 6 are listed in step 406.

Specifically, in this example, a list of shelf components are presented to the user. In a preferred embodiment, sort, find and filter options are provided to assist the user in finding a particular component listed in the product catalog 126. In any case, the user is prompted to select a particular shelf from the pick list presented in step 406.

Next, as step 408 indicates, if a desired shelf cannot be found in the product catalog 126, control passes to step 410. This can occur for example, if a user desires to use a particular shelf that has not yet been created, via the data entry process depicted in FIG. 6. Accordingly, the user has the option to create a new product catalog 126 component as indicated by step 410. Process steps that can be used to create a product catalog component 410 is presented in FIG. 6, as previously described.

On the other hand, as indicated by step 408, if the pick list in step 406 contains the desired shelf component, the user selects the shelf component in step 412. Control then passes to step 418. In step 418, the user adds modules to the selected shelf.

C. Adding Modules to a Shelf

Figure 4B:
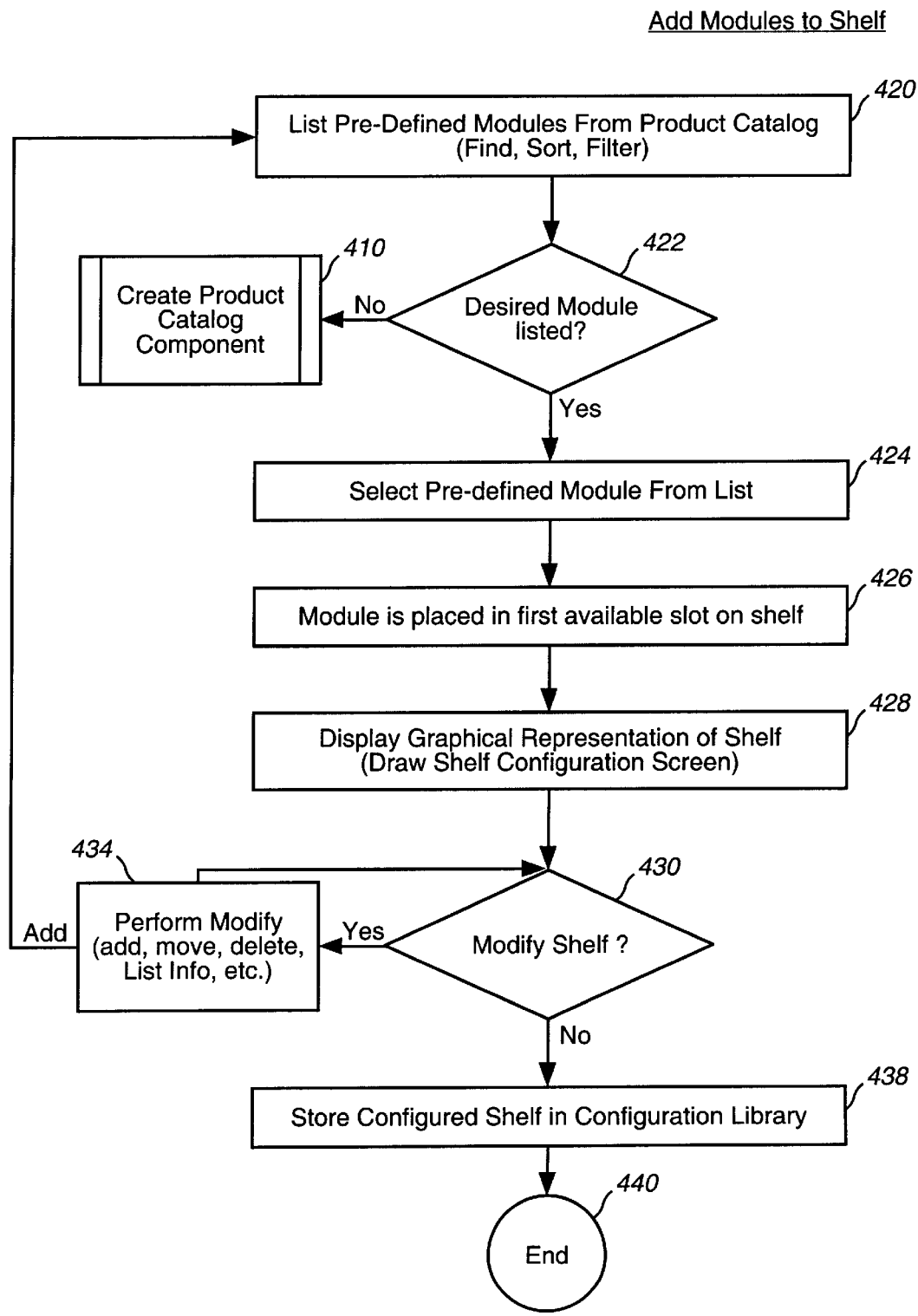

A process that can be used to add modules to a selected shelf is presented in FIG. 4B. The process begins with step 420.

In step 420 the user is presented with pick list that contains a list of pre-defined modules from the product catalog 126. In a preferred embodiment, sort, find and filter options are provided to assist the user in finding a particular module from product catalog 126.

Examples of pre-defined module types include circuit cards 214, computer terminals 210, and other equipment, such as the modem 206. Modules are components that are generally installed on shelves, such as the shelf 208.

As step 422 indicates, if the desired module is included in the list presented in step 420 control passes to step 424, where the user selects the module. If not, once again the user has the option to create a product catalog component, as indicated by step 410.

After a module has been selected in step 424, control passes to step 426. In step 426, the selected module is placed in the first available slot 208 on the configured shelf 204.

Next as step 428 indicates the user is presented with a graphical representation of the shelf and the module as selected from steps 412 and 424, respectively. Control then passes to step 430.

In step 430, the user has the option to modify the shelf. As step 434 indicates, this includes for example, adding, moving and deleting modules. In addition, the user can list information about the configured shelf. As indicated by step 434, if the user chooses to add more modules to the shelf, control passes to step 420, and steps 420–430 are repeated, as described above.

As stated above, in a preferred embodiment, users edit a configured shelf in step 434, by directly manipulating graphical representations of the selected modules, from step 428. For example, in one implementation, users "drag" graphical representations of the selected modules to particular locations within the graphical representation of the selected shelf. Preferably, a mouse or other pointing device is used to accomplish this task.

After the user has completed modifying the shelf, control passes to step 438. In step 438, the configured shelf is stored in the configuration library 128 and the process ends as indicated by step 440.

In a preferred embodiment, the user also has the option to store the shelf as a "work-in-progress" to be completed later. In addition, other status such as "pending approval", "standard" or "special" can be specified. Preferably, only configured shelves with a status of approved standard (i.e. standard configured shelves that have been approved), or special can be used in a configured rack.

After one or more shelves have been configured and stored in the configuration library 128, according to the process in FIG. 4A, the configured shelves can be used to create configured racks.

D. Creating a Configured Rack

Figure 5:
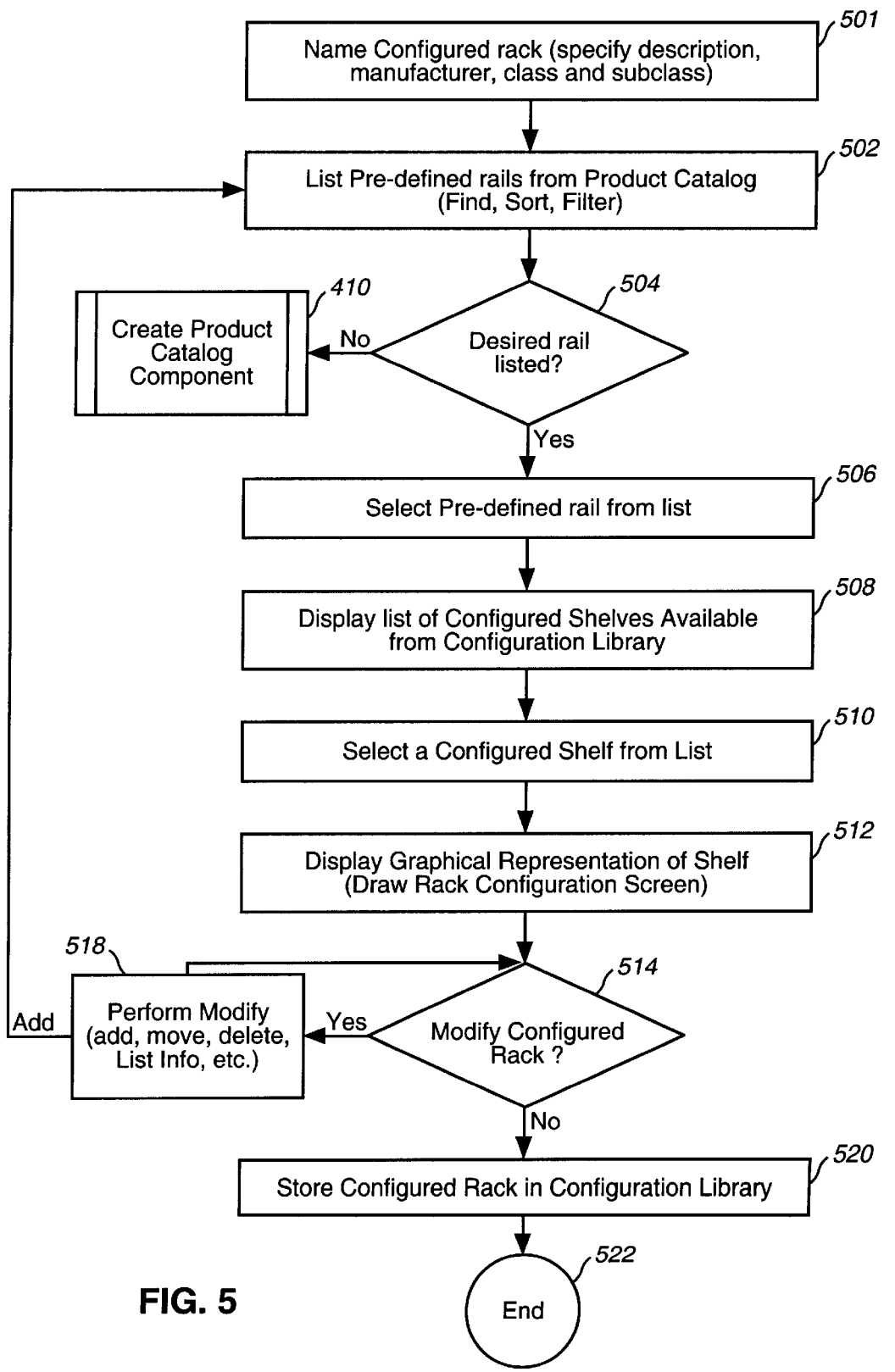
FIG. 5 is a flowchart depicting a process that can be used for creating a configured rack, according to a preferred embodiment of the present invention.

FIG. 5 is a flowchart illustrating a process which can be used to create a configured rack, according to a preferred embodiment of the present invention. The process begins with step 501. In step 501, the user specifies a name for the configured rack. In addition, required fields such as a description, a manufacturer, a class and a subclass are preferably specified in step 501. In step 502, a list of pre-defined rails from the product catalog 126 is presented to the user. In a preferred embodiment, sort, find and filter options are provided to assist the user in finding a particular rail from product catalog 126. In any case, the user is prompted to select a rail from the pick list presented in step 502.

As step 504 indicates, if the desired rail is included in the list presented in step 504, control passes to step 506, where the user selects the rail. If not, once again the user has the option to create a rail for the product catalog 126 as indicated by step 410.

If a rail is selected in step 506, control passes to step 508. In step 508, the user is presented with a list of the available configured shelves from the configuration library 128. In a preferred embodiment, only shelves that are compatible with the selected rail are presented. Further, as previously noted, in a preferred embodiment, only configured shelves having a status of approved standard or special will be presented in the list in step 508. Note that the configured shelves presented in the pick list in step 508 are shelves that have been configured according to the process depicted by the flowchart in FIGS. 4A and 4B, as previously described. In step 510, the user selects a configured shelf from the pick list presented in step 508.

In step 512, a graphical representation of the selected shelf and rail are presented to the user. This graphical representation is presented to the user so that the user can directly manipulate it to modify the configured rack as described below with reference to step 518. In step 514, the user has the option to modify the rack. As step 518 indicates, this includes for example, adding, moving and deleting shelves. In addition, the user can list information about the configured rack. As indicated by step 518, if the user wishes to add additional shelves to the rack, control passes to step 508, and steps 508–514 are repeated, as described above.

As stated above, in a preferred embodiment, users modify a configured rack in step 518, by directly manipulating the graphical representations of the selected shelves from step 512. For example, in one implementation, users "drag" graphical representations of the selected shelves to particular locations within the graphical representation of the selected rail.

After racks have been configured, for example, by using the process depicted by the flowchart in FIG. 5, they can be placed within a site. The explanation of how a site hierarchy is built and how graphical objects (such as racks) are placed within the hierarchy is presented in sections VIII and X below.

VII. A View of the Database

A. An Overall View of the Database

Figure 10A:
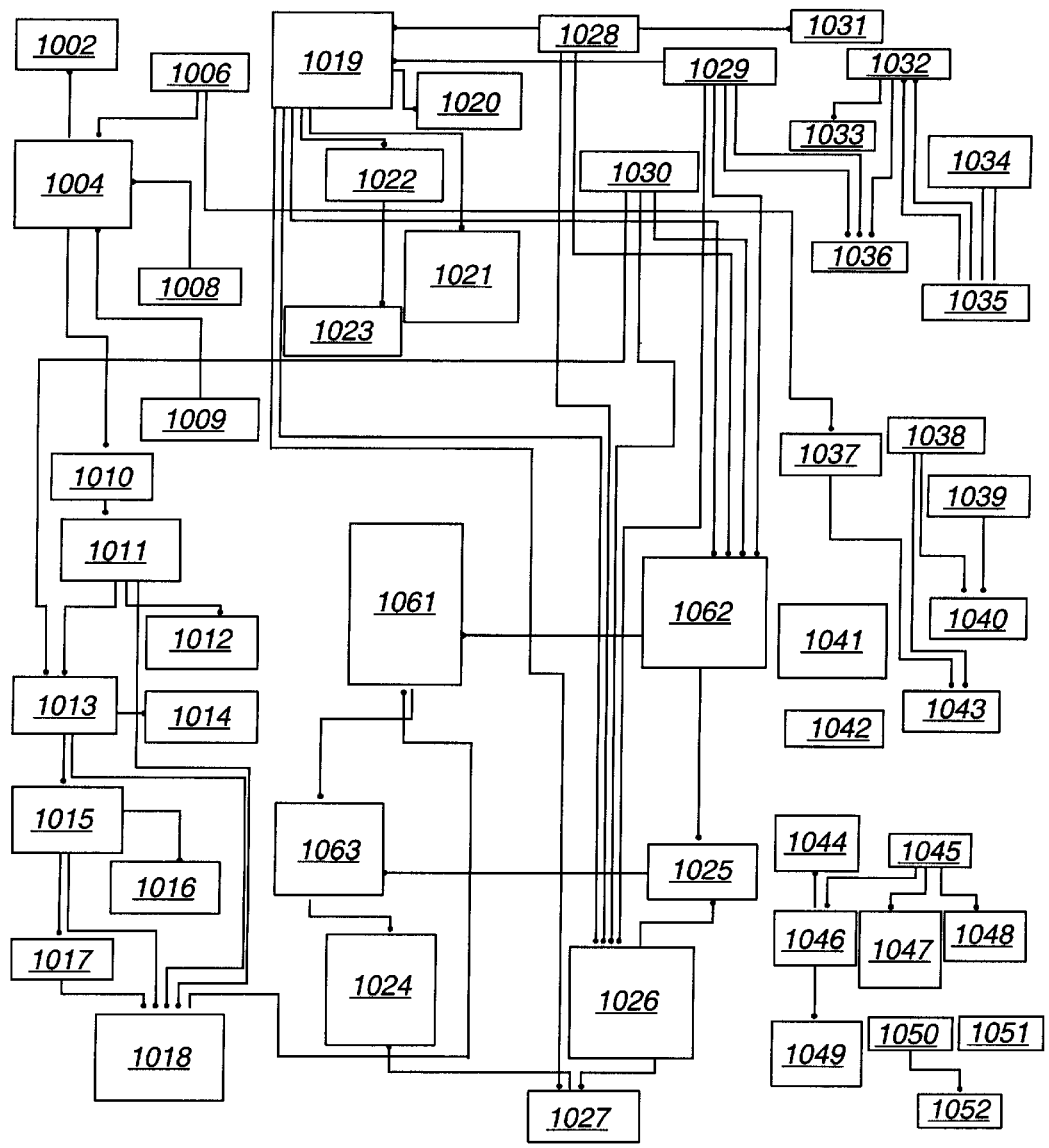
FIGS. 10A–10N are block diagrams illustrating a plurality of database tables that can be used to implement the database depicted in FIG. 1A, according to a preferred embodiment of the present invention.

FIG. 10A is a block diagram illustrating a plurality of database tables that can be used to implement the database 108, according to a preferred embodiment of the present invention. In this example of a preferred embodiment, a relational database is used to implement the database 108. However, in other embodiments, different types of databases can be used. An expanded version of the block diagram depicted in FIG. 10A is also depicted in the FIGS. 10C–10N. FIG. 10B shows how the FIGS. 10C–10N are related to each other to form the block diagram depicted in FIG. 10A.

B. Remote Sites, Power Plants, Responsible Departments, and States

Figure 10C:
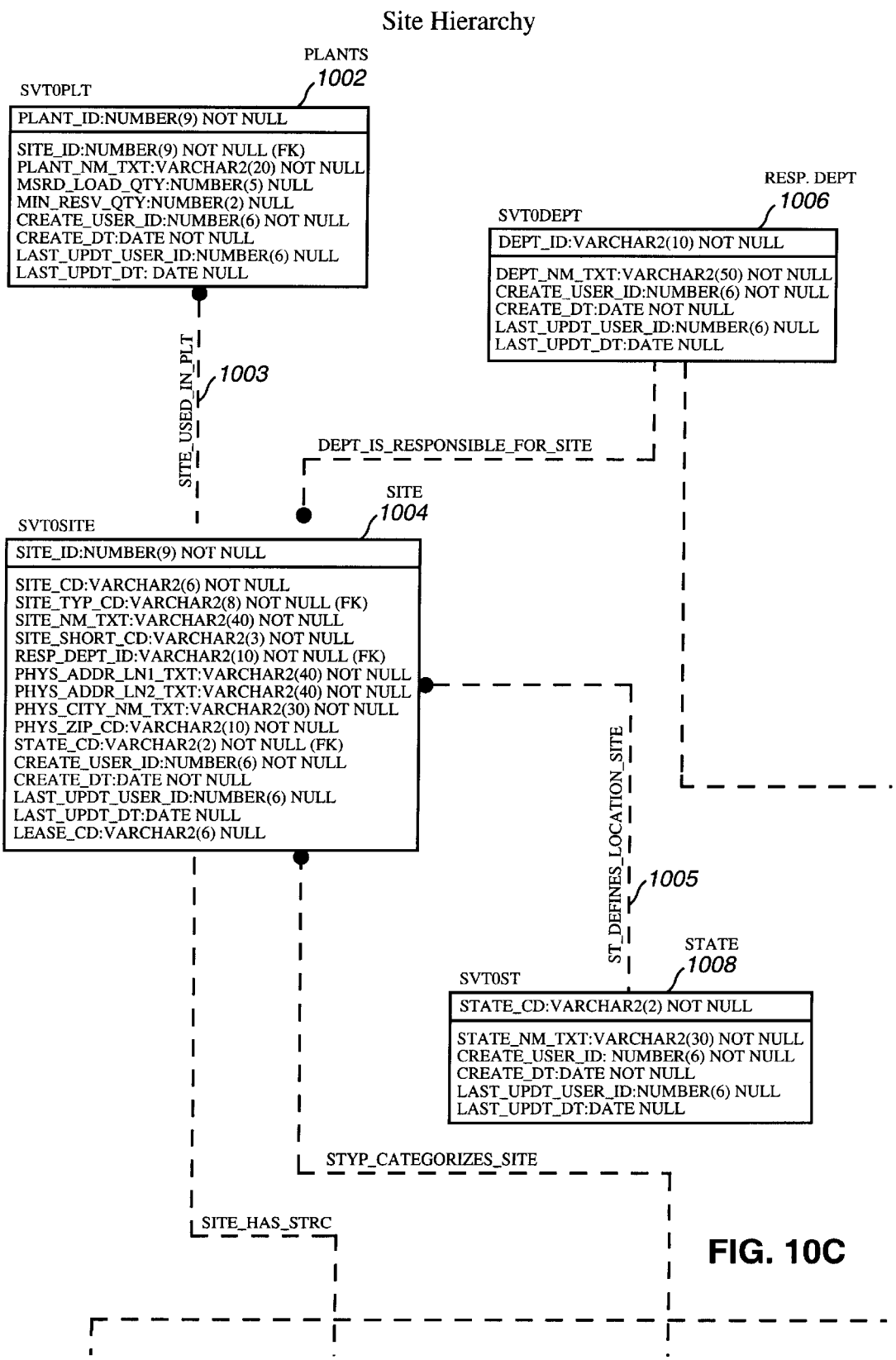

Referring now to FIG. 10C, the table 1004 represents remote sites in a portion of the database 108, referred to above as the site hierarchy repository. Each box, such as the box 1004, represents a specific database table. Accordingly, each database table comprises the names of specific data fields that are defined for each table according to a preferred embodiment of the present invention.

In this example, the names for each data field are descriptive of the type of data they represent. For example, the first three data fields in the site table 1004 are named "SITE_ID", "SITE_CD" and "SITE_TYP_CD", respectively. These three data fields hold information related to a site identification number, a site code and a site-type code, for each site stored in the site table 1004. As such, for the most part, by reading the descriptive names of the data fields illustrated in FIGS. 10C–10N, their function and purpose would be apparent to those skilled in the relevant arts.

Typically, data fields in a relational database 108, are conceptualized as columns in a database table. Likewise, the data entries that are stored therein are conceptualized as rows in a database table. Thus, the term row is used herein to describe a single data entry within a database table. Accordingly, the term row and the term entry are synonymous. For example, a single row (or entry) in the site database table 1004, represents data describing the details of a single remote site. A complete description of the remote site comprises, specific values for each of the data fields associated with the database table 1004. However, it is generally not necessary to provide values for every data field associated with a database table. This choice generally depends on each specific implementation of the present invention, which will typically define data fields as being either required or optional.

The lines interconnecting database tables shown in FIGS. 10C–10N represent relationships among tables. It should be noted that for the most part, the database tables shown in FIGS. 10C–10N are self-explanatory to those skilled in the relevant art(s). Accordingly, after reading the brief description below and examining FIGS. 10C–10N, it would be apparent to those skilled in the relevant art(s) how to implement the database 108, according to a preferred embodiment of the present invention.

As stated, interconnecting database tables shown in FIGS. 10C–10N represent relationships among the tables in the database 108. For example, a line 1003 is shown connecting the site table 1004 to the plant table 1002. In this example the plant table 1002 represents power plants that are installed in each site. The circle at the end of the line 1003 represents a one to many relationship between the rows in the site table 1004 and the rows in the plant table 1006. Accordingly, each entry in the site table 1004 may be associated with more than one entry in the plant table 1006. In other words, each site may have more than one plant installed therein.

The tables 1006 and 1008 represents pick list tables for specific data fields within the site table 1004. Specifically, the pick list tables 1006 are associated with data fields used to define a responsible department and a geographical state for a particular site listed in the table 1004.

In this example, pick list tables comprise a list of valid values that are used to fill-in particular data fields. A pick list table, such as the pick list table 1008, is used to assist in the data entry process. Typically, a pick list table is associated with one or more data fields. For example, the pick list table 1008 is associated with a data field "STATE-CD" within the table 1004 (as depicted by the dotted line 1005). Preferably, pick list tables are used during data entry to provide users with a drop-down list box, or the like, comprising textual representations of pre-defined values that can be specified for the row or rows, associated with the pick list table.

Accordingly, using the example described above, a pick list comprising states containing remote sites is presented to the user during a data entry phase. Preferably, after the user selects an item from the pick list (in this case the name of a state), the associated value is automatically entered stored in the associated row within the database table. Typically, in such cases, users are restricted to values contained in the pick list tables. That is, for such data fields that have pick lists associated with them, values other than those contained in the pick list may be considered invalid. However, this choice depends on particular implementations of the present invention.

C. Sites Types, Structures (Buildings), Floors, and Zones

Figure 10D:
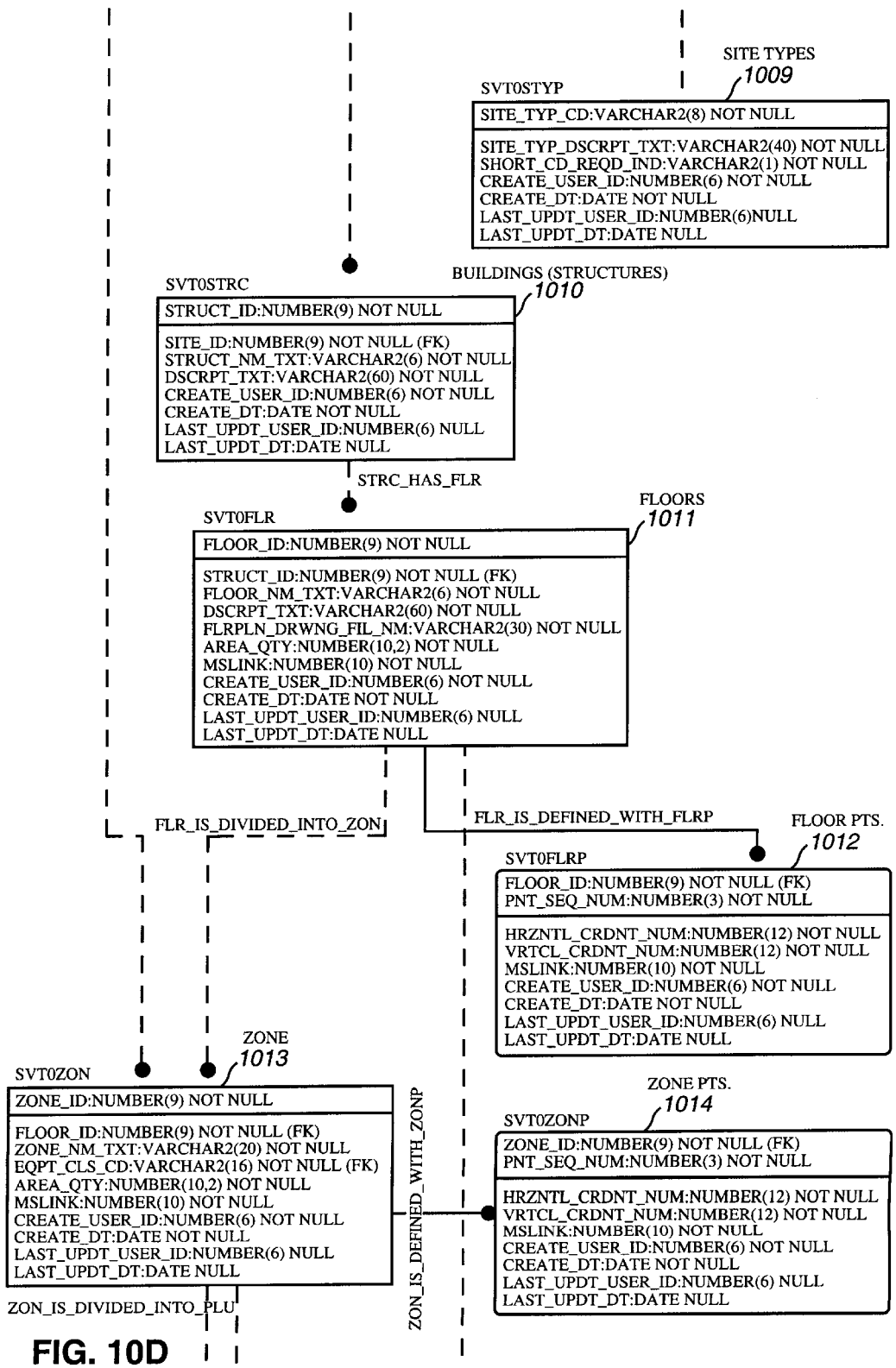

Referring now to FIG. 10D, table 1009 is a pick list table associated with the site table 1004 for providing valid values for the data field used to store site types. Table 1010 represents structures or buildings within sites. Typically, each site (represented by a single entry or row in the site table 1004), comprises multiple buildings that are each represented by a single entry in the building table 1010. Therefore, typically the building table 1010 comprises multiple rows for each row in the site table 1004.

The table 1011 represents floors within structures represented by table 1010. Typically, the floor table 1011 comprises multiple entries for each entry in the structure table 1010. The table 1012 represents floor points for the floors represented by the floor table 1010. This information is used in a preferred embodiment of the present invention for rendering graphical representations of floors, as described above. In one embodiment, each entry in the floor point table 1012 contains x-y coordinates for a portion of a polygon that is used to graphically represent the associated floor. Typically, the floor point table 1012 comprises multiple rows for each entry in the floor table 1011.

The table 1013 represents zones within floors represented by the floor table 1011. Typically, the zone table 1013 comprises multiple entries for each entry in the floor table 1011. The table 1014 represents zone points for the zones represented by the zone table 1013. This information is used in a preferred embodiment of the present invention for rendering graphical representations of zones. In one embodiment, each row in the zone point table 1014 contains x-y coordinates for a portion of a polygon that is used to graphically represent the associated zone. Typically, the zone point table 1014 comprises multiple entries for each entry in the zone table 1013.

D. Planning Units, Rows, and Row Segments

Figure 10E:
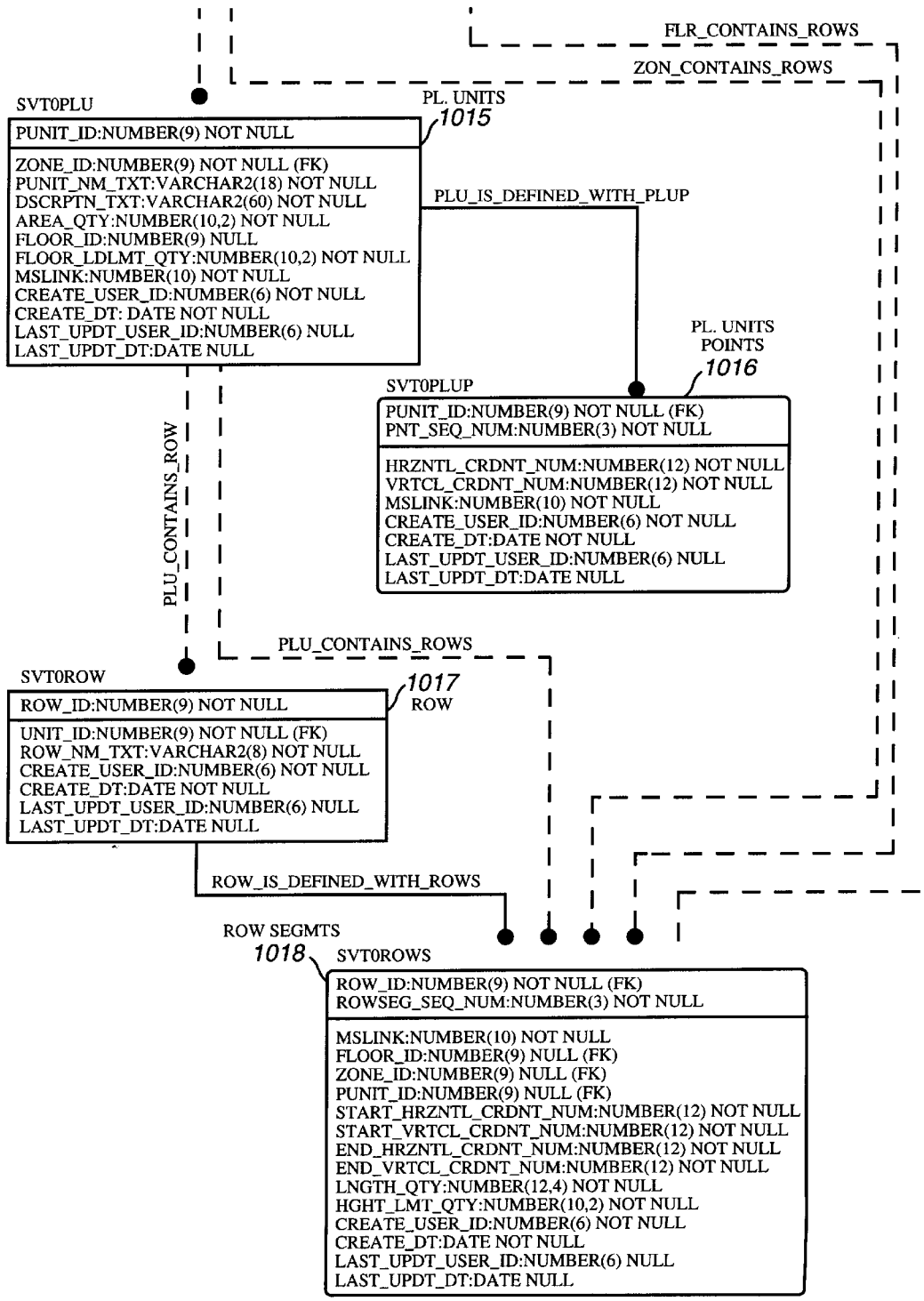

Referring now to FIG. 10E, the table 1015 represents planning units within zones represented by the zone table 1013. Typically, the planning unit table 1015 comprises multiple entries for each entry in the zone table 1013. The table 1016 represents points for planning unit table 1015. This information is typically used for rendering graphical representations of planning units. In one embodiment, each row in the planning unit point table 1016 contains x-y coordinates for a portion of a polygon that is used to graphically represent the associated planning unit. Typically, the planning unit point table 1016 comprises multiple entries for each entry in the planning unit table 1015.

The table 1017 represents rows within planning units. Typically, the row table 1017 comprises multiple entries for each entry in the planning unit table 1015. The table 1018 represents row segments within rows. Typically, the row segment table 1018 comprises multiple entries for each entry in the row table 1017. As will be shown below, configured racks are placed within row segments.

E. Product Catalogs, Shelves, Cards (Modules) and Rails

Figure 10F:
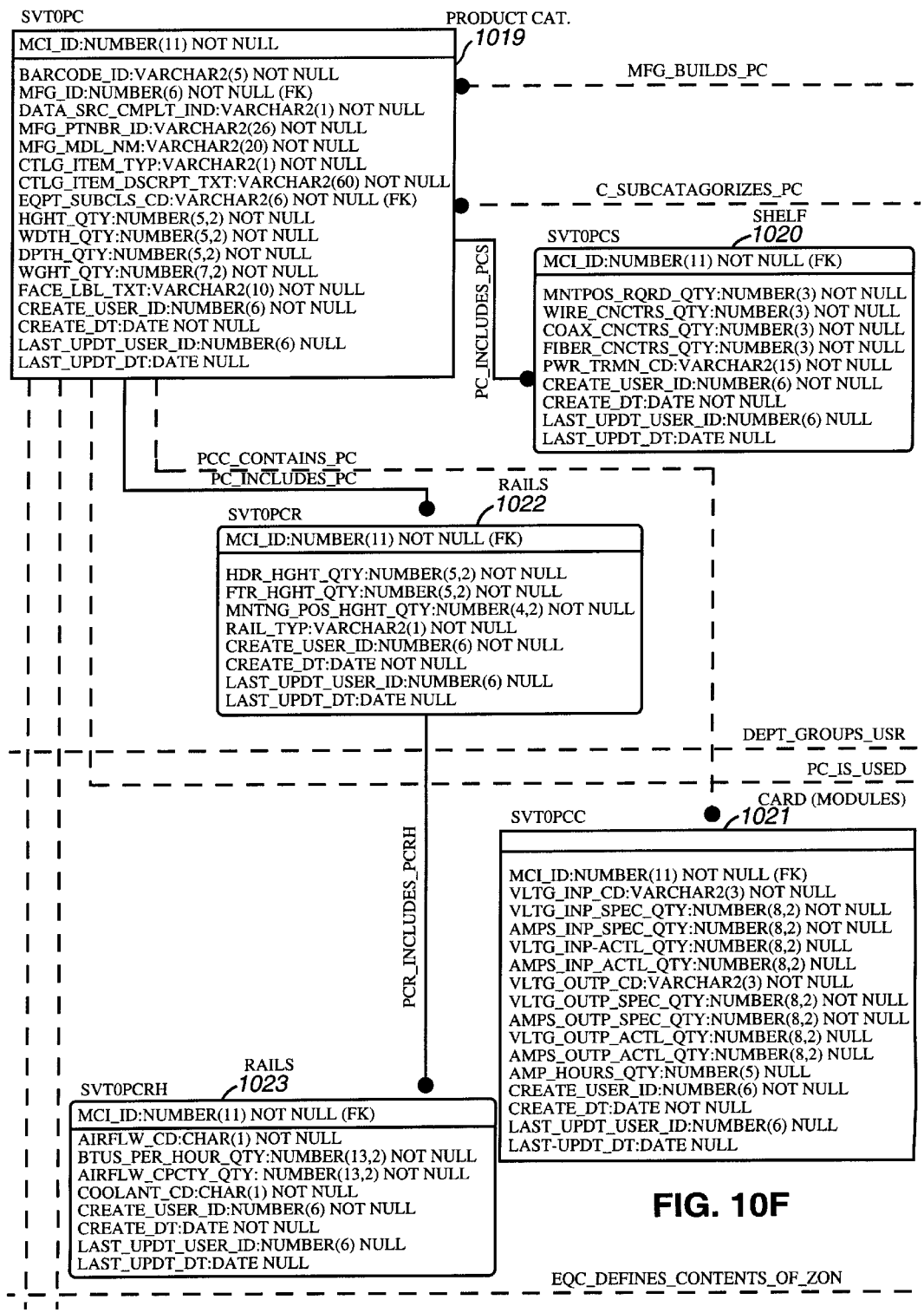

Referring now to FIG. 10F, the tables 1019–1023 is a portion of the database 108 referred to herein as the product catalog 126. Specifically, table 1019 represents components, such as modules, shelves and racks, as previously described. Data fields within the product catalog table 1019, preferably comprises detailed information about each component stored therein, such as a part number, a classification, and physical dimensions of the component. In a preferred embodiment, information common to all types of components is stored in the product catalog table 1019, and information specific to pre-defined component types are stored in the database tables 1020–1023.

For example, the shelf table 1020 represents additional information particular to shelf components. In this example, information such as the quantity of wire, coaxial and fiber connectors are stored in the shelf table 1020. The card table 1021 represents additional information particular to cards or module components. In this example, information such as actual and nominal electrical and power input and output requirements are stored in the shelf table 1020.

Likewise, the rail table 1022 represents additional information particular to racks, such as the dimensions of the rack header and rack footer areas. In addition, the HVAC rack table 1023 represents additional information about HVAC (heating, ventilation and air conditioning) racks. In this example, such additional information includes quantities for air flow, BTUs per hour, air flow capacity and coolant specifications.

Figure 10G:
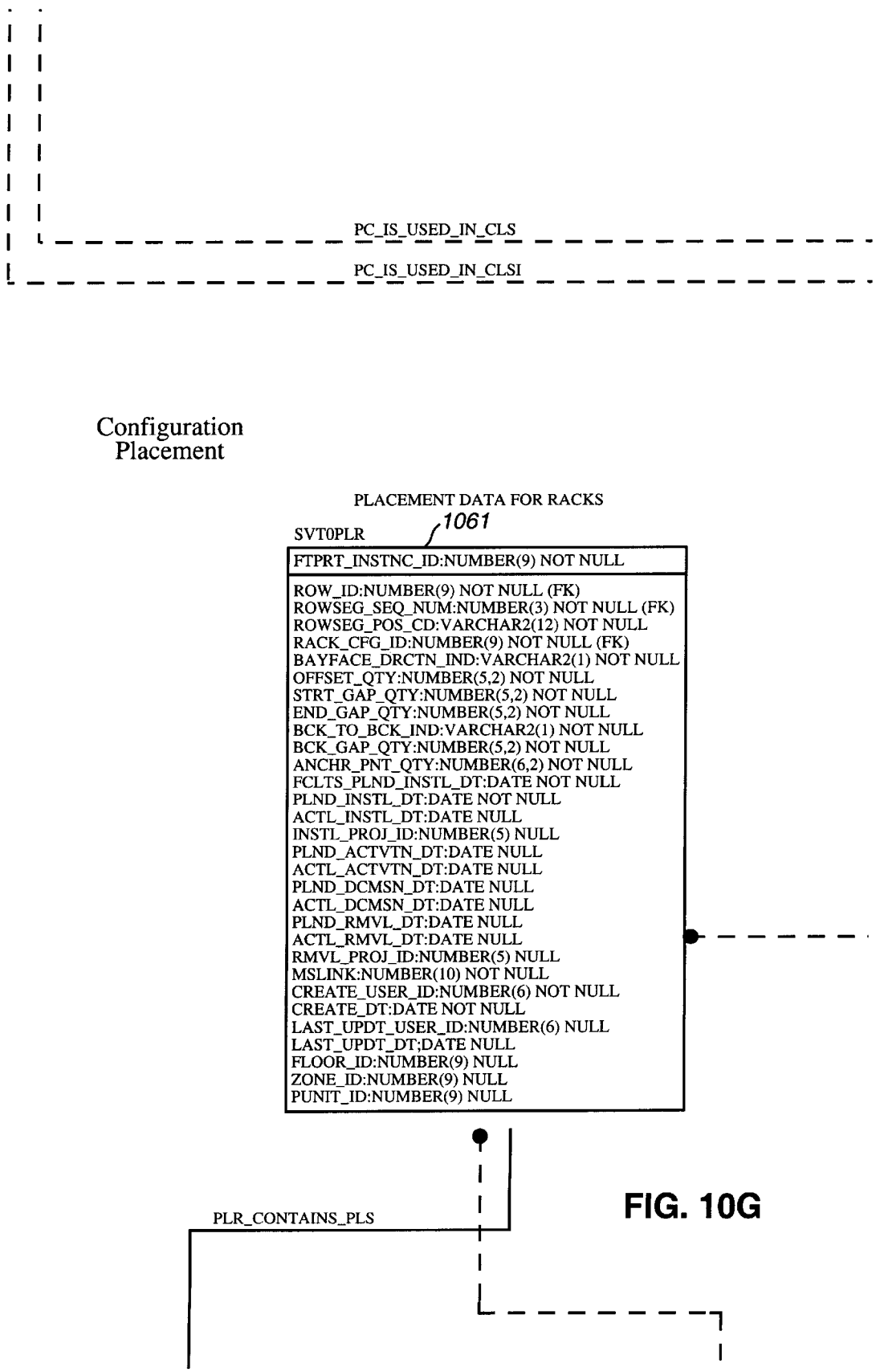
Figure 10H:
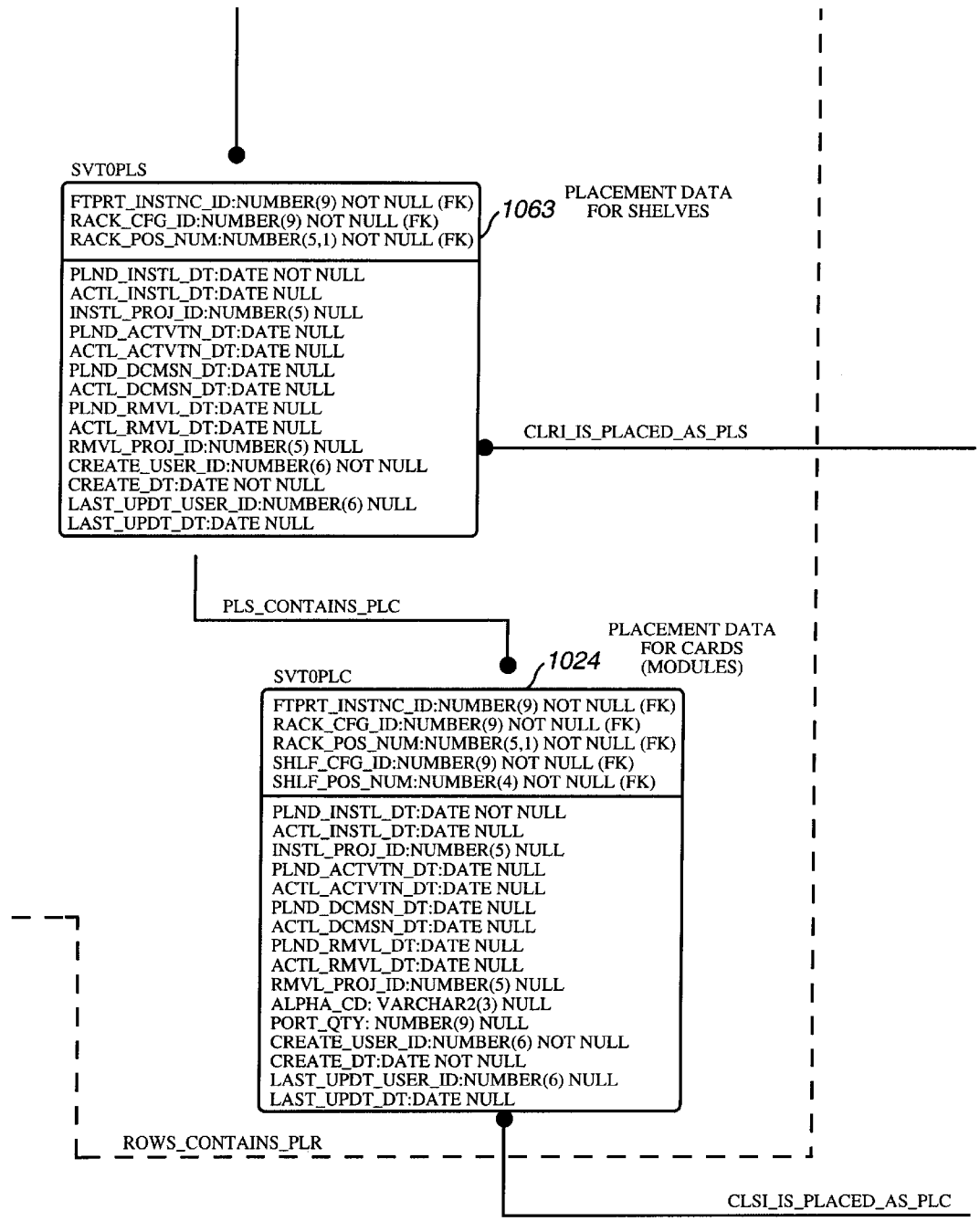

F. Placement Data for Racks, Placement Data for Shelves, Placement Data for Cards (Modules), and Configuration Racks The tables in FIGS. 10G, 10H, 10J, and 10K represent portions of the database 108 referred to herein as the configuration library 128, and portions of the database used to store footprint information as described above. Specifically, the portion of the database referred to herein as the configuration library 128 is primarily represented by the configured racks table 1062 (FIG. 10J) and the configured shelves table 1026 (FIG. 10K).

As shown by the interconnecting lines, both the (configured racks and the configured shelves table 1062 and 1026, respectively, are related to the product catalog table 1019. Specifically, as previously stated, configured racks and configured shelves are comprised of components (i.e. modules, shelves and racks), from the product catalog 1019, that have been interrelated. In a preferred embodiment, the interrelationships for configured racks and shelves are defined with the use of a rackface tool 112.

The configured rack item table 1025 (FIG. 10K) represents individual rack positions that are used to hold shelves, for each rack defined in the configured rack table 1062. In a preferred embodiment, configured shelves that are installed in particular rack positions are defined by the configured shelves table 1026. Accordingly, each entry in the configured shelves table 1026 can correspond with a single entry in the configured rack item table 1025. Note however, that entries within the configured shelves table 1026 can be associated with multiple entries in the configured rack item table 1025. This would be the case for example, if the same configured shelf is used in multiple rack positions in a single rack, or used in multiple racks.

The configured shelves item table 1027 (FIG. 10K) represents individual shelf positions that are used to hold modules for each shelf defined in the configured shelves table 1026. In a preferred embodiment, modules that are installed in particular shelf positions are defined by the product catalog table 1019. Accordingly, each entry in the product catalog table 1019 can correspond with an entry in the configured shelf item table 1027. It should be noted however, that in a preferred embodiment, each entry within the product catalog 1019 is typically associated with multiple entries in the configured shelf item table 1027.

A particular novel and advantageous feature of a preferred embodiment of the present invention is illustrated by the use of the placement library 130, as discussed above. Specifically, the placement library 130 comprises the placement data for racks table 1061 (FIG 10G), the placement dita for cards table 1024 (FIG. 10H) and the placement data for shelves table 1063 (FIG. 10H)1063. The placement data for racks table 1061 is used to place configured racks from the configured racks table 1062 in particular row segments within the row segment table 1018. In this example, one or more racks can be placed in a particular row segment. This feature is preferably implemented by creating a footprint using a placement tool as previously described above.

Preferably, specific data fields within the placement data for racks table 1061 are used for planning purposes. Such data fields ale used to define specific time-related events such as planned and actual installation, activation, decommission and removal dates. This allows site planners to view data related to the configuration and placement of equipment in remote sites on a time dependent basis. Moreover, a preferred embodiment of the present invention such information is provided at the rack, shelf and module level.

As described above, the placement data for rack tables 1061 provides such time dependant data for field equipment at the rack level. Similarly, the placement data for shelves table 1063, provides such time dependant data for field equipment at the shelf level. Likewise, the placement data for modules table 1024 provides such time dependant data for field equipment at the module level.

Accordingly, using this feature of the present invention, site planners and other groups can view data related to field sites on a time-dependant basis. Preferably, each card (or module), shelf and rack that is placed within a remote site will have planned and actual installation, activation, decommission and removal dates associated with it. In this manner, users for example, can view the configuration and placement of equipment within remote field sites at a particular past, present or further date.

G. Additional Pick List Tables

Figure 10I:
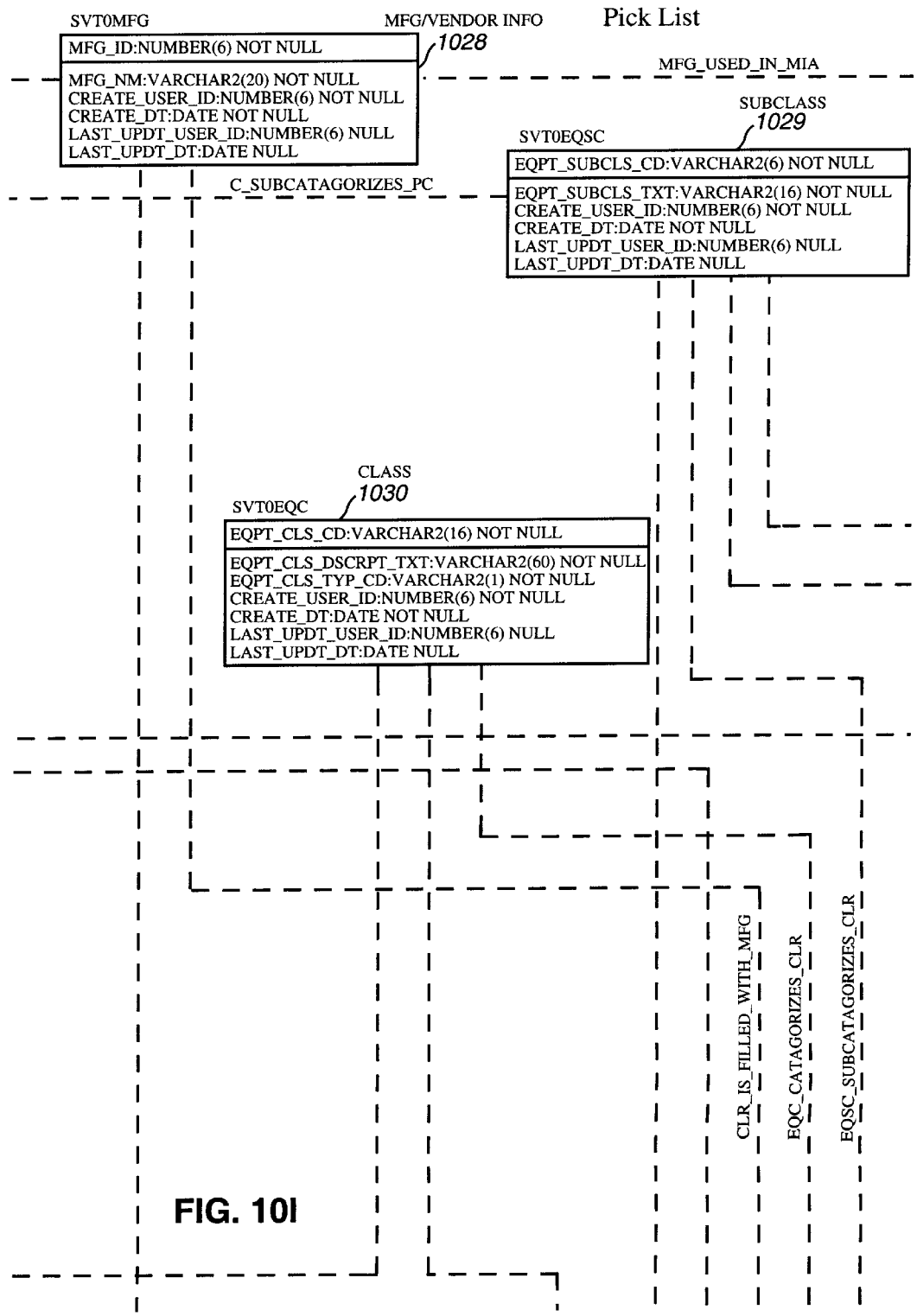
Figure 10J:
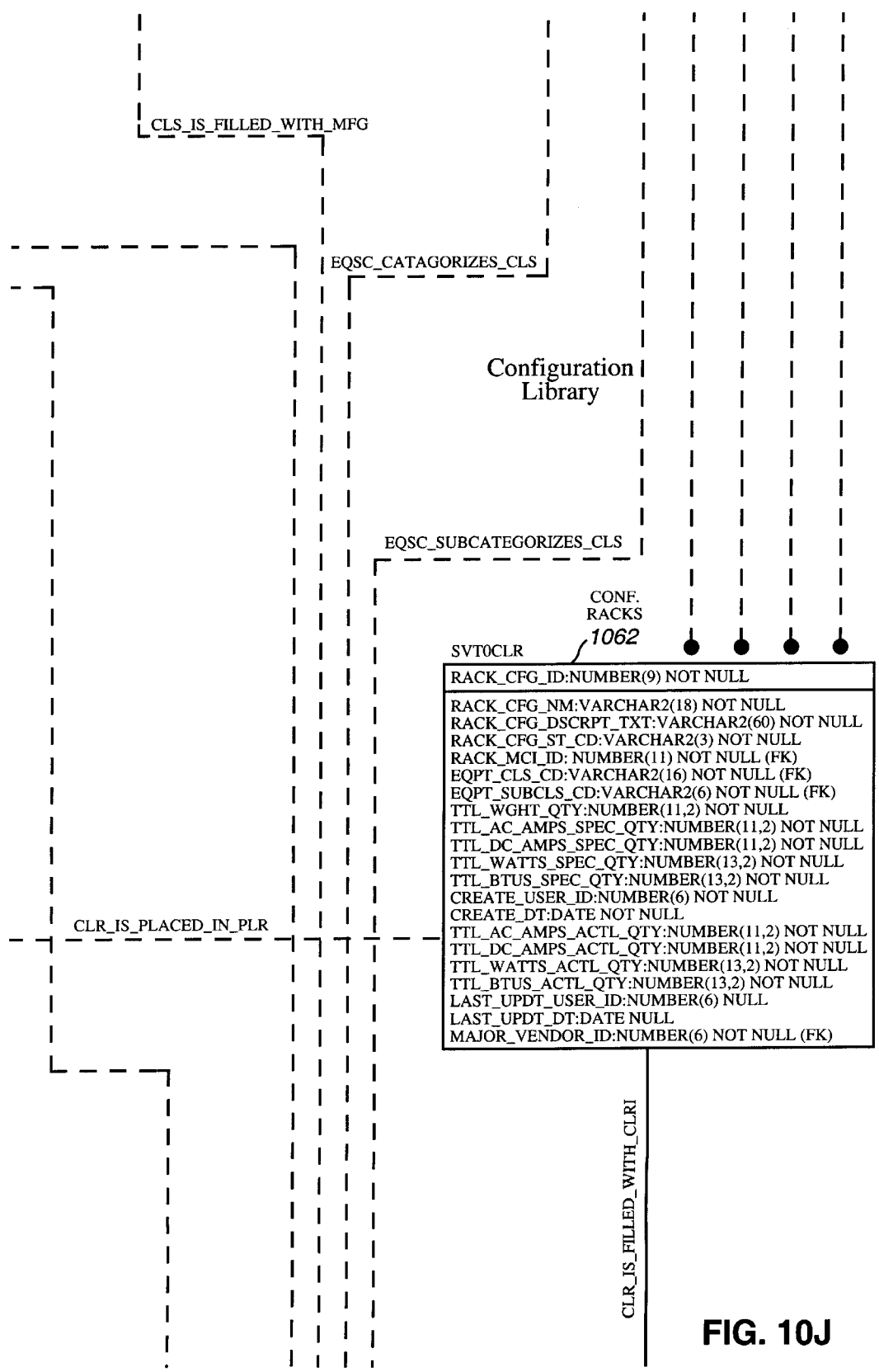
Figure 10K:
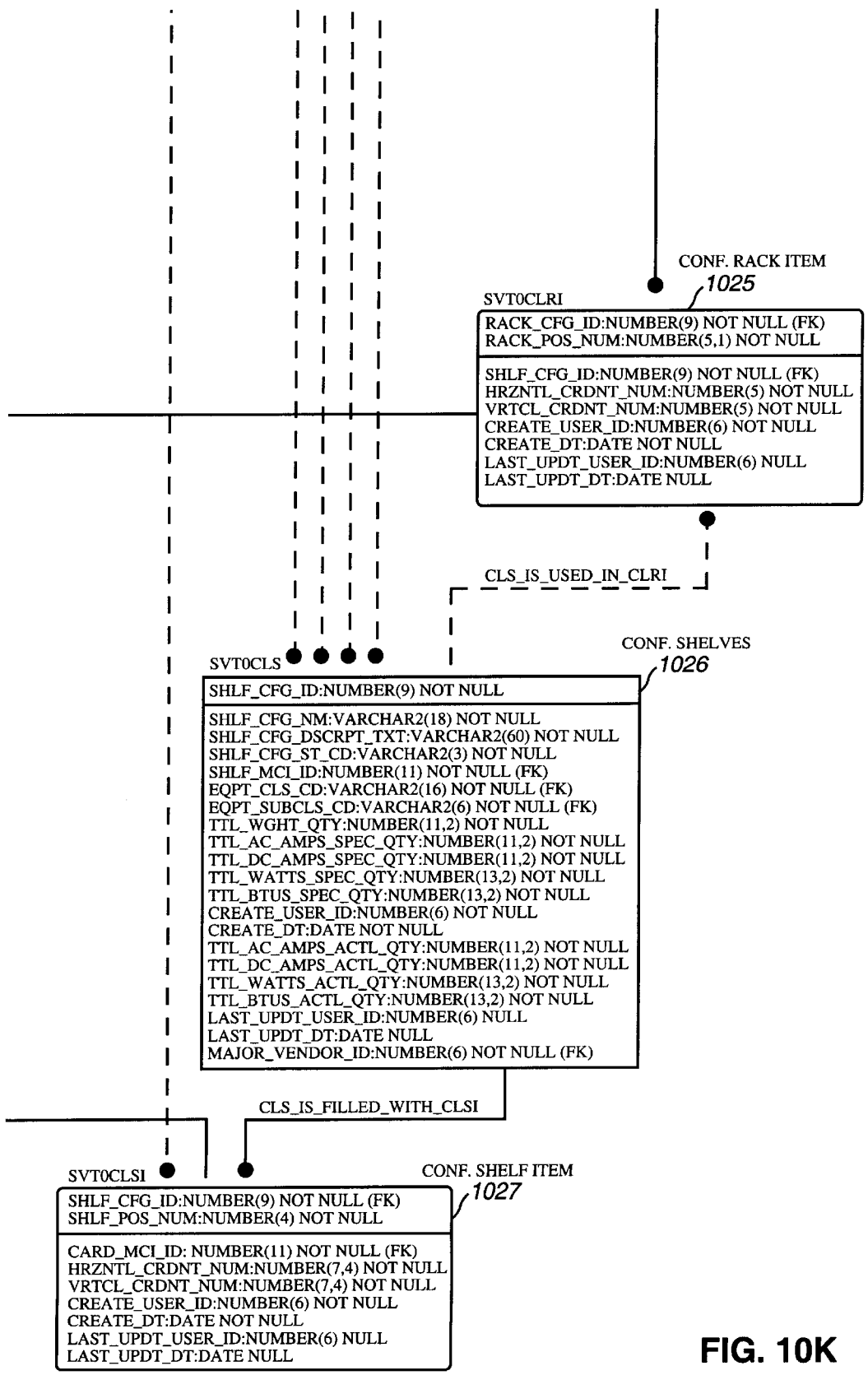

FIG. 10I comprises additional pick list tables from the pick list 134 portion of the database 108. Specifically, the vendor information pick list table 1028 comprises valid values used to describe pre-defined manufacturers. In this example, the vender information pick list table 1028 is associated with the product catalog table 1019, the configuration racks table 1062 and the configuration shelves table 1026. Similarly, the class pick list table 1030 is used to store pre-defined values used to describe equipment classes. In this example, the class pick list table 1030 is associated with the zone table 1013. the configuration shelves table 1026 and configuration racks table 1026. Likewise, the sub-class pick list table 1029 comprises pre-defined valid values used to describe equipment sub-classes. In this example, the sub-class pick list table 1029 is associated with the product catalog 1019, the configuration shelves table 1026 and configuration racks table 1026. In addition, in this example, the pick list tables 1028, 1029 and 1030 are associated with the connection tables as described below with reference to FIG. 10L.

H. Connection Tables

Figure 10L:
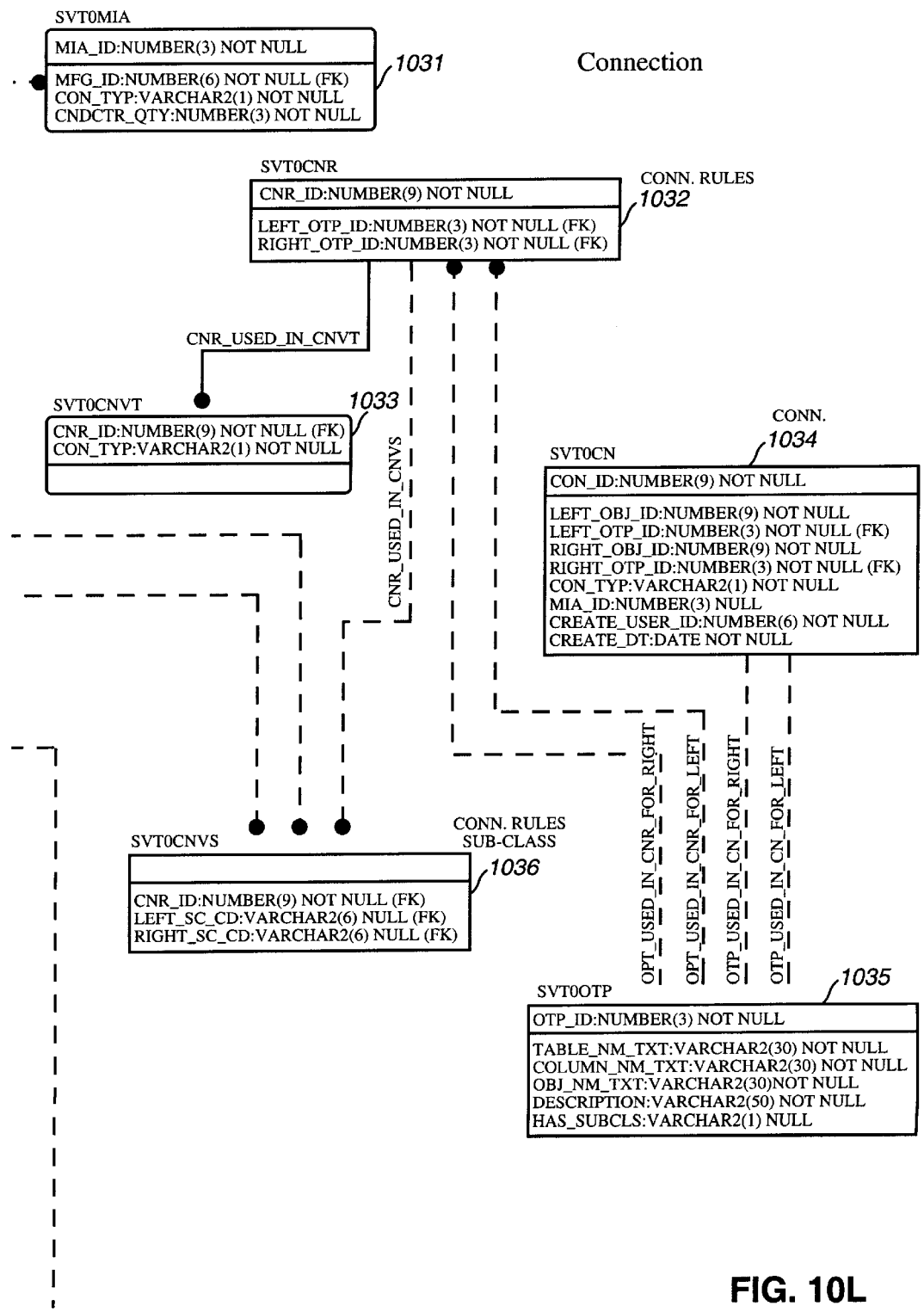

FIG. 10L comprises the connection portion 136 of the database 108. Specifically, the connection tables 1031–1035 are used to logically or physically connect one database entity with another database entity, without providing the details of the connection. For example, the connection 136 portion of the database 108 can be used to provide a logical connection between a power plant site hierarchy level and a particular footprint that draws power therefrom. In another example, the connection 136 portion of the database 108 can be used to provide a physical connection between a main power distribution bay and a particular footprint. The connection tables 1031–1035 are used in a preferred embodiment to define rules for connecting objects within the database 108 to one another. For example, the connection rules table 1032 defines what types of objects can be connected together. Similarly, the connection rules sub-class table 1036 defines what sub-classes of equipment can be connected together. The connection table 1034 is used to define what objects are connected together.

I. User Security Tables

Figure 10M:
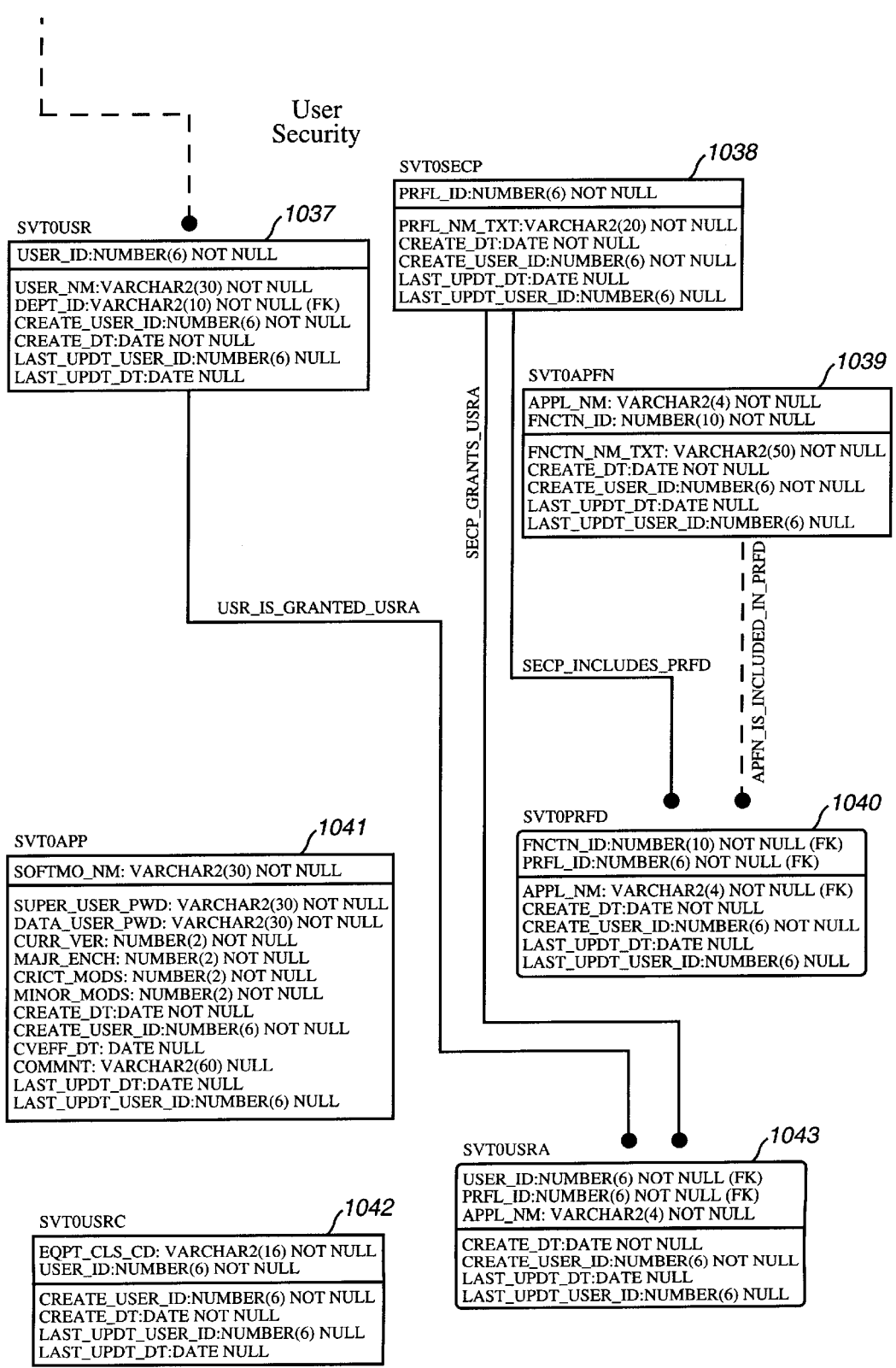
Figure 10N:
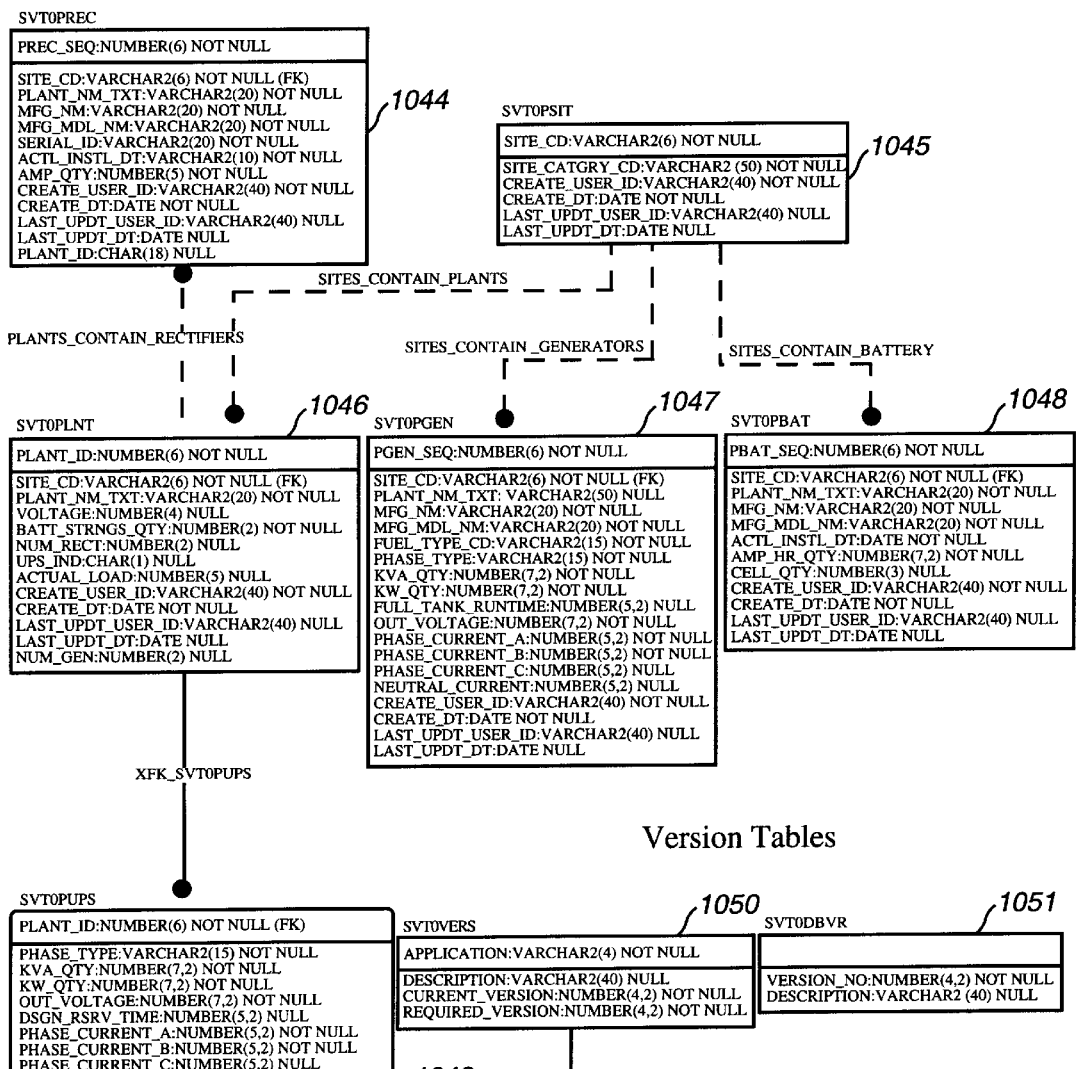
Figure 10N:
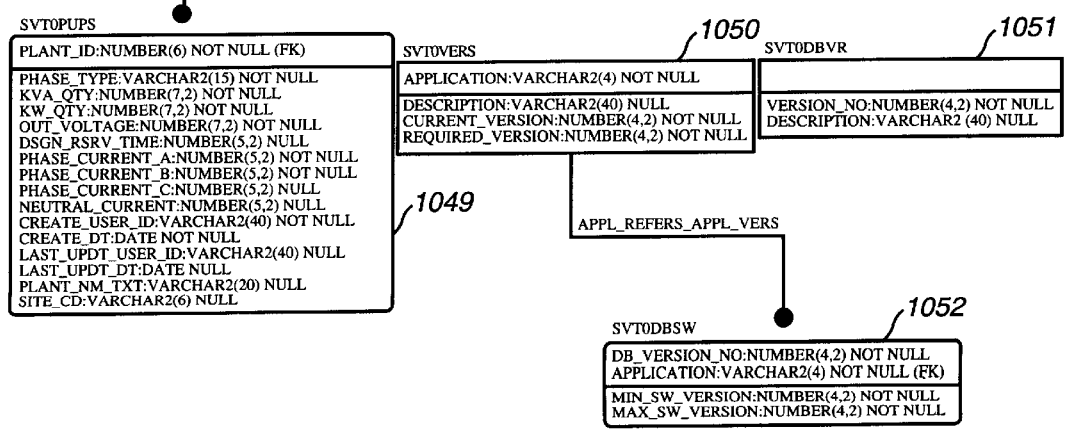

FIG. 10M comprises user security tables 1037–1043, that form the user security 132 portion of the database 108. These tables 1037–1043 are preferably used to control database access and the access to specific functions within SiteVu based on user identification. In the preferred embodiment the tables 1037–1043 describe which functions are allowed to be performed by which users. For example, in one embodiment, only users with a transmission rating are permitted to place transmission equipment in remote sites. Accordingly, such control may be implemented with the use of the user security tables 1037–1043 shown in FIG. 10M. The power tables 138 portion of the database 108, comprises the tables 1044–1052 shown in FIG. 10N are used for power planning as described below.

VIII. Creating the Graphical Objects for Sites, Structures, Floors, Zones, Planning Units and Footprints

A. Definition of a Footprint

A footprint is the union of an object, such as a configured rack as described above, and a specific location on the floor space. In other words, a footprint refers to the space or area occupied by a configured rack at a site. As will become apparent from the discussion presented below, the primary purpose of placement tool 116 is to create a plan, e.g. a five year plan, that describes a physical and environmental map of configured racks at a given site. The primary product of the placement tool 116 is the placement of footprints on the floor space.

B. The Administrative Tool Function in Establishing a Hierarchy

Referring to FIG. 1E, In the preferred embodiment, the Administrative tool 114 is software written in the "C++" language, running on a Windows® operating system, using a Windows® Application Programming Interface 115 to implement its functions on the workstation 104.

Before the placement of any graphical objects, such as floor graphical objects, zone graphical objects, planning unit graphical objects, row segment graphical objects, and footprint graphical objects, it is necessary to use Administrative tool 114 to establish a base site-structure-floor hierarchy in database 108. In this manner, at least a minimum amount of non-graphical (tabular) information must be established regarding the site-structure-floor hierarchy before any structures can be graphically represented. For example, in one embodiment the user must name a site (if the site does not exist), name a structure within the site, and name a floor within the structure. The Administrative tool 114 (1) creates site table 1004, structure table 1010, and floor table 1011 in database 108, as shown in FIGS. 10C, 10D, and (2) fills in the first fields for these tables, corresponding to the names of the tables, as described in sections X.A, X.B and X.C. The user can also fill in numerous other database fields, as described in these sections.

In addition, while using the Administrative tool 114, the user can associate with a site-structure-floor an accompanying architectural (also known as civil) drawing. An architectural drawing provides the architectural layout of the floor from an aerial (top) view, including the existence of columns that support the building, fire escapes, air vents, doorways and other entrances. In addition, the architectural drawings detail where required power cables provide power where HVAC units condition the air. Referring to section X.C.4, the name of the file containing the architectural drawing is stored in floor table 1011, as shown in FIG. 10D.

C. An Overview of the Placement Tool Function

In the preferred embodiment, the placement tool 116 is software running on a Windows® operating system. In a preferred embodiment, the placement tool 116 is implemented using the Microstation Development Language (MDL). MDL is a high level host language that Microstation incorporates for developing programs that interface with the CADD functions provided by the Microstation CADD program. For example, to allow a user to trace out a floor, or a zone, or some other type of graphical object, the placement tool 116 submits a corresponding MDL command, to instruct Microstation 117 to allow the user to render a graphical representation of the traced object on the output device.

In addition, placement tool 116 comprises software written for interfacing with database 108. Hence, when a graphical object is created and drawn by Microstation, placement tool 116 can update database 108 with specific information pertaining to the dimensions of the graphical object. For example, when a user creates or updates the graphical representation of a floor, placement tool 116 creates or updates non-graphical (logical) information into floor points table 1012, which is described in section X.D and shown in FIG. 10D. Therefore, the graphical information is stored in non-graphical (tabular) form, which is used to recreate the graphical representation of that information, so that a user can bring up and modify the floor at a future date.

In addition, the placement tool 116 allows the user to add numerous other pieces of information to database 108 that is generally not represented graphically. For example, referring to section X.C.6, floor table 1011 (shown in FIG. 10D) stores the date the floor object was created, the user who created the floor object, the last user who updated the floor object, and the last date the floor object was updated. As described below, all information in the site hierarchy is readily accessible to the user while using placement tool 116.

There are also functions performed by the placement tool 116 that combine the function of the CADD program 117 and database 108. For example, when a user uses the mouse to graphically lay out a floor, placement tool 116 uses Microstation 117 to calculate the area of the floor, and further uses database 108 to store this information. As described in section X.C.5, this information is stored in floor table 1011 as area quantity field 1011*f*.

The details of the placement tool 116 will become more apparent from the detailed discussion below.

D. Creation of Graphical Objects

Figure 7:
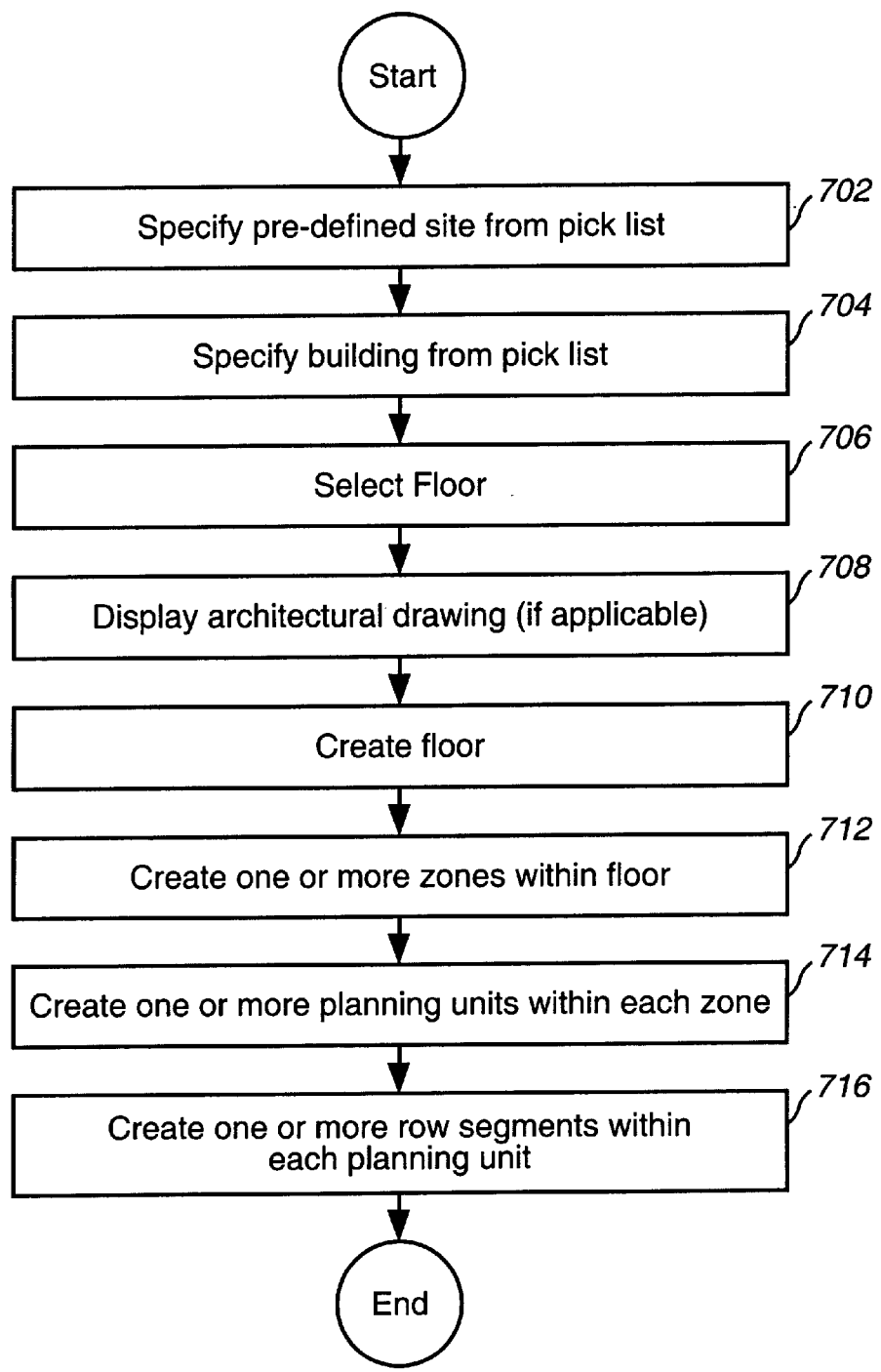
FIG. 7 is a flowchart depicting a process that can be used for creating a graphical site hierarchy, according to a preferred embodiment of the present invention.

FIG. 7 is a flowchart illustrating a process that can be used to define the graphical portions of a site hierarchy, according to a preferred embodiment of the present invention. This process is performed by the placement tool 116, according to a preferred embodiment of the present invention.

1. Selecting a Site

The process begins with step 702. In step 702, a user specifies a pre-defined site. This is preferably accomplished by selecting a site from a pick list of sites that have been defined via the administrative tool 114. The data related to the site is stored by the administrative tool 114 in the site hierarchy repository 124 of database 108. The data is specifically stored in site table 1004, as shown in FIG. 10C and explained in section X.A.

In should be noted that placement tool 116 can provide a security feature to prevent unauthorized individuals from creating and updating any type of graphical or non-graphical information. For example, when a user desires to add a graphical object to a site and selects a site from the pick list of sites, placement tool 116 can ensure that the user is authorized to access information about the site, by for example matching a user's department with the department responsible for the site. Use of the security measure is also available for determining whether an individual is authorized to create or update any other level in the hierarchy as well. For example, should a user desire to create a new floor object (as described below), placement tool 116 can require the user to be an authorized facilities planner responsible for creating the initial graphical site hierarchy. The placement tool 116 can also be configured to permit or deny users the ability to use certain functions of the tool. These functions are described below in detail.

2. Selecting a Structure

After a site is selected in step 702, control passes to step 704. In step 704, the user specifies a particular building. Again, this is preferably accomplished by having the user select a particular building that corresponds with the particular site selected from step 702, according to the site hierarchy repository 124. The data is specifically stored in structure table 1010, as shown in FIG. 10D and explained in section X.B.

3. Selecting a Floor

After a building is selected in step 704, control passes to step 706. In step 706, the user selects a particular floor corresponding to the building selected in step 704. Again, this is preferably accomplished by having the user select a floor that corresponds with the particular building selected from step 704, according to the site hierarchy repository 124. The data is specifically stored in floor table 1011, as shown in FIG. 10D and explained in section X.C. Control then passes to step 708.

4. Displaying an Architectural Drawing

In a preferred embodiment, as indicated by step 708, the user is presented with a graphical display of an architectural drawing of the floor that is selected in step 706. The architectural drawing is used as a guide to assist the user with the creation of the site hierarchy. Preferably, the CADD software (i.e., Microstation 117) renders the architectural drawing of the floor. For example, in a preferred embodiment, after the user selects a particular floor, placement tool 116 reads the name of the architectural drawing from floor plan drawing file name field 1011e, which is a field of floor table 1011, as described in section X.C.4 and shown in FIG. 10D. The placement tool 116 then directs the CADD program 117 to display the architectural drawing corresponding with the name fetched from the database 108.

It should be noted, however, that the use of architectural drawings as a guide and backdrop is optional. Users can define the floor, zones, planning units, rows and row segment, as described with reference to the steps below, without the use of an architectural drawing. For example, if the structure is a simple shed for storing telecommunications equipment such as light wave regenerators, the use of an architectural drawing may be unnecessary for a facility planner who desires to create a floor object. However, if the structure is a large brick and mortar (e.g., conventional building) facility for storing many rows of computing equipment, a facility planner can find the architectural drawing quite helpful. The architectural drawing can provide the facilities planner with necessary information, including the locations of columns that support the building, fire escapes, air vents, doorways and other entrances, power cables for providing electricity, and HVAC units conditioning the air, etc. The architectural drawing is also useful for the facilities planner for "tracing out" a useable floor space, as explained below.

5. Placing a Floor Object

As step 710 indicates, the user places a floor, which simply means that the user creates the graphical floor object in the site-structure-floor hierarchy. In the preferred embodiment, whether or not the architectural drawing is displayed, the user uses an input device (such as a mouse) to trace out a usable area in the floor space. The user, who is most likely a facilities planner, attempts to maximize the usable floor space to be allocated for placing equipment, while concurrently determining real-life limiting factors, such as the location of power cables for supplying power to the equipment, supplying sufficient ventilation to equipment, and providing ready human access to the equipment with sufficient entrance ways.

When the user traces out the usable space, placement tool 116 directs Microstation CADD 117 to show the floor space to the user graphically. In addition, placement tool 116 stores the traced out floor space in a non-graphical format as a sequence of points in database 108, specifically in the floor points table 1012, described in section X.D and shown in FIG. 10D.

Placement tool 116 performs other important functions as well. It directs Microstation CADD 117 to calculate the area of the usable floor space and stores it in database 108, specifically in the area quantity field 1011f, described in section X.C.4 and shown in FIG. 10D. Placement tool 116 also stores the identification of the user and the date the user created the floor object in database 108, as described in section X.C.6 and also shown in FIG. 10D. Placement tool 116 also provides the user the ability to store additional information regarding the floor object, or even to change existing information regarding the floor object, including the remaining fields of floor table 1011, as described in section X.C.

6. Placing a Zone Object

As step 712 indicates, the user places a zone (i.e., places a zone object in the hierarchy), which is the next level in the hierarchy. Zones provide an important functional distinction between classes of equipment, meaning that a facilities planner can restrict a zone to one class of several possible classes of equipment. The classes available are restricted only by the imagination of the facilities planner. In some applications, a facilities planner may provide very narrowly tailored zones such as restrictions between particular pieces of telecommunications equipment, while in other applications a facilities planner can distinguish between widely tailored classes such as between computer racks and pieces of furniture. At this level, the ability of the facilities planner to provide a proper balance between providing a maximum amount of usable floor space and taking into consideration limiting real-life considerations pertaining to the architecture of the building are even more important. As a crude example, if a facilities planner has to place furniture equipment in furniture equipment zones, and functioning processors in processor zones, the planner would be concerned with providing adequate power supplies to the latter and not the former. Consequently, the processor zones can be located within adequate reach of power supply cables. The allowed class of equipment is stored in equipment class code field 1013d of zone table 1013, which is described in section X.E.4 and shown in FIG. 10D. It should be noted that in a preferred embodiment the class of equipment must be a permitted class, as defined and stored in table 1030 (FIG. 10I); otherwise, the class is not permitted.

As with floor objects, the user traces out zones using the placement tool 116, which in turn directs Microstation CADD 117 to display the zones on the display of workstation 104. The placement tool 116 stores the traced out zone space in a non-graphical format as a sequence of points in database 108, specifically in the zone points table 1014, described in section X.F and shown in FIG. 10D.

Placement tool 116 directs Microstation CADD 117 to calculate the area of the usable zone space and stores it in database 108, specifically in the area quantity field 1013e, described in section X.E.4 and shown in FIG. 10D.

Placement tool 116 stores the identification of the user and the date the user created the zone object in database 108, as described in section X.E.6 and also shown in FIG. 10D. Placement tool 116 also provides the user the ability to store additional information regarding the zone object, or even to change existing information regarding the zone object, including the remaining fields of zone table 1013, as described in section X.E.

7. Placing a Planning Unit Object

As step 714 indicates, the user places a planning unit (i.e., places a planning unit object in the hierarchy), which is the next level in the hierarchy. In a preferred embodiment, planning units provide the opportunity for more than one facility planner to place row segments in a given zone. In this embodiment, when a user is in the process of defining rows and placing row segments 308, via the placement tool, other users are prevented from accessing certain portions of site hierarchy repository 124. In particular, when users are defining rows, the site hierarchy level just above the row level must be locked. Thus, a site hierarchy level of planning unit 306 is used between the row level 308 and zone level 304. Accordingly, planning unit 306 is locked from other users instead of the zone level 304. In this manner, several users can work simultaneously to define row segments 308 within the same zone 304. Planning units are optional, however, and as a result a zone need not contain more than one planning unit.

As with other objects, the user traces out planning units using the placement tool 116, which in turn directs Microstation CADD 117 to display the planning units on the display of workstation 104. The placement tool 116 stores the traced out planning unit space in a non-graphical format as a sequence of points in database 108, specifically in the planning unit points table 1016, described in section X.H and shown in FIG. 10E.

Preferably, the placement tool 116 is used so that the user can identify the maximum amount of weight a floor can withstand, specifically in the floor load limit quantity field 1015$g$, described in section X.G and shown in FIG. 10E. In this manner, it is possible to prevent floor damage by preventing the placement of equipment weighing more than a given amount in a planning unit.

Placement tool 116 directs Microstation CADD 117 to calculate the area of the planning unit and stores it in database 108, specifically in the area quantity field 1015$e$, described in section X.G.4 and shown in FIG. 10E. Placement tool 116 stores the identification of the user and the date the user created the planning unit object in database 108, as described in section X.G.6 and also shown in FIG. 10E. Placement tool 116 also provides the user the ability to store additional information regarding the planning unit object, or even to change existing information regarding the planning unit object, including the remaining fields of planning unit table 1015, as described in section X.G.

8. Placing a Row and Row Segment Object

As step 716 indicates, the user places a row in the hierarchy. A row is a designation of a physical row. Rows are not represented graphically, but are instead represented logically (non-graphically). The reason for this is that physical rows may be discontinuous because of physical separations between the row, such as for example a support column. As described in section X.I and shown in FIG. 10E, the placement tool 116 stores in database 108 an identification for the row, a textual name of the row, which can simply be a number, and information relating to who created the row and when that person created the row.

The user can place a row segment object, which is the next level in the graphical hierarchy. The row segment, as its name implies, breaks up the physical row into segments so that one or more row segments comprise a physical row.

As with the other objects, the user traces out row segments using the placement tool 116, which in turn directs Microstation CADD 117 to display the row segments on the display of workstation 104. The placement tool 116 stores the traced out row segment space in a non-graphical format as a sequence of points in database 108, specifically in the row segment table 1018, described in section X.J and shown in FIG. 10E.

The user can identify, via the placement tool 116, the maximum height of an equipment placed in a row segment in the height limit quantity field 10181, described in section X.J and shown in FIG. 10E. Placement tool 116 directs Microstation CADD 117 to calculate the length of the row segment and stores it in the length quantity field 1018$k$, which is described in section X.J.7. Placement tool 116 also stores the identification of the user and the date the user created the row segment object in database 108, as described in section X.J.9. Placement tool 116 also provides the user the ability to store additional information regarding the row segment object, or even to change existing information regarding the row segment object, including the remaining fields of row segment table 1018, as described in section X.J.

9. Placing a Footprint

After the site, structure, floor, zone, planning unit, row and row segments have been established in the hierarchy, the user can place a footprint, which is the union of a piece of physical equipment with floor space. Footprints represent the lowest level of the hierarchy and provide the greatest level of detail.

Figure 8:
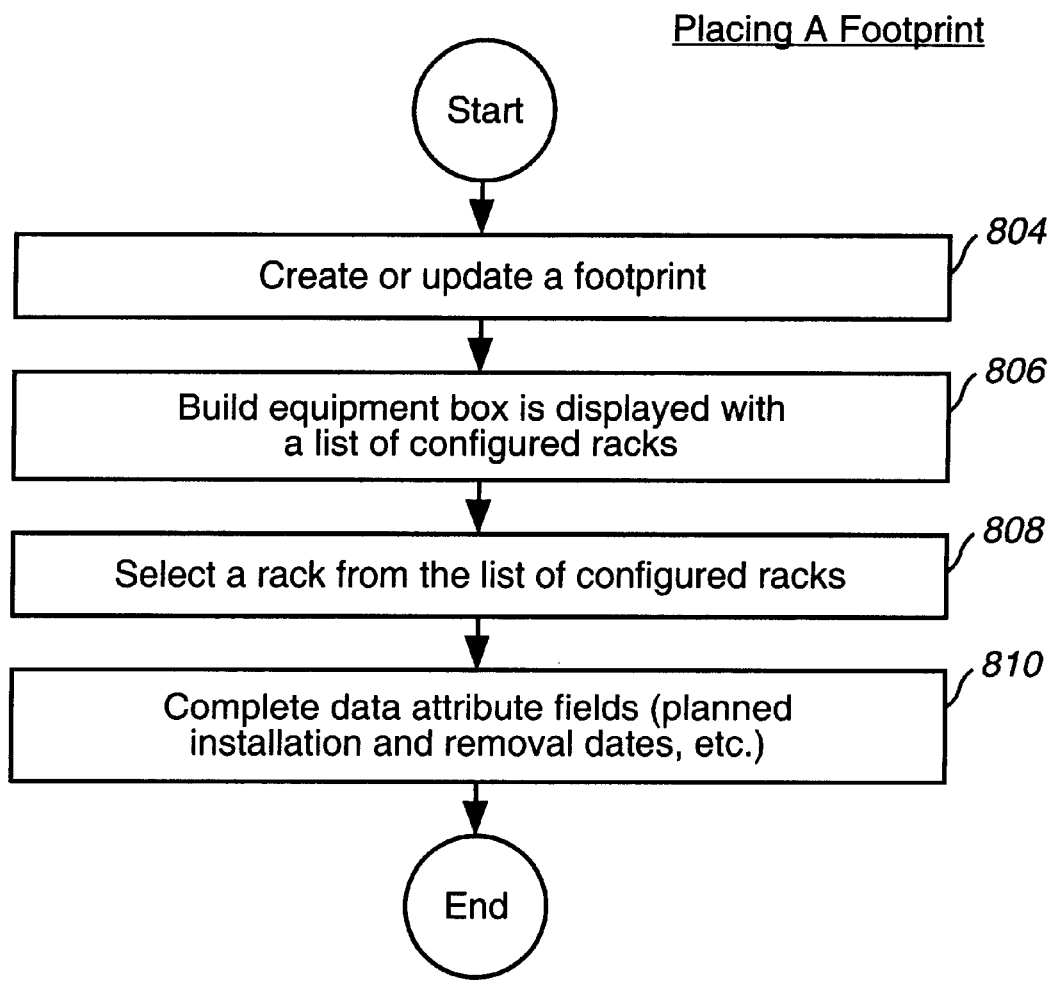
FIG. 8 is a flowchart depicting a process that can be used for placing a footprint, according to a preferred embodiment of the present invention.

FIG. 8 is a flowchart illustrating a process that can be used for placing footprints, according to a preferred embodiment of the present invention. The process begins with step 802.

In step 804 the user (1) creates a footprint, if a footprint does not already exist, or alternatively (2) updates a footprint, if a footprint already exists.

As user can place either a generic footprint or a specific footprint. A generic footprint is a placeholder for a footprint that will likely later be designated a specific footprint. A generic footprint is a footprint for a configured rack that has an unspecified manufacturer's identification field. For example, the manufacturer's identification field (found in the product catalog table 1019, shown in FIG. 10F) for the configured rack (found in the configured rack table 1062, shown in FIG. 10J) can be set to "generic." On the other hand, a specific footprint is a footprint for a configured rack that specifies a valid manufacturer's identification field. The U.S. Patent Application entitled "System and Method for Recording, Maintaining and Viewing Configuration and Placement of Equipment in Field Sites", listed above and filed concurrently herewith, provides a detailed discussion of generic and specific footprints.

The placement tool 116 automatically determines the size of the footprint that Microstation 117 is directed to display. As described below in detail, the placement tool 116 provides the user a list of configured racks to choose from. When a user selects a configured rack that is to be placed, the placement tool 116 accesses the configured racks table 1062 (FIG. 10J), which in turn accesses other tables (e.g., product catalog table 1019 shown in FIG. 10F and configured shelves 1026 in FIG. 10K) to determine the dimensions of the footprint that is to be placed.

If an existing footprint is being updated, most likely by an individual having placement responsibility at a facility, the user can first fetch all of the graphical objects that are higher in level. For example, the user can select a site, followed by a building (or structure), followed by a floor 302, followed by a zone 304, and followed by a planning unit 306. The placement tool 116 also allows the user to bring up all these levels simultaneously when the user performs a "fetch all" function.

Preferably, the user is provided with an option to display particular site hierarchies, or all site hierarchies that are defined for a particular floor. In addition, in a preferred embodiment once the site hierarchies are graphically displayed, the user can directly zoom-in a particular portion of the graphical representation and select a particular row therein. Accordingly, the steps of selecting a zone and planning unit, as specified above are effectively bypassed using this method. However, many other methods can also be used without departing from the spirit and principle of the present invention.

In any case, once a particular row is identified, control passes to step 806. In step 806 a build equipment pick list is presented to the user. This pick list comprises a list of configured racks 202, as described above with reference to FIG. 5. The configured racks are stored in the configured racks table 1062 in FIG. 10J, and are referenced in the rack configuration identification field 1061e, which is described in section X.K.5 and shown in FIG. 10G. In addition, as previously described, generic racks can also be displayed in the equipment pick list. The user selects a rack from the list of racks presented in step 806. Preferably, a configured rack can be a rack holding electrical equipment as particularly laid out in FIG. 2, or instead any other physical object, such as a piece of furniture, as will be recognizable to those of ordinary skill. The user is provided great flexibility in how the configured racks fields are filled out in configured racks table 1062.

Next, in step 808, the user places the selected configured rack from step 806 in a particular location within the row selected in step 804. At this point, placement tool 116 stores the identify of the configured rack in the rack configuration identification field 1061e. Again, this is preferably accomplished by directly manipulating a graphical representation of the rack on top of the graphical representation of the selected row segment.

Once the rack is placed in step 808, control passes to step 810. In step 810 the user specifies particular values for attributes that are associated with footprints. As mentioned, the footprint can be a generic footprint or a manufacturer specific footprint. As described in section X.K and shown in FIG. 10G, there are many fields that a user can specify for the equipment occupying the footprint, including how the equipment is configured, the envelope of distances surrounding the equipment, and numerous dates. Examples of important dates are when the facilities planners plan to install the equipment, when an individual responsible for installation plans to install the equipment, the actual installation date, when the equipment will be turned on (for equipment requiring a power supply), when the equipment will be decommissioned, etc. Section X.K provides a detailed explanation of the footprint fields in great detail. The values in the footprint fields can also be updated at any time by the user after the values have been initially established. The footprint fields can also be viewed or deleted, as described below in further detail.

E. Fetching Objects

After the placement tool 116 has directed Microstation 117 to create graphical objects, these objects are stored as non-graphical data in database 108. Any time a user desires to view a previously-created object, the user uses the fetch command to view one or more layers of the hierarchy. For example, after identifying the floor (located at a particular building at a particular site), the user can ask the placement tool 116 to fetch the floor object, followed by the zone objects, followed by the planning unit objects, followed by the row segment objects, followed by the footprint objects. Here, the placement tool 116 reads the appropriate tabular representation of graphical points from database 108 and uses Microstation 117 to draw the objects on the workstation output device. In one embodiment, the user uses the "fetch all" function to have the placement tool display all of the graphical objects on a floor. As recognized by those of ordinary skill, the placement tool 116 can recall the graphical objects in any order, as desired for an application.

F. Deleting Objects

The placement tool 116 permits the user to quickly and easily delete any graphical object, including floor objects, zone objects, planning unit objects, row segment objects, and footprint objects. Placement tool 116 erases the graphical points from the appropriate points tables in database 108, and provides appropriate commands to Microstation CADD 117 to eliminate the on-screen display of an object for the user. In one embodiment, the placement tool 116 can prevent a user from deleting a graphical object if an ancestral graphical object is present. For example, a user can be forbidden from deleting a row segment if a row segment is occupied with footprints.

G. Object Detail

The placement tool 116 permits the user to obtain specific details for any object. As shown throughout section X, there is a tremendous amount of information stored for the objects of the hierarchy (i.e., the hierarchy of site, structure, floor, zone, planning unit, row, row segment, and footprint) in the tables shown in FIGS. 10C–10E, 10G and 10J. Much of this information is in the form of tabular (non-graphical) data, that can not be presented graphically, but can have enormous importance to an organization. For example, a user may desire to view the planned installation date for a piece of equipment occupying a given footprint. When a user selects the object detail function, placement tool 116 can immediately read any desired information from database 108 and use Microstation CADD 117 to output the information to the viewer's display. For the above example, placement tool 116 reads planned installation date 1061n (described in section X.K, and shown in FIG. 10G) and displays the information for the user.

H. Object Locate

The placement tool 116 permits user to quickly and easily locate objects by keying in on specific information stored as tabular information in database 108. For example, placement tool 108 can almost instantaneously allow the user to determine all footprints storing a particular type of equipment, such as an M13 multiplexer. When a user selects the object locate function, placement tool 116 can immediately read any desired information from database 108 and use Microstation CADD 117 to show the graphical objects associated with the desired information on the viewer's display. This information can be provided to the user in a report, using the report generator tool 119 shown in FIG. 1G.

I. Power Plant Associations

The placement tool 116 allows the user to associate a specific source of power, called a power plant, to a footprint. The user can use an input device, such as a mouse, to easily effect the association on the workstation 104. The main portions of the above description of footprint placement refers to the placement of "power consuming footprints," i.e., the placement of footprints of power consuming device, such as a multiplexer for example. However, the placement tool 116 also permits the user to place "power producing" footprints. For example, in one embodiment a describe plant function allows a user to graphically select footprints representing, for example, batteries and rectifiers, for inclusion in a power plant's power producing footprint definition. Since both power producing and power consuming footprints are associated with the power plant definition (plants table 1002 of FIG. 10C), an appropriate power association is established therebetween.

The plants table 1002 (FIG. 10C) lists the power plants available at a site. The plants table 1002 includes a unique serial number for identification (PLANT_ID), the name of the site associated with the plant (SITE_ID), a name field, e.g., "battery_1 (PLANT_NM_TXT), the measured load quantity of power (MSRD_LOAD_QTY) and the minimum reserve quantity of power (MIN_RESV_QTY). The placement tool 116 can read these power plant definitions.

Before a connection can be established between a power plant and a footprint, however, it must be determined whether the desired connection is a valid connection. The connection tables shown in FIG. 10L are used make this determination. The connection table 1034 is used to determine the type of connections between the left object and the right object, which are to be connected together, by determining the connection rules. For example, the left object can be the plant, and the right object can be the footprint. The connection rules table 1032, which has a pointer to the left object type (LEFT_OTP_ID) and a pointer to the right object type (RIGHT_OTP_ID), is used in combination with tables 1033, 1035 and 1036 to determine whether the connection type is allowed. Table 1033 describes the types of connections allowed, including for example physical connections such as power, data, and alarm connections, as well as logical connections. The connection rules sub-class table provides subclasses of object types, such as a for example the subclass of battery type plants. In this manner, the placement tool 116 provides a mechanism to check whether the connection is valid.

J. Changing Views

The placement tool 116 permits the user to obtain specific information about objects in graphical form as well. Here, placement tool 116 applies a graphical filter to the objects displayed, specifically applying a graphical filter to the non-graphical information stored in database 108. For example, suppose a user is viewing a floor plan and desires to know which footprints will be occupied by M13 multiplexers five years in the future. After using the fetch object command to locate these footprint graphical objects, the placement tool 116 can be used to display only these desired footprints. (When the footprint is created, the placement tool 116 can, for example, use the footprint date fields 1061m–1061y and the footprint identification field 1061a to uniquely distinguish M13 multiplexers existing five years in the future by a specific color.) In this manner, placement tool 116 can provide detail on any graphical object in the hierarchy in a graphical format.

K. Other Microstation Functions

For the advanced CADD user, the placement tool 116 permits the user direct access to any desired CADD functions, bypassing the more user-friendly functions of the placement tool, itself.

IX. An Example Implementation for the Invention

The present invention may be implemented using hardware, software or a combination thereof and may be implemented in a computer system or other processing system. In fact, in one embodiment, the invention is directed toward a computer system capable of carrying out the functionality described herein.

Figure 9:
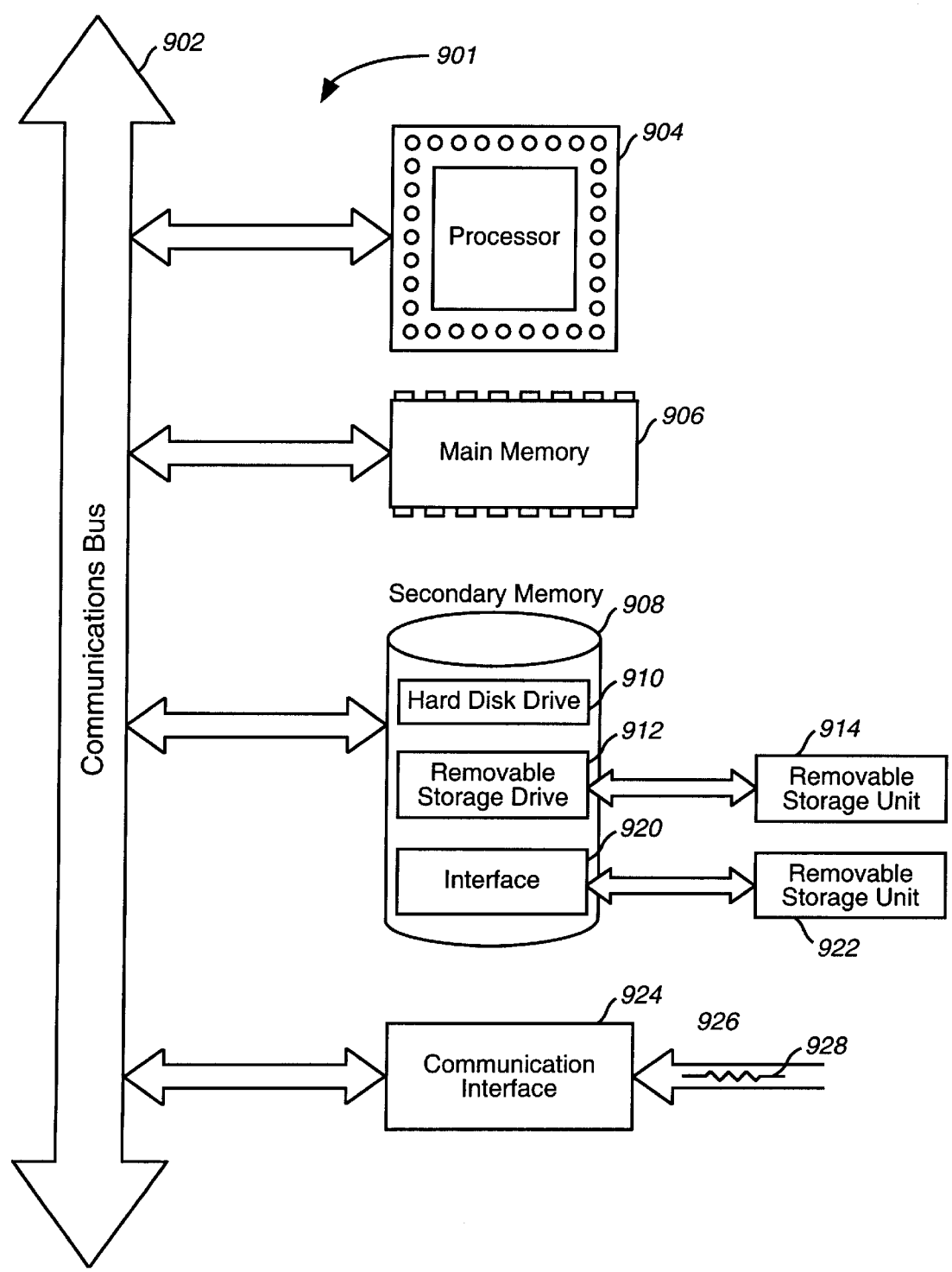
FIG. 9 is a block diagram of a computer useful for implementing components of the present invention.

An example computer system 901 is shown in FIG. 9. The computer system 901 includes one or more processors, such as processor 904. The processor 904 is connected to a communication bus 902. Various software embodiments are described in terms of this example computer system. After reading this description, it will become apparent to a person skilled in the relevant art how to implement the invention using other computer systems and/or computer architectures.

Computer system 902 also includes a main memory 906, preferably random access memory (RAM), and can also include a secondary memory 908. The secondary memory 908 can include, for example, a hard disk drive 910 and/or a removable storage drive 912, representing a floppy disk drive, a magnetic tape drive, an optical disk drive, etc. The removable storage drive 912 reads from and/or writes to a removable storage unit 914 in a well known manner. Removable storage unit 914, represents a floppy disk, magnetic tape, optical disk, etc. which is read by and written to by removable storage drive 912. As will be appreciated, the removable storage unit 914 includes a computer usable storage medium having stored therein computer software and/or data.

In alternative embodiments, secondary memory 908 may include other similar means for allowing computer programs or other instructions to be loaded into computer system 901. Such means can include, for example, a removable storage unit 922 and an interface 920. Examples of such can include a program cartridge and cartridge interface (such as that found in video game devices), a removable memory chip (such as an EPROM, or PROM) and associated socket, and other removable storage units 922 and interfaces 920 which allow software and data to be transferred from the removable storage unit 922 to computer system 901.

Computer system 901 can also include a communications interface 924. Communications interface 924 allows software and data to be transferred between computer system 901 and external devices. Examples of communications interface 924 can include a modem, a network interface (such as an Ethernet card), a communications port, a PCM-CIA slot and card, etc. Software and data transferred via communications interface 924 are in the form of signals which can be electronic, electromagnetic, optical or other signals capable of being received by communications interface 924. These signals 926 are provided to communications interface via a channel 928. This channel 928 carries signals 926 and can be implemented using wire or cable, fiber optics, a phone line, a cellular phone link, an RF link and other communications channels.

In this document, the terms "computer program medium" and "computer usable medium" are used to generally refer to media such as removable storage device 912, a hard disk installed in hard disk drive 910, and signals 926. These computer program products are means for providing software to computer system 901.

Computer programs (also called computer control logic) are stored in main memory and/or secondary memory 908. Computer programs can also be received via communications interface 924. Such computer programs, when executed, enable the computer system 901 to perform the features of the present invention as discussed herein. In particular, the computer programs, when executed, enable the processor 904 to perform the features of the present invention. Accordingly, such computer programs represent controllers of the computer system 901.

In an embodiment where the invention is implemented using software, the software may be stored in a computer program product and loaded into computer system 901 using removable storage drive 912, hard drive 910 or communications interface 924. The control logic (software), when executed by the processor 904, causes the processor 904 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

X. A Detailed View of the Site Hierarchy

In this section, the layers of the hierarchy from the site down to the footprint (located in database 108) are described in detail. Database 108 stores data non-graphical (logical) data, which is used to interrelate the data tables. This data is also viewable to users in a tabular form. Database 108 also stores graphical data, which is used to illustrate graphically the levels of the hierarchy as shown in FIG. 3.

A. Sites

As depicted in FIG. 10C, site table 1004 represents a site. A site is the physical location (e.g., the Dallas, Fort Worth site) where one or more buildings that store equipment, such as racks, are located. Site designates the highest logical layer in the site hierarchy. As shown in FIG. 10C, sites have the following fields associated with them.

1. Site identification 1004a is the unique serial number that identifies a site.
2. Site code 1004b is a 6 character identification for the site.
3. Site type code 1004c is a code that identifies the type of the site, as determined by site type table 1009 (FIG. 10D). These are the valid types of sites; that the system will allow for input into site type code 1004c. Information cannot be entered for a site unless it is a valid site. Where there is a direct connection from one table into another table, as here, (e.g., site type code 1004c) the term is referred to as a "foreign key" (FK) into another table.
4. Site name text 1004d is a name for the site, i.e., for colloquial, every day usage, such as the Dallas, Fort Worth site.
5. Site short code 1004e is a three character site code, that provides an alternative method of referring to the site.
6. Responsible department identification 1004f is a ten character identification that designates a department that is responsible for the site. In a large organization, different departments of the organization may be responsible for different sites. This field is a foreign key into the responsible department table 1006.
7. Physical address lines 1004g, 1004h, physical city name 1004i, physical zip code 1004j, and physical state code 1004k are fields used to store the complete address of the site. Physical state code 1004k is a foreign key into the state table 1008, where valid state codes are stored.
8. Create user identification 1004l, create date 1004m, last update identification 1004n, and last update date 1004o are fields that respectively identify (1) the user that entered the record into the database, (2) the date the user inserted the identification, (3) the last user who updated the record, and (4) the last date the record was updated.
9. Lease code 1004p identifies whether the site is a leased site or an owned site.

B. Structures

As depicted in FIG. 10D, structure table 1010 represents a physical structure, which is also referred to herein as a building or a facility. A facility can be a brick and mortar building that houses many different types of equipment, or instead a specialized building, such as a telecommunications shelter. As recognized by those of ordinary skill, the function of the building is not limited by the invention. Examples of specialized structures are a telecommunications shelter used for light wave regeneration, a multiplexer facility, a termination facility where long distance traffic is switched into local telephone network traffic, or a node information center (NIC) which houses mainframe computers. Each site can have one or more structures. As shown in FIG. 10D, structures have the following fields associated with them.

1. Structure identification 1010a is the unique serial number that identifies a structure.
2. Site identification 1010b is a foreign key back to the parent site associated with the structure. Hence, this field identifies the parent site for the building.
3. Structure name text 1010c and descriptive text 1010d respectively identify and describe the building. Structure name text 1010c is a name associated with the site, i.e., for common usage. For example, at a certain site, there may be a building dedicated for storing radios, a building dedicated for storing generators, and a building dedicated for storing switches, respectively called "radio", "generator", and "switch." Descriptive text 1010d describes the building in greater detail.
4. Create user identification 1010e, create date 1010f, last update identification 1010g, and last update date 1010h are fields that respectively identify (1) the user that entered the record into the database, (2) the date the user inserted the identification, (3) the last user who updated the record, and (4) the last date the record was updated.

C. Floor

As depicted in FIG. 10D, floor table 1011 is a logical representation of the floors within the facility where the equipment is to be placed. Each structure has one or more floors. As shown in FIG. 10D, floors have the following fields associated with them.

1. Floor identification 1011a is the unique serial number that identifies a floor.
2. Structure identification 1011b is a foreign key back to the parent structure associated with the floor. Hence, this field identifies the parent building for the floor.
3. Floor name text 1011c and descriptive text 1011d respectively identify and describe the floor. Floor name text 1011c is a name associated with the particular floor, i.e., for common usage. Typically, the floor name text 1011c identifies the floor by a number. Descriptive text 1011d can be used to describe the floor in greater detail.
4. Floor plan drawing file name 1011e is the name of an optional architectural (civil) file that governs the physical outlay of the floor. The architectural file is produced by a CADD, such as for example Microstation CADD 117. The architectural file can, for example, represent the locations of fire escapes, physical columns for plumbing, wires that provide electricity, etc.
5. Area quantity 1011f is the area associated with the floor. The placement tool 116 allows a user to use a mouse (or other input device) to graphically trace the outlay of the floor. When the floor area is traced out, the CADD software or equivalent device can calculate the area associated with the floor in, for example, square inches, and store the information in this field.

6. Create user identification 1011*h*, create date 1011*i*, last update identification 1011*j*, and last update date 1011*k* are fields that respectively identify (1) the user that entered the record into the database, (2) the date the user inserted the identification, (3) the last user who updated the record, and (4) the last date the record was updated.

D. Floor Points

As depicted in FIG. 10D, floor points table 1012 is where graphical data regarding the floor is stored. A user can use the SiteVu placement tool application 116 to create a floor object. The placement tool 116 sends a command to Microstation to set up a dialog (or session) with the user. Using the mouse, or other input device, the user traces out the shape of the object, which Microstation 117 displays on workstation 104. When the user is finished the operation, Microstation informs the placement tool 116 that the user has completed making a graphical representation of the object. The placement tool 116 then translates the graphical information into nor-graphical information, specifically as tabular point data in the floor points table 1012 in database 108.

When a user later uses the SiteVu placement tool 116 to view a graphical floor object, the SiteVu placement tool 116 retrieves non-graphical information (representing the graphical floor objects) from the floor points table 1012, and directs Microstation CADD 117 to draw the floor. As shown in FIG. 10D, floor points have the following fields associated with them.

1. Floor identification 1012*a* is a 9-digit unique serial number that identifies the floor.
2. Point sequence number 1012*b* is a sequencing number for the points, identifying the order of the sequence of points that make up the floor area.
3. Horizontal coordinate number 1012*c*, vertical coordinate number 1012*d* are the coordinates of each of the points provided by the CADD software 117.
4. Create user identification 1012*f*, (create date 1012*g*, last update identification 1012*h*, and last update date 1012*i* are fields that respectively identify (1) the user that entered the record into the database, (2) the date the user inserted the identification, (3) the last user who updated the record, and (4) the last date the record was updated.

E. Zone

As depicted in FIG. 10D, zone table 1013 restricts floor space based on an equipment type, which is also called a class type. For example, if telecommunications switches are identified by the user as an equipment class, then all equipment of the class labeled "telecommunications switch" can be restricted to a "telecommunications switch zone" on the floor. As one of ordinary skill will recognize, zones are limited only by the user's imagination. Examples of zones include collocation zones (where space for equipment owned by other vendors can be leased), furniture zones, multiplexer zones, computer zones, building support (e.g., HVAC) zones, etc. As shown in FIG. 10D, zones have the following fields associated with them.

1. Zone identification 1013*a* is the unique serial number that identifies a zone.
2. Floor identification 1013*b* is a foreign key back to the parent floor associated with the zone. Hence, this field identifies the parent floor for the zone.
3. Zone name text 1013*c* is a name associated with the zone, i.e., for common usage.
4. Equipment class code 1013*d* is a foreign key into the class table 1030 (FIG. 10I), which identifies the type or class of equipment that can be placed and stored in the zone. For example, a zone can be designated for storage of only switches, only transmission type equipment, only collocation type equipment, or any other type of equipment desired. This feature can be overridden by a user with special access, such as a "superuser." The field makes the zone an intelligent type of container in that a user can predesignate, very specifically, what type of equipment, or more generally, what class of equipment is allowed to be stored within a given zone.
5. Area quantity 1013*e* is the area associated with the zone. The placement tool 116 allows a user to use a mouse (or other input device) to graphically trace the outlay of the zone. When the zone area is traced out, the CADD software or equivalent device can calculate the area associated with the zone in, for example, square inches, and store the information in this field.
6. Create user identification 1013*g*, create date 1013*h*, last update identification 1013*i*, and last update date 1013*j* are fields that respectively identify (1) the user that entered the record into the database, (2) the date the user inserted the identification, (3) the last user who updated the record, and (4) the last date the record was updated.

F. Zone Points

As depicted in FIG. 10D, zone points table 1014 is where graphical data regarding the zone is stored. A user can use the SiteVu placement tool 116 to create a zone object. The placement tool 116 sends a command to Microstation to set up a dialog (or session) with the user. Using the mouse, or other input device, the user traces out the shape of the object, which Microstation 117 displays on workstation 104. When the user is finished the operation, Microstation informs the placement tool 116 that the user has completed making a graphical representation of the object. The placement tool 116 then translates the graphical information into non-graphical information, specifically as tabular point data in the zone points table 1014 in database 108.

When a user later uses the SiteVu placement tool 116 to view a graphical zone object, the SiteVu placement tool 116 retrieves non-graphical information (representing the graphical zone objects) from zone points table 1014, and directs Microstation CADD 117 to draw the zone. As shown in FIG. 10D, zone points have the following fields associated with them.

1. Zone identification 1014*a* is a 9-digit unique serial number that identifies the zone.
2. Point sequence number 1014*b* is a sequencing number for the points, identifying the order of the sequence of points that make up the zone area.
3. Horizontal coordinate number 1014*c*, vertical coordinate number 1014*d* are the coordinates of the area calculated by the CADD software.
4. Create user identification 1014*f*, create date 1014*g*, last update identification 1014*h*, and last update date 1013*i* are fields that respectively identify (1) the user that entered the record into the database, (2) the date the user inserted the identification, (3) the last user who updated the record, and (4) the last date the record was updated.

G. Planning Unit

As depicted in FIG. 10E, planning unit table 1015 logically represents a planning unit. Planning units are divisions within a single zone. Planning units allow for multiple individuals to concurrently place rows, as represented graphically by the Microstation CADD tool 117, into a single zone. The SiteVu placement tool 116 allows a single planner to work in a single planning unit, thereby locking out other planners from the planning unit. As shown in FIG. 10E, planning units have the following fields associated with them.

1. Planning unit identification 1015*a* is the unique serial number that identifies a planning, unit.
2. Zone identification 1015*b* is a foreign key back to the parent zone associated with the planning unit. Hence, this field identifies the parent zone for the planning unit.
3. Planning unit name text 1015*c* and descriptive text 1015*d* respectively identify and describe the floor. Planning unit name text 1015*c* is a name associated with the planning unit, which is a subset of the zone name. Descriptive text 1015*d* can be used to describe the floor in greater detail.
4. Area quantity 1015*e* is the area associated with the planning unit, which is determined by the placement tool 116.
5. Floor identification 1015*f* is a foreign key back to the floor associated with the planning unit. Hence, this field identifies the parent floor for the planning unit.
6. Floor load limit quantity 1015*g* indicates the amount of weight (e.g., per square inch) that the floor can withstand in the planning unit.
7. Create user identification 1015*i*, create date 1015*j*, last update identification 1015*k*, and last update date 1015*l* are fields that respectively identify (1) the user that entered the record into the database, (2) the date the user inserted the identification, (3) the last user who updated the record, and (4) the last date the record was updated.

H. Planning Unit Points

As depicted in FIG. 10E, planning unit points table 1016 is where graphical data regarding the planning unit is stored. A user can use the SiteVu placement tool 116 to create a planning unit object. The placement tool 116 sends a command to Microstation to set up a dialog (or session) with the user. Using the mouse, or other input device, the user traces out the shape of the object, which Microstation 117 displays on workstation 104. When the user is finished the operation, Microstation informs the placement tool 116 that the user has completed making a graphical representation of the object. The placement tool 116 then translates the graphical information into non-graphical information, specifically as tabular point data in the planning unit points table 1016 in database 108.

When a user later uses the SiteVu placement tool 116 to view a graphical planning unit object, the SiteVu placement tool 116 retrieves the non-graphical information (representing the graphical planning unit objects) from planning unit points table 1016, and directs Microstation CADD 117 to draw the planning unit. As shown in FIG. 10E, planning unit points have the following fields associated with them.

1. Planning unit identification 1016*a* is a 9-digit unique serial number that identifies the planning unit.
2. Point sequence number 1016*b* is a sequencing number for the points, identifying the order of the sequence of points that make up the planning unit area.
3. Horizontal coordinate number 1016*c*, vertical coordinate number 1016*d* are the coordinates of the area calculated by the CADD software.
4. Create user identification 1016*f*, create date 1016*g*, last update identification 1016*h*, and last update date 1016*i* are fields that respectively identify (1) the user that entered the record into the database, (2) the date the user inserted the identification, (3) the last user who updated the record, and (4) the last date the record was updated.

I. Rows

As depicted in FIG. 10E, rows table 1017 logically represents a physical row where equipment is to be placed. Physical obstructions can make a row discontinuous, meaning that the row can stop at a column (indicated by an architectural diagram), and continue on the other side of the obstruction. For this reason, the row table is a logical (non-graphical) entity, storing information on the row without providing a graphical object. As shown in FIG. 10E, rows have the following fields associated with them.

1. Row identification 1017*a* is the unique serial number that identifies a row.
2. Planning unit identification 1017*b* is a foreign key back to the parent planning unit associated with the row. Hence, this field identifies the parent planning unit for the row.
3. Row name text 1015*c* is a name associated with the planning unit, i.e., for common usage. The row is typically represented as a number, although it can be identified by a descriptive name, such as the "radio" row, or "switch" row.
4. Create user identification 1017*d*, create date 1017*e*, last update identification 1017*f*, and last update date 1017*g*, are fields that respectively identify (1) the user that entered the record into the database, (2) the date the user inserted the identification, (3) the last user who updated the record, and (4) the last date the record was updated.

J. Row Segments

As depicted in FIG. 10E, rows segments table 1018 represents graphical information for segments of the rows that are logically represented by row table 1017. Row segments are provided so that the floor space in a planning unit can be effectively utilized, despite the presence of physical obstructions (such as columns) indicated by an architectural diagram.

As with floor points table 1012, zone points table 1014, and planning units points table 1016, row segment table 1018 comprises graphical data regarding the row segments. A user can use the SiteVu placement tool 116 to create a row segment object. The placement tool 116 sends a command to Microstation to set up a dialog (or session) with the user. Using the mouse, or other input device, the user traces out the shape of the object, which Microstation 117 displays on workstation 104. When the user is finished the operation, Microstation informs the placement tool 116 that the user has completed making a graphical representation of the object. The placement tool 116 then translates the graphical information into non-graphical information, specifically as tabular point data in the row segment table 1018 in database 108.

When a user later uses the SiteVu placement tool 116 to view a graphical row segment object, the SiteVu placement tool 116 retrieves non-graphical information (representing the graphical row segment objects) from row segment table 1018, and directs Microstation CADD 117 to draw the row segment. As shown in FIG. 10E, row segment points have the following fields associated with them.

1. Row identification 1018*a* is a foreign key back to the logical parent, which is the row associated with the row segment. Hence, this field identifies the parent row for the row segment.

2. Row segment sequence number 1018b uniquely identifies the row segment within the parent row, using a 3-digit serialization quantity.
3. Floor identification 1018d is a foreign key back to the floor associated with the ancestor planning unit. Hence, this field identifies the ancestor floor for the row segment.
4. Zone identification 1018e is a foreign key back to the ancestor zone associated with the row segment. Hence, this field identifies the ancestor zone for the row segment.
5. Planning unit identification 1018f is a foreign key back to the ancestor planning unit associated with the row segment. Hence, this field identifies the ancestor planning unit for the row segment.
6. Start horizontal coordinate number 1018g, start vertical coordinate number 1018h, end horizontal coordinate number 1018i, and end vertical coordinate number 1018j are the coordinates of where the non-graphical points representing the graphical row segment object are to be drawn by the CADD software.
7. Length quantity 1018k identifies the length of the row segment.
8. Height limit quantity 1018l indicates the greatest possible height of equipment placed in the row segment.
9. Create user identification 1018m, create date 1018n, last update identification 1018o, and last update date 1018p are fields that respectively identify (1) the user that entered the record into the database, (2) the date the user inserted the identification, (3) the last user who updated the record, and (4) the last date the record was updated.

K. Footprints (placement for racks)

As depicted in FIG. 10G, placement data for racks table 1061 represents footprints both graphically and logically. A footprint is the union of a configured rack, which can be an article of manufacture or a piece of equipment for example, and a space on the floor, specifically a row segment on the floor. Hence, the footprint refers to a space actually occupied by a piece of equipment in the equipment hierarchy, containing the most specific and abundant information in the hierarchy.

As per the graphical function, as described in section VIII.D.9 (step 804) the footprint graphical object automatically placed once the user selects a row segment graphical object (or creates a row segment graphical object) and selects a configured rack from the database 108. When a user later uses the placement tool 116 to retrieve a graphical floor object, the placement tool 116 retrieves the appropriate non-graphical information (representing the graphical object) from the database 108, and directs Microstation CADD 117 to draw the footprint object.

Logically, the footprint stores a great deal of non-graphical information regarding the equipment placed therein, including relevant dates. These fields are provided in detail below. Specifically, as shown in FIG. 10G, footprints have the following fields associated with them.

1. Footprint instance identification 1061a is the unique number that identifies a footprint.
2. Row identification 1061b is a foreign key back to the parent row associated with the footprint. Hence, this field identifies the parent row for the footprint.
3. Row segment sequence number 1061c uniquely identifies the row segment within the parent row. Hence, this field identifies the parent row segment for the footprint.
4. Row segment position code 1061d is a name given to the position within the parent row segment within which the footprint resides.
5. Rack configuration identification 1061e is a foreign key into configured racks table 1062 (FIG. 10J), which identifies the list of configured racks that are available for placement at the footprint. It should be noted that the configured racks need not be limited to storing modules on shelves, especially where footprints are concerned. For example, a piece of furniture can be stored as a configured rack and have its own footprint. The SiteVu placement tool 116 can take a configured rack, which has already been built, and logically attach it to a footprint in a row segment by placing it in this field.
6. Bayface direction indicator 1061f indicates whether the equipment faces the front or the back of the row.
7. Offset quantity 1061g is an offset in length from the row segment.
8. Start gap quantity 1061h, end gap quantity 1061i, and back gap quantity 1061k respectively represent the amount of room (in a distance measure) that is to be permitted to the left, to the right, and behind the equipment. This "envelope" provides room for cable, beat dissipation, and other necessities.
9. Back to back indicator 1061j indicates whether the piece of equipment is back-to-back with another piece of equipment in the same footprint.
10. Anchor point quantity 1061 indicates the length from the front of the row segment that the equipment is to be placed. In some circumstances, the equipment is bolted (affixed) to the floor space at this distance from the front of the row segment.
11. Facilities planned installation date 1061m stores the planned installation date when a generic footprint is replaced with a specific footprint. This is described below.
12. Planned installation date 1061n stores the is the date when a configured rack is going to be placed on the floor. When the engineers determine that an actual piece of equipment is to be placed, i.e., a generic footprint is to be replaced with a specific footprint, then this field is stored in the facilities planned installation date 1061m. In other words, at the time, the rackface tool 112 replaces the facilities planned installation date field 1061m with the planned installation date field 1061n.
13. Actual installation date 1061o is the date that the equipment is actually installed onto the floor.
14. Installation project identification 1061p is the work project for which the equipment is; installed.
15. Planned activation date 1061q is the date when the equipment (i.e., the configured rack) is made functional.

For example, for telecommunications equipment, this refers to when traffic flows through the device. For some equipment, this date refers to when the equipment is simply supplied power. For other types of equipment, e.g., a piece of furniture, the equipment is never activated.

16. Actual activation date 1061r is when the equipment is actually turned on.
17. Planned decommission date 1061s is when the equipment is planned to be turned off.
18. Actual decommission date 1061t is when the equipment is actually turned off.

19. Planned removal date 1061*u* is when the equipment is to be physically removed from the floor.
20. Actual removal date 1061*v* is when the equipment is actually physically removed from the floor, such that the floor space is left open.
21. Removal project identification 1061*w* is the work project for which the equipment is removed.
22. Create user identification 1061*y*, create date 1061*z*, last update identification 1061*aa*, and list update date 1061*bb* are fields that respectively identify (1) the user that entered the record into the database, (2) the date the user inserted the identification, (3) the last user who updated the record, and (4) the last date the record was updated.
23. Floor identification 1061*cc* is a foreign key back to the floor associated with the footprint. Hence, this field identifies the ancestor floor for the footprint.
24. Zone identification 1061*dd* is a foreign key back to the ancestor zone associated with the footprint. Hence, this field identifies the ancestor zone for the footprint.
25. Planning unit identification 1061*ee* is a foreign key back to the ancestor planning unit associated with the footprint. Hence, this field identifies the ancestor planning unit for the footprint.

XI. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for graphically placing an article or a piece of equipment on a floor space, comprising:

enabling a user to create one or more higher level hierarchically related data objects for storing non-graphical data;

enabling said user to create for display one or more hierarchically related graphical objects;

initially storing or updating said graphical objects in a non-graphical format in one or more lower level hierarchically related data objects; and enabling said user to initially store or update non-graphical data relating to said one or more graphical objects in one of said higher level hierarchically related data objects and said lower level hierarchically related data objects.

2. A method according to claim 1, wherein the step of enabling said user to create one or more higher level hierarchical data objects further comprises:

enabling said user to establish a site data object to represent a site;

enabling said user to establish a structure data object to represent a structure located at said site;

enabling said user to establish a floor data object to represent a floor located at said structure.

3. A method according to claim 1, wherein the step of enabling said user to create for display one or more hierarchically related graphical objects further comprises:

enabling said user to create a graphical floor object.

4. A method according to claim 3, further comprising:

enabling said user to create one or more additional graphical objects within said graphical floor object.

5. A method according to claim 4, further comprising:

enabling said user to create one or more footprint objects representing a union of a space within said graphical floor object and the article or the piece of equipment placed within said graphical floor object.

6. A method according to claim 4, further comprising:

enabling said user to create one or more graphical zone objects within said graphical floor objects;

enabling said user to create one or more graphical planning unit objects within said graphical zone objects;

enabling said user to create one or more graphical row segment objects within said graphical planning unit objects, wherein said user can place said one or more footprints within said row segment objects.

7. A method according to claim 4, further comprising:

enabling said user to use an architectural diagram in conjunction with said graphical floor object and said one or more additional graphical objects.

8. A method according to claim 1, wherein said step of initially storing or updating said graphical objects in a non-graphical format in one or more lower level hierarchically related data objects further comprises:

selecting a sequence of points traced out by said user using an input device;

storing said sequence of points in said one or more lower level hierarchically related data objects.

9. A method according to claim 8, wherein said step of selecting a sequence of points traced out by said user using an input device further comprises:

selecting a sequence of points relating to a graphical floor object;

selecting a sequence of points relating to a graphical zone object;

selecting a sequence of points relating to a graphical planning unit object;

selecting a sequence of points relating to a graphical row segment object; and selecting a sequence of points relating to a graphical footprint object;

wherein said step of storing said sequence of points in said one or more lower level hierarchically related data objects further comprises:

storing said sequence of points relating to a graphical floor object in a floor points data object;

storing said sequence of points relating to a graphical zone object in a zone points data object;

storing said sequence of points relating to a graphical planning unit object in a planning unit points data object;

storing said sequence of points relating to a graphical row segment in a row segment data object;

storing said sequence of points relating to a graphical footprint object in a footprint data object.

10. A method according to claim 1, wherein said step of enabling said user to initially store or update non-graphical data relating to said one or more graphical objects in one of said higher level hierarchically related data objects and said lower level hierarchically related data objects further comprises:

identifying relational information interrelating said one or more higher level hierarchically related data objects and said one or more lower level hierarchically related data objects using a data object indexing system.

11. A method according to claim 1, wherein said step of enabling said user to initially store or update non-graphical data relating to said one or more graphical objects in one of said higher level hierarchically related data objects and said lower level hierarchically related data objects further comprises:

calculating and storing dimensional information relating to physical dimensions of one or more physical objects represented by said one or more graphical objects.

12. A method according to claim 11, wherein said step of calculating and storing dimensional information further comprises:

calculating and storing dimensional information relating to one or more graphical floor objects, one or more graphical zone objects within said graphical floor objects, one or more graphical planning unit objects within said graphical zone objects, and one or more graphical row segment objects within said graphical planning unit objects.

13. A method according to claim 1, wherein said step of enabling said user to initially store or update non-graphical data relating to said one or more graphical objects in one of said higher level hierarchically related data objects and said lower level hierarchically related data objects further comprises:

identifying said user and a date said user performed one of: initially storing and updating said graphical date.

14. A method according to claim 1, wherein said step of enabling said user to initially store or update non-graphical data relating to said one or more graphical objects in one of said higher level hierarchically related data objects and said lower level hierarchically related data objects further comprises:

enabling said user to identify specific information relating to said article or said piece of equipment.

15. A method according to claim 14, wherein said step of identifying specific information relating to said article or said piece of equipment further comprises:

enabling said user to identify information relating to how said article or said piece of equipment is to be placed on said floor space;

enabling said user to identify information relating to a planned installation date, an actual installation date, a planned activation date, an actual activation date, a planned decommission date, an actual decommission date, a planned removal date, and an actual removal date for said article or said piece of equipment.

16. A computer program product, comprising a computer useable medium having computer program logic stored therein, wherein said computer program logic comprises:

means for enabling a user to create one or more higher level hierarchically related data objects for storing non-graphical data;

means for enabling said user to create for display one or more hierarchically related graphical objects;

means for initially storing or updating said graphical objects in a non-graphical format in one or more lower level hierarchically related data objects; and means for enabling said user to initially store or update non-graphical data relating to said one or more graphical objects in one of said higher level hierarchically related data objects and said lower level hierarchically related data objects.

17. The computer program product of claim 16, wherein said means for enabling said user to create one or more higher level hierarchical data objects further comprises:

means for enabling said user to establish a site data object to represent a site; means for enabling said user to establish a structure data object to represent a structure located at said site;

means for enabling said user to establish a floor data object to represent a floor located at said structure.

18. The computer program product of claim 16, wherein said means for enabling said user to create for display one or more hierarchically related graphical objects further comprises:

means for enabling said user to create a graphical floor object.

19. The computer program product of claim 18, further comprising:

means for enabling said user to create one or more additional graphical objects within said graphical floor object.

20. The computer program product of claim 19, further comprising:

means for enabling said user to create one or more footprint objects representing a union of a space within said graphical floor object and the article or the piece of equipment placed within said graphical floor object.

21. The computer program product of claim 19, further comprising:

means for enabling said user to create one or more graphical zone objects within said graphical floor objects;

means for enabling said user to create one or more graphical planning unit objects within said graphical zone objects;

means for enabling said user to create one or more graphical row segment objects within said graphical planning unit objects, wherein said means for enabling said user to create one or more footprint objects further comprises:
means for enabling said user to place said one or more footprints within said row segment objects.

22. The computer program product of claim 19, further comprising:

means for enabling said user to use an architectural diagram in conjunction with said graphical floor object and said one or more additional graphical objects.

23. The computer program product of claim 16, wherein said means for initially storing or updating said graphical objects in a non-graphical format in one or more lower level hierarchically related data objects further comprises:

means for selecting a sequence of points traced out by said user using an input device;

means for storing said sequence of points in said one or more lower level hierarchically related data objects.

24. The computer program product of claim 23, wherein said means for selecting a sequence of points traced out by said user using said input device further comprises:

means for selecting a sequence of points relating to a graphical floor object;

means for selecting a sequence of points relating to a graphical zone object;

means for selecting a sequence of points relating to a graphical planning unit object;

means for selecting a sequence of points relating to a graphical row segment object; and means for selecting a sequence of points relating to a graphical footprint object;

wherein said means for storing said sequence of points in said one or more lower level hierarchically related data objects further comprises:
    means for storing said sequence of points relating to a graphical floor object in a floor points data object;
    means for storing said sequence of points relating to a graphical zone object in a zone points data object;
    means for storing said sequence of points relating to a graphical planning unit object in a planning unit points data object;
    means for storing said sequence of points relating to a graphical row segment in a row segment data object;
    means for storing said sequence of points relating to a graphical footprint object in a footprint data object.

25. The computer program product of claim 16, wherein said means for enabling said user to initially store or update non-graphical data relating to said one or more graphical objects in one of said higher level hierarchically related data objects and said lower level hierarchically related data objects further comprises:
    means for identifying relational information interrelating said one or more higher level hierarchically related data objects and said one or more lower level hierarchically related data objects using a data object indexing system.

26. The computer program product of claim 16, wherein said means for enabling said user to initially store or update non-graphical data relating to said one or more graphical objects in one of said higher level hierarchically related data objects and said lower level hierarchically related data objects further comprises:
    means for calculating and storing dimensional information relating to physical dimensions of one or more physical objects represented by said one or more graphical objects.

27. The computer program product of claim 26, wherein said means for calculating and storing dimensional information further comprises:
    means for calculating and storing dimensional information relating to one or more graphical floor objects, one or more graphical zone objects within said graphical floor objects, one or more graphical planning unit objects within said graphical zone objects, and one or more graphical row segment objects within said graphical planning unit objects.

28. The computer program product of claim 16, wherein said means for enabling said user to initially store or update non-graphical data relating to said one or more graphical objects in one of said higher level hierarchically related data objects and said lower level hierarchically related data objects further comprises:
    means for identifying said user and a date said user performed one of: initially storing and updating said graphical date.

29. The computer program product of claim 16, wherein said means for enabling said user to initially store or update non-graphical data relating to said one or more graphical objects in one of said higher level hierarchically related data objects and said lower level hierarchically related data objects further comprises:
    means for enabling said user to identify specific information relating to said article or said piece of equipment.

30. The computer program product of claim 29, wherein said means for enabling said user to identify specific information relating to said article or said piece of equipment further comprises:
    means for enabling said user to identify information relating to how said article or said piece of equipment is to be placed on said floor space;
    means for enabling said user to identify information relating to a planned installation date, an actual installation date, a planned activation date, an actual activation date, a planned decommission date, an actual decommission date, a planned removal date, and an actual removal date for said article or said piece of equipment.

31. A method for symbolically placing equipment at a site through the use of a graphical display device where the equipment, and any structures at the site are hierarchically related comprising:
    enabling a user to create at leas one data object at a given hierarchical level for storing non-graphical data where said at least one data object represents at least one of hierarchically related items comprising site, structure at a site and floor of a structure at a site;
    enabling a user to create for display a plurality of hierarchically related graphical objects, said objects being lower in hierarchical level than said hierarchical level of said at least one object;
    enabling a user to initially store any of said plurality of graphical objects in a non-graphical format in a plurality of hierarchically related data objects;
    enabling a user to update any of said plurality of graphical objects from the stored data objects; and
    enabling said user to store or update non-graphical data relating to each of said plurality of graphical objects in a hierarchically next layer related data object.

32. A method of hierarchically storing and displaying graphical representations of equipment and its placement relative to a given surface at a given site comprising:
    creating a data object for storing non-graphical data where said data object represents said given surface at said given site;
    creating for display a plurality of graphical objects hierarchically related to but lower in hierarchical level than said given surface;
    storing or updating any of said plurality of graphical objects in a non-graphical format in a plurality of hierarchically related data objects; and
    storing or updating non-graphical data relating to each of said plurality of graphical objects in a hierarchically different but related data object.

33. A method of symbolically placing at least one article relative to a floor space through the use of graphical display device where the article is hierarchically related to the floor space comprising:
    enabling a user to create a floor space data object for storing non-graphical data where said data object represents floor space of a structure at a site;
    enabling a user to create for display a plurality of hierarchically related graphical objects, said objects being lower in hierarchical level than said floor space;
    enabling a user to initially store any of said plurality of graphical objects in a non-graphical format in a plurality of hierarchically related data objects;
    enabling a user to update any of said plurality of graphical objects from the stored data objects; and enabling said user to store or update non-graphical data relating to each of said plurality of graphical objects in a hierarchically different but related data object.

34. A method of placing hierarchically related graphical representations of articles relative to a given surface at a given site comprising:

creating a plurality of data objects at least of which represents a given surface at a given site, said data objects being capable of storing hierarchically next lower level object related non-graphical data;

creating for display and storing a plurality of graphical objects in a non-graphical format, hierarchically related to but lower in hierarchical level than said given surface; and enabling a user to store and retrieve for update, any of the plurality of stored graphical objects in a non-graphical format, in a hierarchically different related data object.

* * * * *